(12) United States Patent
Enquist et al.

(10) Patent No.: US 9,716,033 B2
(45) Date of Patent: Jul. 25, 2017

(54) 3D IC METHOD AND DEVICE

(71) Applicant: ZIPTRONIX, INC., Raleigh, NC (US)

(72) Inventors: Paul M. Enquist, Cary, NC (US);
Gaius Gillman Fountain, Jr.,
Youngsville, NC (US); Qin-Yi Tong,
Durham, NC (US)

(73) Assignee: ZIPTRONIX, INC., San Jose, CA (US)

( * ) Notice: Subject to any disclaimer, the term of this patent is extended or adjusted under 35 U.S.C. 154(b) by 0 days.

(21) Appl. No.: 14/813,972

(22) Filed: Jul. 30, 2015

(65) Prior Publication Data

US 2015/0340285 A1 Nov. 26, 2015

Related U.S. Application Data

(60) Continuation of application No. 14/198,723, filed on Mar. 6, 2014, now Pat. No. 9,171,756, which is a
(Continued)

(51) Int. Cl.
*H01L 23/00* (2006.01)
*H01L 21/768* (2006.01)
(Continued)

(52) U.S. Cl.
CPC .. *H01L 21/76838* (2013.01); *H01L 21/76898* (2013.01); *H01L 23/481* (2013.01);
(Continued)

(58) Field of Classification Search
CPC ........... H01L 24/02; H01L 2224/81201; H01L 2224/83894; H01L 2225/06541;
(Continued)

(56) References Cited

U.S. PATENT DOCUMENTS

| 4,612,083 A | 9/1986 | Yasumoto et al. |
| 4,818,728 A | 4/1989 | Rai et al. |

(Continued)

FOREIGN PATENT DOCUMENTS

| EP | 0 465 227 A2 | 1/1992 |
| JP | 01-168040 | 7/1989 |

(Continued)

OTHER PUBLICATIONS

Japanese Office Action dated Aug. 4, 2015 issued in Japanese Patent Application No. 2008-526104 in 40 pages (with English translation).

(Continued)

*Primary Examiner* — David Vu
(74) *Attorney, Agent, or Firm* — Knobbe, Martens, Olson & Bear LLP

(57) ABSTRACT

A method of three-dimensionally integrating elements such as singulated die or wafers and an integrated structure having connected elements such as singulated dies or wafers. Either or both of the die and wafer may have semiconductor devices formed therein. A first element having a first contact structure is bonded to a second element having a second contact structure. First and second contact structures can be exposed at bonding and electrically interconnected as a result of the bonding. A via may be etched and filled after bonding to expose and form an electrical interconnect to interconnected first and second contact structures and provide electrical access to this interconnect from a surface. Alternatively, first and/or second contact structures are not exposed at bonding, and a via is etched and filled after bonding to electrically interconnect first and second contact structures and provide electrical access to interconnected first and second contact structure to a surface. Also, a device may be formed in a first substrate, the device
(Continued)

being disposed in a device region of the first substrate and having a first contact structure. A via may be etched, or etched and filled, through the device region and into the first substrate before bonding and the first substrate thinned to expose the via, or filled via after bonding.

22 Claims, 33 Drawing Sheets

Related U.S. Application Data division of application No. 13/783,553, filed on Mar. 4, 2013, now Pat. No. 8,709,938, which is a continuation of application No. 12/270,585, filed on Nov. 13, 2008, now Pat. No. 8,389,378, which is a continuation of application No. 11/201,321, filed on Aug. 11, 2005, now Pat. No. 7,485,968.

(51) Int. Cl.
  *H01L 27/06* (2006.01)
  *H01L 23/48* (2006.01)
  *H01L 25/065* (2006.01)
  *H01L 25/00* (2006.01)

(52) U.S. Cl.
  CPC ............ *H01L 24/02* (2013.01); *H01L 24/81* (2013.01); *H01L 24/94* (2013.01); *H01L 24/97* (2013.01); *H01L 25/0657* (2013.01); *H01L 25/50* (2013.01); *H01L 27/0688* (2013.01); H01L 2224/0401 (2013.01); H01L 2224/8123 (2013.01); H01L 2224/81121 (2013.01); H01L 2224/81201 (2013.01); H01L 2224/81801 (2013.01); H01L 2224/81894 (2013.01); H01L 2224/81931 (2013.01); H01L 2224/83894 (2013.01); H01L 2224/9202 (2013.01); H01L 2224/97 (2013.01); H01L 2225/06513 (2013.01); H01L 2225/06541 (2013.01); H01L 2924/01002 (2013.01); H01L 2924/0102 (2013.01); H01L 2924/01004 (2013.01); H01L 2924/014 (2013.01); H01L 2924/01005 (2013.01); H01L 2924/0105 (2013.01); H01L 2924/01006 (2013.01); H01L 2924/01007 (2013.01); H01L 2924/01013 (2013.01); H01L 2924/01014 (2013.01); H01L 2924/01015 (2013.01); H01L 2924/01018 (2013.01); H01L 2924/01019 (2013.01); H01L 2924/01022 (2013.01); H01L 2924/01023 (2013.01); H01L 2924/01027 (2013.01); H01L 2924/01028 (2013.01); H01L 2924/01029 (2013.01); H01L 2924/01033 (2013.01); H01L 2924/01042 (2013.01); H01L 2924/01046 (2013.01); H01L 2924/01049 (2013.01); H01L 2924/01055 (2013.01); H01L 2924/01059 (2013.01); H01L 2924/01073 (2013.01); H01L 2924/01074 (2013.01); H01L 2924/01075 (2013.01); H01L 2924/01077 (2013.01); H01L 2924/01078 (2013.01); H01L 2924/01079 (2013.01); H01L 2924/01082 (2013.01); H01L 2924/04941 (2013.01); H01L 2924/04953 (2013.01); H01L 2924/05042 (2013.01); H01L 2924/10329 (2013.01); H01L 2924/12044 (2013.01); H01L 2924/14 (2013.01); H01L 2924/19043 (2013.01); H01L 2924/3025 (2013.01)

(58) Field of Classification Search
  CPC ..... H01L 2224/9202; H01L 2224/8136; H01L 2224/83895
  See application file for complete search history.

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,322,593 A | 6/1994 | Hasegawa et al. |
| 5,419,806 A | 5/1995 | Huebner |
| 5,489,304 A | 2/1996 | Pasch |
| 5,501,003 A | 3/1996 | Bernstein |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,734,199 A | 3/1998 | Kawakita et al. |
| 5,753,536 A | 5/1998 | Sugiyama et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,071,761 A | 6/2000 | Jacobs |
| 6,080,640 A | 6/2000 | Gardner et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,206 B1 | 12/2001 | Ito et al. |
| 6,359,235 B1 | 3/2002 | Hayashi |
| 6,374,770 B1 | 4/2002 | Lee |
| 6,465,892 B1 | 10/2002 | Suga |
| 6,515,343 B1 | 2/2003 | Shroff et al. |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,600,224 B1 | 7/2003 | Farquhar et al. |
| 6,624,003 B1 | 9/2003 | Rice |
| 6,627,814 B1 | 9/2003 | Stark |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,828,686 B2 | 12/2004 | Park |
| 6,847,527 B2 | 1/2005 | Sylvester et al. |
| 6,867,073 B1 | 3/2005 | Enquist |
| 6,887,769 B2 | 5/2005 | Kellar et al. |
| 6,902,987 B1 | 6/2005 | Tong et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 7,078,811 B2 | 7/2006 | Suga |
| 7,109,063 B2 | 9/2006 | Jiang |
| 7,247,948 B2 | 7/2007 | Hedler et al. |
| 7,354,798 B2 | 4/2008 | Pogge et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,476,146 B2 | 7/2013 | Chen et al. |
| 8,841,002 B2 | 9/2014 | Tong |
| 9,171,756 B2 | 10/2015 | Enquist et al. |
| 9,184,125 B2 | 11/2015 | Enquist et al. |
| 9,331,149 B2 | 5/2016 | Tong et al. |
| 2002/0000328 A1 | 1/2002 | Motomura et al. |
| 2002/0003307 A1 | 1/2002 | Suga |
| 2002/0074670 A1 | 6/2002 | Suga |
| 2002/0094661 A1 | 7/2002 | Enquist |
| 2002/0113241 A1 | 8/2002 | Kubota et al. |
| 2002/0173120 A1 | 11/2002 | Enquist |
| 2003/0092220 A1 | 5/2003 | Akram |

(56) References Cited

U.S. PATENT DOCUMENTS

| | | |
|---|---|---|
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2004/0157407 A1 | 8/2004 | Tong et al. |
| 2004/0217483 A1 | 11/2004 | Hedler et al. |
| 2004/0262772 A1 | 12/2004 | Ramanathan et al. |
| 2005/0181542 A1 | 8/2005 | Enquist |
| 2017/0062366 A1 | 3/2017 | Enquist |

FOREIGN PATENT DOCUMENTS

| | | |
|---|---|---|
| JP | 4-259249 | 9/1992 |
| JP | 6-260594 | 9/1994 |
| JP | H07-66093 | 3/1995 |
| JP | 8-125121 | 5/1996 |
| JP | 8-186235 | 7/1996 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-26123 A | 1/2002 |
| JP | 2002-516033 | 5/2002 |
| JP | 2002-353416 | 12/2002 |
| JP | 2003-23071 | 1/2003 |
| JP | 2004-200547 | 7/2004 |
| JP | 2005-086089 | 3/2005 |
| JP | 2005-093486 | 4/2005 |
| JP | 2005-93486 | 4/2005 |
| JP | 2005-135988 | 5/2005 |
| TW | 476145 | 2/2002 |
| WO | WO 01/61743 A1 | 8/2001 |
| WO | WO 03/054954 A2 | 7/2003 |
| WO | WO 2005/043584 A2 | 5/2005 |

OTHER PUBLICATIONS

Japanese Office Action dated Sep. 29, 2015 issued in Japanese Patent Application No. 2012-246660 in 3 pages (with English translation).
Aspar, B. et al., "The smart-cut process: Status and developments," Proc. Electrochem Soc., 1999, vol. 99-53, pp. 48-59.
Canadian Office Action issued Aug. 1, 2013 in Canadian Patent Application No. 2,618,191, 4 pages.
Chinese Office Action issued Apr. 9, 2013 in Chinese Patent Application No. 200680032364.1 (English translation only).
Chinese Office Action issued Jan. 24, 2014 in Chinese Patent Application No. 200680032364.1 (with English translation).
Chinese Office Action issued Jan. 6, 2014 in Chinese Patent Application No. 200680032364.1 (English translation only).
Chinese Office Action issued Jul. 24, 2014 in Chinese Patent Application No. 200680032364.1 (English translation only).
Chinese Rejection for Chinese Patent Application No. 200680032364.1 dated Apr. 23, 2012.
Declaration of Richard A. Blanchard in Support of Petition for inter partes review of U.S. Pat. No. 7,485,968, dated Jun. 13, 2013, pp. 1-18.
European Office Action issued Oct. 11, 2011 in European Patent Application No. 06789507.8., in 8 pages.
European Search Report issued Sep. 5, 2011 in European Patent Application No. 06789507.8, in 5 pages.
Fan, A. et al., "Copper wafer bonding," Electrochem and Solid-State Lett. 2, 1999, pp. 534-536.
Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.
Handbook of Thin Film Technology, Maissel and Glang, 1983 Reissue, pp. 12-24.
Hayashi, Y. et al., "Fabrication of three-dimensional IC using cumulatively bonded IC (CUBIC) technology," VSLI Tech. Dog., 1990, pp. 95-96.
Hizukuri, M. et al., "Dynamic strain and chip damage during ultrasonic flip chip bonding," Jpn. J. Appl. Phys. 40, 2001, pp. 3044-3048.
Iida, A. et al., "The study of initial mechanism for Al—Au solid phase diffusion flip-chip bonding," Jpn. J. Appl. Phys. 40, 1997, pp. 3044-3661.
Indian Office Action issued May 23, 2013 in Indian Patent Application No. 905/DELNP/2008.
Israeli Office Action issued Oct. 25, 2011 in Israeli Patent Application No. 189173 (with partial English translation).
Japanese Office Action dated Aug. 4, 2015 issued in Japanese Patent Application No. 2008-526104 (with English translation).
Japanese Office Action issued Dec. 16, 2014 in Japanese Patent Application No. 2013-246782 (with English language translation), in 6 pages.
Japanese Office Action issued Dec. 2, 2014 in Japanese Patent Application No. 2012-246660 (with English translation), in 4 pages.
Japanese Office Action issued May 1, 2012 for Japanese Application No. 2008-526104.
Japanese Office Action issued May 28, 2013 in Japanese Patent Application No. 2008-526104 (English translation only), in 6 pages.
Japanese Office Action issued May 7, 2014 in Japanese Patent Application No. 2008-526104 (with English language translation), in 4 pages.
Japanese Office Action issued Oct. 1, 2013 in Japan Patent Application No. 2012-246660 (with English translation), in 4 pages.
Korean Office Action mailed Dec. 5, 2012 in Korean Patent Application No. 2008-7003362 (with English translation), in 4 pages.
Li, Y.A. et al., "Low temperature copper to copper direct bonding," Jpn. Appl. Phys. 37, 1998, pp. L1068-L1069.
Petition for Inter Partes Review of U.S. Pat. No. 7,485,968, IPR2013-00381, filed Jun. 21, 2013, pp. 1-49.
Schmidt, Martin A., Wafer-To-Wafer Bonding for Microstructure Formation, Proceedings of the IEEE, vol. 86, No. 8, 1998, pp. 1575-1586.
Shimatsu, T. et al., "Metal bonding during sputter film deposition," J. Vac. Sci. Technol. A 16(4), 1998, pp. 2125-2131.
Taiwanese Combined Office Action and Search Report issued Aug. 15, 2013 in Taiwanese Application No. 095129638 (with English translation).
Taiwanese Office Action issued Aug. 29, 2014 in Taiwanese Patent Application No. 095129638 (with English translation).
Tsau, C.H. et al., "Characterization of low temperature wafer-level gold-gold thermocompression bonds," Mater. Soc. Symp. Proc. 605, 1999, pp. 171-176.
Warner, K. et al., "Low-temperature oxide-bonded three-dimensional integrated circuits," IEEE International SOI Conference, Oct. 2012, pp. 123-125.
Yablonovitch, E. et al., "Van der Waals bonding of GaAs on Pd leads to a permanent, solid-phase-topotaxial metallurgical bond," Appl. Phys. Lett. 59, 1991, pp. 3159-3161.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Decision—Request for Trail Granted, Inter Partes Review, U.S. Pat. No. 7,485,968, Case IPR2013-00381, dated Dec. 18, 2013, in 27 pages.
Final Written Decision, Inter Partes Review, U.S. Pat. No. 7,485,968, Case IPR2013-00381, dated Feb. 27, 2014, in 3 pages.
Japanese Office Action issued Sep. 29, 2015 in Japanese Patent Application No. 2012-246660 (English translation), in 3 pages.
Japanese Office Action issued Feb. 2, 2016 in Japanese Patent Application No. 2013-246782 (English translation), in 6 pages.
Taiwanese Office Action issued Dec. 11, 2015 in Taiwanese Patent Application No. 095129638 (with English translation).
Appeal Decision of Rejection issued on Apr. 12, 2016 in Japanese Patent Application No. 2008-526104, in 14 pages.

(56) References Cited

OTHER PUBLICATIONS

A. Iida et al., "The Study of Initial Mechanism for Al—Au Soild Phase Diffusion Flip-Chip bonding", Jpn. J. Appl. Phys. 40, pp. 3044-3661 (1997).
M. Hizukuri et al., "Dynamic Strain and Chip Damage During Ultrasonic Flip Chip Bonding", Jpn. J. Appl. Phys. 40, pp. 3044-3048 (2001).
Y.A. Li et al., "Low Temperature Copper to Copper Direct Bonding", Jpn. Appl. Phys. 37 pp. L1068-L1069 1998).
A. Fan et al., "Copper Wafer Bonding", Electrochem and Solid-State lett. 2, pp. 534-536 (1999).
Indian Office Action issued May 23, 2013 in Application No. 905/DELNP/2008.
Petition for Inter Partes Review of U.S. Pat. No. 7,485,968 (pp. 1-49).
Declaration of Richard Blanchard (pp. 1-18).
Combined Office Action and Search Report issued Aug. 15, 2013 in Taiwanese Application No. 095129638 (With English Translation).
Canadian Office Action issued Aug. 1, 2013, in Patent application No. 2,618,191.
Japanese Office Action issued Oct. 1, 2013, in Japan Patent Application No. 2012-246660 (with English translation).
Office Action issued Jan. 6, 2014, in Chinese Patent Application No. 200680032364.1 (English translation only).
K. Warner et al., "Low-Temperature Oxide-Bonded Three-Dimensional Integrated Circuits", IEEE International 301 Conference, Oct. 2012, pp. 123-125.
E. Yablonovitch et al., "Van der Weals bonding of GaAs on Pd leads to a permanent, solid-phase-topotaxial, metallurgical bond", Appl. Phys. Lett. 59 pp. 3159-3161 (1991).
T. Shimatsu et al. "Metal Bonding During Sputter Film Deposition", J. Vac. Sci. Technol. A 16(4), pp. 2125,2131 (1998).
B. Aspar et al., The Smart-Cut Process: Status and Developments:, Proc. Electrochem Soc. vol. 99-53, pp. 48-59. (1999).
C.H. Tsau et al., "Characterization of Low Temperature Wafer-Level Gold-Gold Thermocompression Bonds",. Mater. Soc. Symp. Proc. 605, pp. 171-176 (1999).
Y. Hayashi et al., "Fabrication of Three-Dimensional IC Using Cumulatively Bonded IC (CUBIC) Technology", VSLI Tech. Dog., pp. 95-96 (1990).
M.A. Schmidt, "Wafer-to-Wafer Bonding for Microstructure Formation", Proc. IEEE, vol. 86, No. 8, pp. 1575-1586 (1998).
T. Suga et al. "Room-Temperature Bonding on Metals and Ceramics", Proc. The $2^{nd}$ Intl. Symposium Semiconductor Wafter Bonding, The Electochemical Soc. Proc. vol. 93-29, pp. 71-80 (1993).
Handbook of Thin Film Technology, Maissel and Glang, 1983 Reissue p. 12-24.
U. Goesele et al., "Silicon Layer Transfer by Wafer Bonding", Proc. The $2^{nd}$ Intl. Symposium on Semiconductor Wafer Bonding, The Electrochemical Soc. Proc. vol. 93-29, pp. 395-409 (1993).
Office Action Issued Jan. 24, 2011, in Chinese Patent Application No. 200680032364.1 (with English translation).
European Search Report issued Sep. 5, 2011, in Patent Application No. 06789507.8.
European Office Action issued Oct. 11, 2011, in Patent Application No. 06 789 507.8.
Office Action issued Oct. 25, 2011, in Israeli Patent Application No. 189173 (with partial English translation.).
Chinese Rejection for Application No. 200680032364.1, dated Apr. 23, 2012.
Korean Office Action mailed Dec. 5, 2012 (with English Translation).
Office Action issued May 7, 2014 in Japanese Patent Application No. 2008-526104 (with English language translation).
Chinese Office Action issued Jul. 24, 2014, in China Patent Application No. 200680032364.1 (English translation only).
Office Action issued Aug. 29, 2014 in Taiwanese Patent Application No. 095129638 (with English language translation).
Office Action issued Dec. 16, 2014 in Japanese Patent Application No. 2013-246782 (with English language translation).
Japanese Office Action issued Dec. 2, 2014 in Patent Application No. 2012-246660 (with English Translation).
Kunio, Takemitsu, "Three dimensional IC technology, using cubic method," Journal of the JWS, Japan Welding Society, Apr. 5, 1994, vol. 63, No. 3, pp. 185-189.
Shigetou et al., "Room-temperature direct bonding of CMP-Cu for bumpless interconnection," Research Center for Advanced Science and Technology, University of Tokyo, 2001 Electronic Components and Technology Conference, pp. 1-6.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tsau et al., "Fabrication process and plasticity of gold-gold thermocompression bonds," Mater. Soc. Symp. Proc. 605, 171 (1999).
Wikipedia, "Chemical bond," URL https://en.wikipedia.org/wiki/Chemical_bond, originally accessed on Mar. 31, 2010, 8 pages.
Wikipedia, "Van der Waals force," URL https://en.wikipedia.org/wiki/Van_der_Waals_force, originally accessed on Mar. 31, 2010, 7 pages.
Canadian Office Action, mailed May 16, 2012 for Canadian Patent Application No. 2,515,375, with international preliminary report, 2 pages.
Goesele et al., "Silicon layer transfer by wafer bonding," Proc. The Second Intl. Symposium on Semiconductor Wafer Bonding, The Electrochemical Soc. Proc., vol. 93-29, p. 395 (1993).
Monsma et al., "Development of the spin-valve transistor," IEEE Tran. Magnet., vol. 33, No. 5, Sep. 1997, pp. 3495-3499.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Amirfeiz et al., "Formation of silicon structures by plasma-activated wafer bonding," Journal of the Electrochemical Society, 2000, vol. 147, No. 7, pp. 2693-2698.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vol. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p—Si/n—InP wafers through surface activated bonding method at room temperature," Indium Phosphide and Related Materials, 2001, IEEE International Conference on, pp. 272-275.
Howlader et al., "Characterization of the bonding strength and interface current of p—Si/ n—InP wafers bonded by surface activated bonding method at room temperature," Journal of Applied Physics, Mar. 1, 2002, vol. 91, No. 5, pp. 3062-3066.

(56) References Cited

OTHER PUBLICATIONS

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviour," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Conference, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transductions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
U.S. Appl. No. 15/159,649, filed Dec. 15, 2016, Uzoh et al.
U.S. Appl. No. 15/379,942, filed Dec. 15, 2016, Enquist et al.
U.S. Appl. No. 15/387,385, filed Dec. 21, 2016, Wang et al.
U.S. Appl. No. 15/389,157, filed Dec. 22, 2016, Uzoh et al.
U.S. Appl. No. 15/395,197, filed Dec. 30, 2016, Huang et al.
U.S. Appl. No. 15/426,942, filed Feb. 7, 2017, DeLaCruz et al.

(56) References Cited

OTHER PUBLICATIONS

Japanese Office Action mailed Mar. 21, 2017 in Japanese Patent Application No. 2016-019820, with English translation, in 10 pages.
Japanese Office Action mailed Mar. 21, 2017 in Japanese Patent Application No. 2016-019820, in 5 pages.

3D IC METHOD AND DEVICE

CROSS-REFERENCE TO RELATED APPLICATIONS

This application is a continuation of and claims the benefit of priority under 35 U.S.C. §120 from U.S. application Ser. No. 14/198,723, filed Mar. 6, 2014, which is a division of U.S. application Ser. No. 13/783,553, filed Mar. 4, 2013, now U.S. Pat. No. 8,709,938, which is a continuation of U.S. application Ser. No. 12/270,585, filed Nov. 13, 2008, now U.S. Pat. No. 8,389,378, which is a continuation of U.S. application Ser. No. 11/201,321, filed Aug. 11, 2005, now U.S. Pat. No. 7,485,968, the entire contents of each of which is incorporated herein by reference.

This application is related to application Ser. No. 09/532,886, now U.S. Pat. No. 6,500,794, Ser. No. 10/011,432, now U.S. Pat. No. 7,126,212, Ser. No. 10/359,608, now U.S. Pat. No. 6,962,835, Ser. No. 10/688,910, now U.S. Pat. No. 6,867,073, and Ser. No. 10/440,099, now U.S. Pat. No. 7,109,092.

BACKGROUND OF THE INVENTION

1. Field of the Invention

The present invention relates to the field of three-dimensional integrated circuits and more particularly to devices and the fabrication thereof of three-dimensional integrated circuits using direct wafer bonding.

2. Description of the Related Art

Semiconductor integrated circuits (ICs) are typically fabricated into and on the surface of a silicon wafer resulting in an IC area that must increase as the size of the IC increases. Continual improvement in reducing the size of transistors in ICs, commonly referred to as Moore's Law, has allowed a substantial increase in the number of transistors in a given IC area. However, in spite of this increased transistor density, many applications require an increase in total IC area due to a greater increase in required transistor count or an increase in the number of lateral interconnections required between transistors to achieve a specific function. The realization of these applications in a single, large area IC die typically results in a reduction in chip yield and, correspondingly, increased IC cost.

Another trend in IC fabrication has been to increase the number of different types of circuits within a single IC, more commonly referred to as a System-on a-Chip (SoC). This fabrication typically requires an increase in the number of mask levels to make the different types of circuits. This increase in mask levels typically also results in a reduction in yield, and correspondingly, increased IC cost. A solution to avoiding these undesired decreases in yield and increases in cost is to vertically stack and vertically interconnect ICs. These ICs can be of different size, come from different size wafers, comprise different functions (i.e., analog, digital, optical), be made of different materials (i.e., silicon, GaAs, InP, etc.). The ICs can be tested before stacking to allow Known Good Die (KGD) to be combined to improve yield. The economic success of this vertical stacking and vertical interconnect approach depends on the yield and cost of the stacking and interconnection being favorable compared to the yield and cost associated with the increased IC or SoC area. A manufacturable method for realizing this approach is to vertically stack ICs using direct bonding and to form vertical interconnect structures using conventional wafer fabrication techniques including wafer thinning, photolithography masking, via etching, and interconnect metallization. The vertical electrical interconnection between stacked ICs can be formed as a direct result of the direct bonded stacking or as a result of a sequence of wafer fabrication techniques after direct bonded stacking.

The cost of the vertical interconnection portion of this approach is directly related to the number of photolithography masking levels required to etch vias and form electrical interconnects. It is thus desirable to minimize the number of photolithography masking levels required to form the vertical interconnection.

One version of vertical stacking and vertical interconnection is where ICs (on a substrate) are bonded face-to-face, or IC-side to IC-side. This version may be done in a wafer-to-wafer format, but is typically preferably done in a die-to-wafer format where die are bonded IC-side down, to a wafer IC-side up to allow the stacking of Known Good Die to improve yield. The vertical interconnection may be formed as a direct result of the stacking, for example as described in application Ser. No. 10/359,608, or as a result of a sequence of wafer fabrication techniques after direct bonded stacking. The sequence of wafer fabrication techniques after direct bonded stacking typically includes the following. The die are typically substantially thinned by removing most of the die substrate. The die substrate can not, in general, be totally removed due to the location of transistors in the substrate, as is the case, for example in bulk CMOS ICs. The substrate is thus typically removed to the greatest extent practicable, leaving sufficient residual substrate to avoid damage to the transistors. An interconnection to the die IC is then formed by etching a via through the remaining substrate to an interconnection location in the die IC, such that there are no necessary transistors in the vicinity of this via. It is furthermore preferable, in order to achieve the highest interconnection density, to continue this via through the entire die-IC and into the wafer-IC to an interconnection location in the wafer IC. This via typically extends through an insulating dielectric material that provides desired electrical isolation from interconnection locations in the die IC and wafer IC and exposes desired electrical connection locations in the die IC and wafer IC. After the formation of this via, a vertical interconnection can be made with a conductive material to exposed desired electrical connection locations in the die IC and wafer IC. An insulating layer between the conductive material and the exposed substrate on the via sidewall may be used to avoid undesired electrical conduction between the conductive material and the substrate.

The fabrication of this structure typically takes four photolithography masking levels to build. These levels are 1) via etch through substrate, 2) via etch through insulating dielectric material in the die IC and wafer IC that exposes desired conductive material in the die IC and wafer IC, 3) via etch through a subsequently deposited insulating layer that electrically isolates the conductive material that interconnects the interconnect location in the die IC with the interconnect location in the wafer IC to the exposed substrate via sidewall that exposes desired conductive material in the die IC and wafer IC, 4) interconnection with conductive material between exposed interconnection point in the die IC with exposed interconnection point in the wafer IC.

The patterns defining the via etching through the insulating (dielectric) material(s) are typically smaller than the pattern defining the via etch through the substrate to adequately expose the interconnection points in the die IC and wafer IC and to avoid removing insulating material on the substrate via sidewall. Since these patterns are formed after the via in the substrate, this patterning is typically done at a lower topographical level that the patterning of the substrate via. This results in a patterning over a non-planar structure that limits the scaling of the structure to very small feature size that is desirable to achieve the highest interconnection density and consumes the least possible silicon substrate where functional transistors would otherwise reside.

It is thus desirable to have a device that comprises a structure and a method to fabricate said structure requiring a reduced number of masking steps and masking steps that can be realized on a planar surface, at the highest, or one of the highest, levels of topography in the structure. It is further desirable to have a device that comprises a structure and a method to fabricate said structure whereby a minimum consumption of silicon where functional transistors would otherwise reside is achieved.

SUMMARY OF THE INVENTION

The present invention is directed to a method of three-dimensional device integration and a three-dimensionally integrated device.

In one example of the method, a first element having a first contact structure is integrated with a second element having a second contact structure. The method may include the steps of forming a via in the first element exposed to at least the first contact structure, forming a conductive material in the via and connected to at least the first contact structure, and bonding the first element to the second element such that one of the first contact structure and the conductive material is directly connected to the second contact structure.

In a second example the method may include the steps of forming a via in a first element, forming a first conductive material in the via, connecting the first conductive material to the first contact structure, and bonding the first element to the second element such that one of the first contact structure and the first conductive material is directly connected to the second contact structure.

In a third example, the method includes the steps of forming a via in a first element having a first substrate, forming a conductive material in the via, forming a contact structure in the first element electrically connected to the conductive material after forming the via and the conductive material, forming a second element having at least one second contact structure, removing a portion of the first substrate to expose the via and the conductive material, bonding the first substrate to the second substrate, and forming a connection between the second contact structure and one of the first contact structure and the conductive material as a part of the bonding step.

In one example of an integrated structure according to the invention, a first element has a first contact structure, a second element has a second contact structure, a first via is formed in the first element, a first conductive material is formed in the first via connected to the first contact structure, and the first element is bonded to the second element such that one of the first conductive material and the first contact structure is directly connected to the second contact structure.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
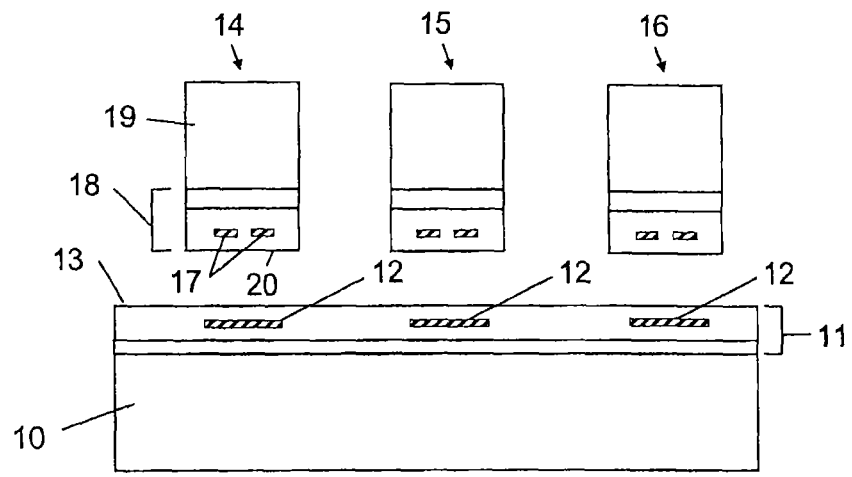
FIG. 1 is a diagram showing die to be bonded face-down to a wafer face-up.

Referring now to the drawings, in particular FIG. 1, a first embodiment of the method according to the invention will be described. It is noted here that the drawings are not drawn to scale but are drawn to illustrate the concepts of the invention.

Substrate 10 includes a device region 11 having contact structures 12. Substrate 10 may be made of a number of materials, such as semiconductor material or insulating material, depending on the desired application. Typically, substrate 10 is made of silicon or III-V materials. Contact structures 12 are typically metal pads or interconnect structures making contact to device or circuit structures (not shown) formed in substrate 10. Substrate 10 may also contain an integrated circuit to which the contact structures 12 are connected, and substrate 10 may be a module containing only contact structures. For example, substrate 10 may be a module for interconnecting structures bonded to substrate 10, or bringing out connections for packaging or integration with other modules or circuit structures on, for example, a printed circuit board. The module may be made of insulative materials such as quartz, ceramic, BeO, or AlN.

Positioned for bonding to substrate 10 on surface 13 are three separated die 14-16. Each die has a substrate portion 19, a device region 18 and contact structures 17. The die may be previously separated from another wafer by dicing, etc. Die 14-16 may be made of a number of materials, such as semiconductor materials, depending on the desired application. Typically, the substrate is made of silicon or III-V materials. Contact structures 17 are typically metal pads or interconnect structures making contact to device or circuit structures formed in device region 18. The sizes of contact structures 12 and 17 each may vary. The typical range of contact structure size is between 1 and 20 microns, but the sizes and relative sizes may be outside this range depending upon alignment tolerances, circuit design parameters or other factors. The sizes of the contact structures are drawn to illustrate the inventive concepts are and are not meant to be limiting. Device region 18 may also contain an integrated circuit to which the contact structures 17 are connected. Substantially all of substrate portion 19 may be removed, leaving a layer of devices, a circuit, or a circuit layer. Also, the substrates of dies 14-16 may be thinned after bonding to a desired thickness.

Die 14-16 may be of the same technology as wafer 10, or of different technology. Die 14-16 may each be the same or different devices or materials. Each of die 14-16 has conductive structures 17 formed in a device region 18. Structures 17 are spaced apart to leave a gap therebetween, or may be a single structure with an aperture which may extend across the entire contact structure. In other words, the aperture may be a hole in contact structure or may divide the contact structure in two. The size of the gap or aperture may be determined by the photolithographic design rules for the particular technology being bonded. For example, a minimum lateral width of contact structures 12 and 17 may be required to subsequently form a reliable, low resistance electrical connection with interconnect metal.

An additional factor that determines the optimum size of the gap or aperture is a ratio of a distance given by the vertical separation between contact structures 17 and 12 plus the thickness of the contact structure 17 to the size of the gap or aperture. This defines an aspect ratio of a via that will subsequently be formed between contact structures 17 and 12 to enable an electrical interconnection between contact structures 17 and 12. This vertical separation is typically 1-5 microns, or less, for oxide to oxide direct bonding, as described in application Ser. No. 09/505,283, the contents of which are incorporated herein by reference, or potentially zero for metal direct bonding, as described in application Ser. No. 10/359,608, the contents of which are herein incorporated by reference. Furthermore, the contact structure 17 thickness is typically 0.5 to 5 microns. With a typical desired via aspect ratio of 0.5 to 5 depending on the process technology used, a typical range of the size of the gap is 0.3-20 microns for oxide to oxide bonding or ~0.1-10 microns for metal direct bonding. The metal direct bonding case is described below in the fourth embodiment.

Dies 14-16 are generally aligned with the contact structures 12 such that structures 17 and the gap or aperture are positioned over corresponding contact structures 12. The size of contact structures 12 is chosen to allow die 14-16 to be simply aligned with the gap between contact structures 17. This size depends on the alignment accuracy of the method used to place die 14-16 on substrate 10. Typical methods using commercially available production tools allow alignment accuracies in the range of 1-10 microns, although future improvements in these tools is likely to result in smaller alignment accuracies. The lateral extent of contact structures 17 exterior to the gap or aperture is preferably at least a distance given by this alignment accuracy.

Although only one set of contact structures 17 is shown for each die 14-16, it is understood that the lateral extent of contact structures 17 is typically much smaller than the lateral extent of each die 14-16, so that each die may have several or a very large number of contact structures 17. For example, contact structures 17 may have a lateral extent in the range of 1-100 microns and die 14-16 may have a lateral extent in the range of 1-100 mm. A quantity of contact structures 17 in die 14-16 having an order of magnitude 104 and much higher is thus practically realizable.

Figure 2A:
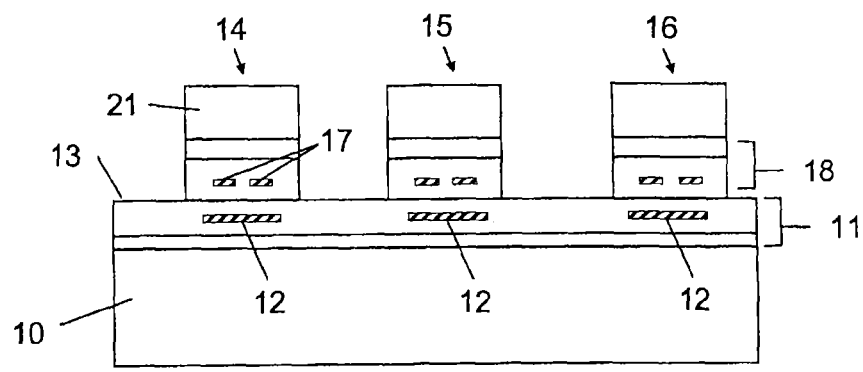
FIG. 2A is a diagram of die bonded to a substrate.
Figure 2B:
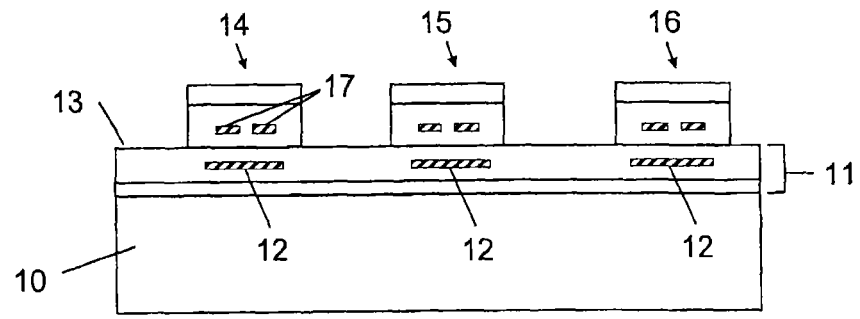
FIG. 2B is a diagram of die bonded to a substrate with a portion of the substrate of the die removed.

As shown in FIG. 2A, surface 20 of die 14 is bonded to surface 13 of substrate 10. This may be accomplished by a number of methods, but is preferably bonded at room temperature using a bonding method as described in application Ser. No. 09/505,283, where bonds of a strength in the range of 500-2000 mJ/m², i.e., chemical bonds are formed. The bonding of die 14-16 to substrate 10 is illustrated in FIG. 2. After bonding the substrates of die 14-16 are thinned. Thinning is typically achieved by polishing, grinding, etching, or a combination of these three techniques to leave thinned substrate 21 or to completely remove substrate portion 19. FIG. 2B illustrates the example where substrate portion 19 is completely or substantially completely removed. Also, the substrates of dies 14-16 may be thinned prior to bonding.

Figure 2C:
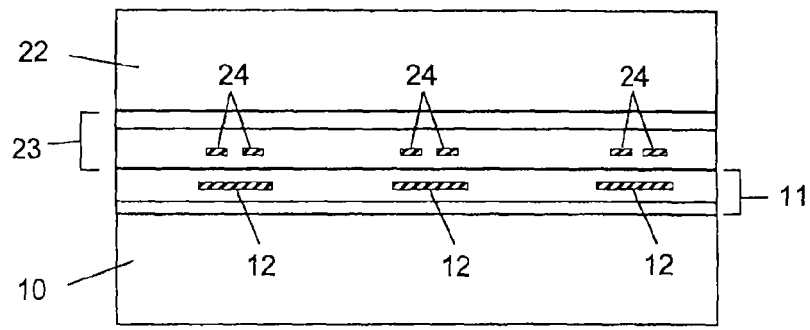
FIG. 2C is a diagram of a substrate bonded to another substrate.

While three die are shown bonded to a single substrate 10 in FIG. 2A, it is also possible to bond a larger or smaller number of die to substrate 10. Also, it is possible to bond another substrate of a size comparable to that of substrate 10, which is illustrated in FIG. 2C where a substrate 22 having a device region 23 is bonded to wafer 10 such that spaced apart conductive structures 24 are generally aligned with conductive structures 12. Substrate 22 may be thinned or removed prior to bonding to facilitate alignment. Substrate 22 may be thinned after bonding, and substantially all of substrate 22 may be removed if desired. The procedures described in the following figures are also applicable to the structures shown in FIGS. 2B and 2C, but separate drawings are omitted for brevity.

Figure 3A:
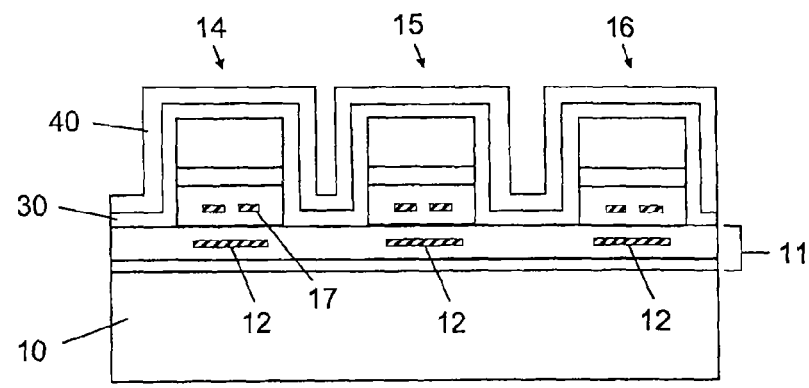
FIG. 3A is a diagram showing formation of a dielectric film and mask layer over the structure of FIG. 2A.
Figure 3B:
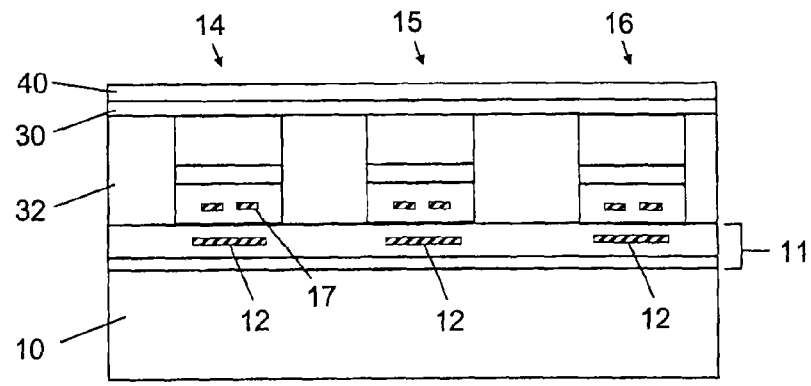
FIG. 3B is a diagram showing formation a dielectric film and mask layer after forming a planarizing material.

As shown in FIG. 3A, a conformal dielectric film 30 is formed over surface 13 of substrate 10 and dies 14-16. This film may be formed by, for example, CVD, PVD or PECVD and preferably consists of an oxide film such as silicon oxide of typical thickness range 0.1 to 1.0 micron. Also, a filler material such as a deposited or spun-on oxide or polymer 32 such as polyimide or benzocyclobutene may be formed over and/or between dies 14-16, as shown in FIG. 3B. Material 32 may be formed at various points in the process. FIG. 3B shows the example where material 32 is formed prior to forming films 30 and 40. Filler, material may also be formed after forming the structure shown in FIG. 3A, after forming hard mask 40 (FIG. 4), or at various other points in the process depending on many factors such as the materials chosen or temperature considerations. Other techniques may be used for forming filler material. For example a dielectric filler, for example, silicon oxide, may be used by successive or iterative steps of dielectric formation, for example using methods described above, and chemical-mechanical polishing. Alternatively, a conductive filler, for example metal formed by, for example, electroplating, may be used by successive or iterative steps of metal formation and chemomechanical polishing. Having a flat surface may improve forming photoresist and other films on the surface and forming apertures in such films, for example, aperture 41 shown in FIG. 4.

Figure 4:
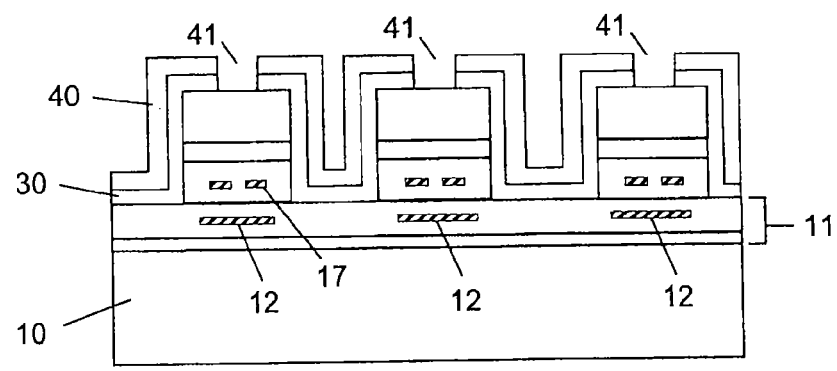
FIG. 4 is a diagram showing apertures formed in the dielectric film and mask layer of FIGS. 3A and 3B.

Subsequently, a hard mask 40 is formed on dielectric film 30 and patterned to leave apertures 41 generally aligned with structures 17 (FIG. 4). The hard mask is preferably comprised of a material that has a high etch selectivity to a subsequent etch process or processes used to etch a via through thinned substrate 21 and device regions 18 and 11 to contact structures 12. Examples of a hard mask are aluminum, tungsten, platinum, nickel, and molybdenum, and an example of an etch process is an $SF_6$-based reactive ion etch to etch a via through a thinned silicon substrate and a $CF_4$-based reactive ion etch to etch a subsequent via through device regions 18 and 11 to contact structures 12. The thickness of the hard mask 40 is typically 0.1 to 1.0 microns. The width of aperture 40 is dependent on a number of factors including the thickness of thinned substrate 21 and the gap between contact structures 17, but is typically 1 to 10 microns.

Aperture 41 is formed using standard photolithographic patterning and etching techniques of the hard mask 40 and dielectric film 30. For example, an aperture can be formed in photoresist using photolithography. This aperture can be aligned to alignment marks on the die 14-16 (or substrate 22), or substrate 10. Optical or IR imaging can be used for the alignment. The hard mask 40 can then be etched with an appropriate wet chemical solution or a dry reactive ion etch process that depends on the hard mask material, revealing the dielectric film 30 in the aperture. The dielectric film 30 can then be etched in a manner similar to the hard mask 40 with an appropriate wet chemical solution or a dry reactive ion etch that depends on the dielectric film material. An example of a wet chemical solution for a hard mask is Aluminum Etchant Type A if the hard mask is Aluminum. An example of a reactive ion etch process for a dielectric film material is a $CF_4$-based reactive ion etch if the dielectric film material is silicon oxide. Many other wet and dry etches are possible for these and other hard mask and dielectric film materials. The width of the apertures 41 is preferably wider than the spacing between the structures 17 if the aperture is aligned to the die 14-16 (or substrate 22), or, preferably wider than the spacing between the structures 17 plus the alignment accuracy of the method used to place die 14-16 (or substrate 22), on substrate 20 if the aperture is aligned to the lower substrate 20.

Figure 5:
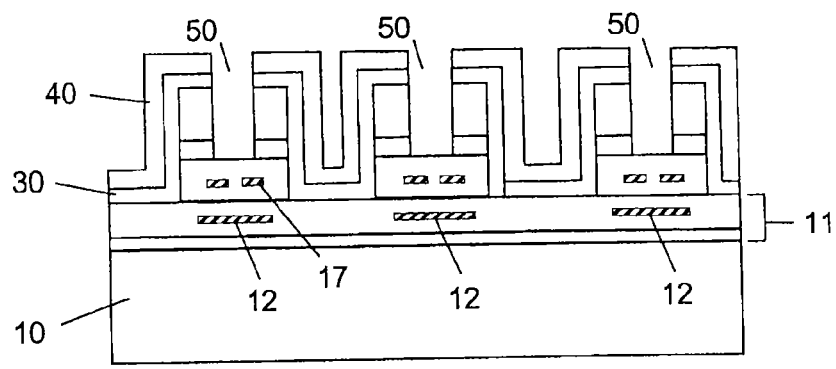
FIG. 5 is a diagram showing etching of the die using the aperture formed as shown in FIG. 4.
Figure 6A:
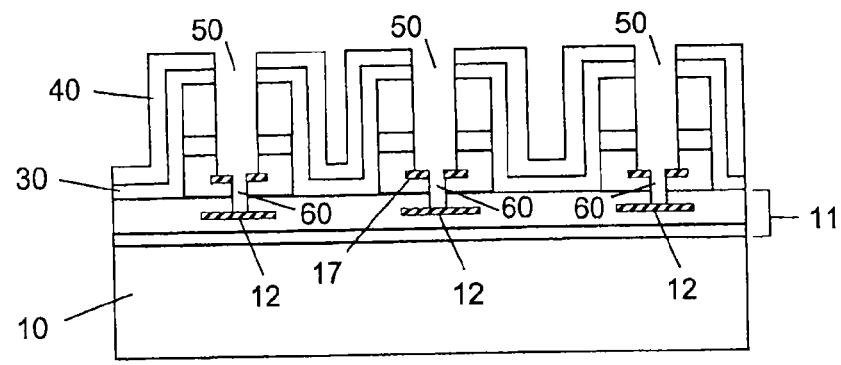
FIG. 6A is a diagram showing further etching to expose contact structures in the die and wafer.

Using the hard mask 40, substrate portions of dies 14-16 are etched to form vias 50, as shown in FIG. 5. The etching is continued through the material adjacent to contact structures 12 and 17, which typically is a dielectric material, to expose back and side portions of conductive structure 17 and a top surface of contact structures 12. A first set of gases and conditions, for example $SF_6$-based, may be used to etch through the substrate material of dies 14-16, and a second set of gases and conditions, for example $CF_4$-based, may be used to etch through the dielectric layers surrounding the contact structures 17. Both etches may be performed in one chamber by switching gases and conditions appropriately, without having to break vacuum. The etching to expose conductive structure 12 is shown in FIG. 6A. The etching produces a via portion 60 extending through the gap or aperture of contact structures 17 to contact structure 12.

The dielectric via etching to expose contact structures 12 and 17 preferably has a high etch selectivity to contact structures 17 so as to avoid a detrimental amount of etching to contact structures 17. However, there may be some combinations of dielectric via etching and conductive structures that result in a detrimental amount of etching to contact structures 17. For example, detrimental effects may occur when conductive structure 17 is sufficiently thin or when the vertical distance between contact structures 12 and 17 is sufficiently large.

An example of a detrimental amount of etching is some combinations of aluminum contact structures 17 surrounded by silicon oxide dielectric and some $CF_4$-based reactive ion etches where the ratio of the aluminum conductive structure etch rate to the silicon oxide dielectric etch rate is comparable to or higher than the ratio of the thickness of contact structure 17 to the thickness of silicon oxide dielectric between contact structures 12 and 17.

Figure 6B:
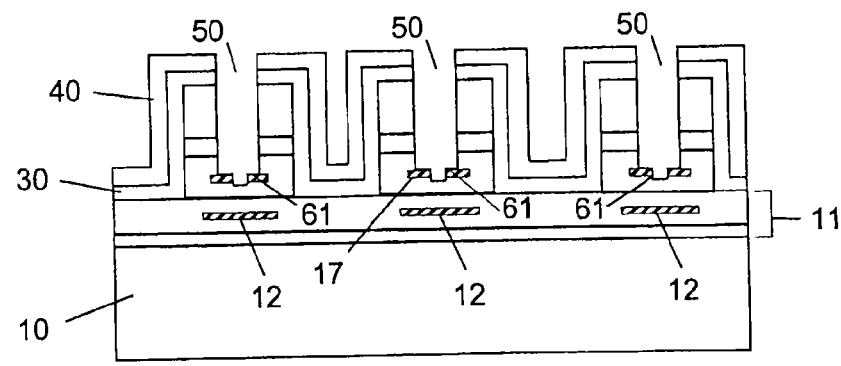
FIG. 6B is a diagram of a process modification including forming a hard mask.

In those situations where there would be a detrimental amount of etching to contact structures 17, the thickness of contact structures 17 may be increased or an intermediate step is added to protect contact structures 17 from the dielectric via etch. An intermediate process step can be used to avoid detrimental etching as follows. When the dielectric etching first exposes back and side portions of upper contact structure 17, a hard mask, such as a metal material, can be selectively deposited on revealed portions of contact structure 17 before continuation of the dielectric etching results in detrimental etching to contact structure 17. After selective deposition of a hard mask, the dielectric etching can be continued without detrimental etching to contact structure 17. An example of a selective deposition of a hard mask is electroless nickel plating. This is shown, for example, in FIG. 6B where etching is stopped after exposing contact structures 17 and before any significant detrimental etching occurs. Contact structures 17 are then coated with a protective hard mask material 61, for example, nickel using, for example, electroless plating. A material such as nickel may remain in the device in subsequent connecting of the contact structures 12 and 17. Alternatively, the material 61 may be removed before forming connecting structures 12 and 17, if needed.

Figure 7A:
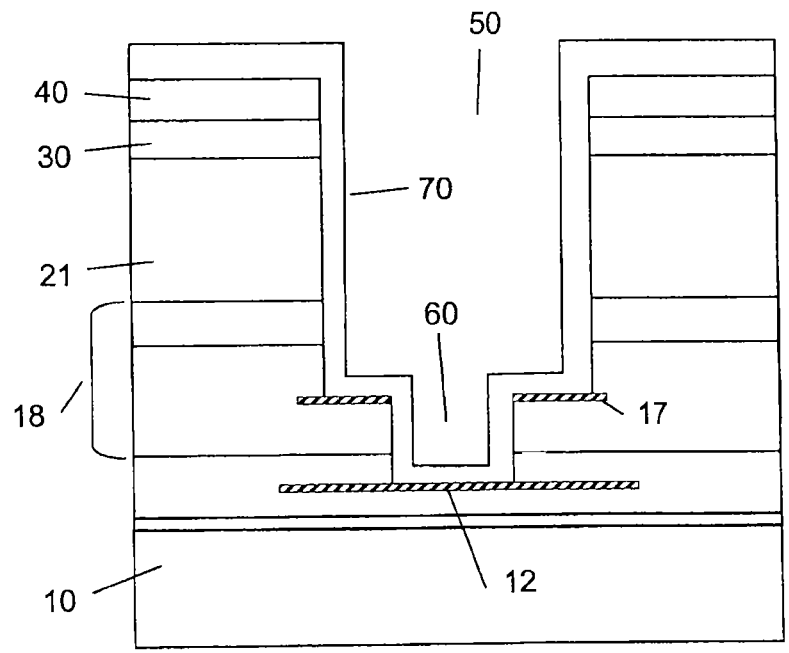
FIG. 7A is a diagram of a section of the structure of FIG. 6A after formation of a conformal insulative sidewall layer.

Note that protective hard mask 61 may also be selectively deposited on hard mask 40. An example is when hard mask 40 is conductive and deposition of protective hard mask 61 is accomplished with electroless plating. This may be advantageous for decreasing the required thickness of hard mask 40. A further advantage of deposition of protective hard mask material 61 on hard mask 40 may be a restriction of the aperture of via 50 resulting in shadowing of a portion of contact structures 17 from anisotropic etching of via 60. FIG. 7A illustrates one of the die 14-16 in detail to more clearly illustrate the subsequent steps. A conformal insulative film 70 is formed over mask 40 and contact structures 12 and 17, and the sidewall of vias 50 and 60, partially filling vias 50 and 60. Examples of a suitable insulative film are silicon oxide, silicon nitride or Parylene. The insulative film may be formed using a number of typical deposition methods including but not limited to physical vapor deposition, chemical vapor deposition, and vapor phase deposition. An example of physical vapor deposition is sputtering, an example of chemical vapor deposition is plasma enhanced chemical vapor deposition, and an example of vapor phase deposition is vaporization of a solid, followed by pyrolysis and then deposition.

Figure 7B:
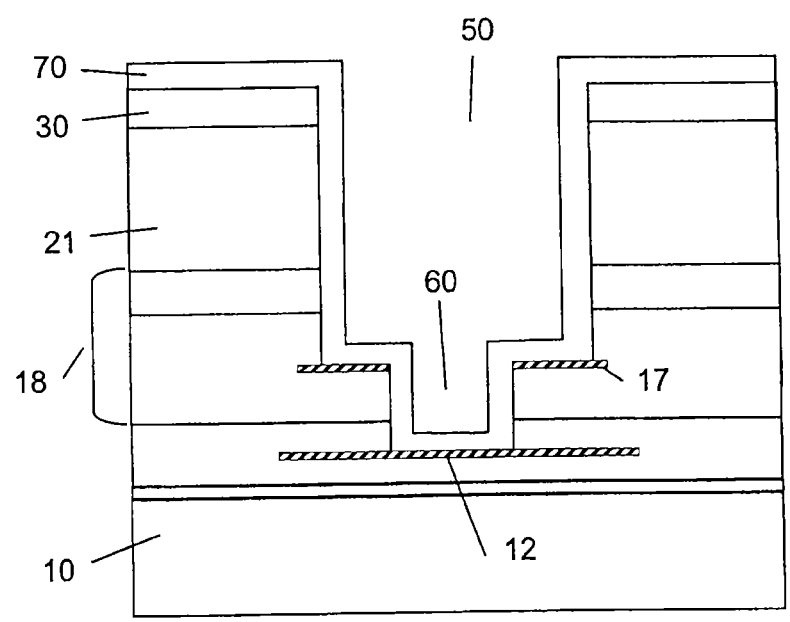
FIG. 7B is a variation of the embodiment where the hard mask is removed.

Hard mask 40 or hard mask 40 and conformal dielectric film 30 may be removed before formation of conformal insulative film 70 by, for example, etching. FIG. 7B illustrates the case where hard mask 40 is removed. If the etch to remove hard mask 40 or hard mask 40 and film 30 is selective to materials exposed by vias 50 and 60, this etch can be done without a mask. If this etch is not selective to materials exposed by vias 50 and 60, those materials subject to etch in vias 50 and 60 may be masked with a suitable material. For example, if the hard mask 40, and contact structures 12 and 17 are all aluminum, the vias can be partially filled with an easily removable spin-on viscous liquid material to a depth such that contact structures 12 and 17 are covered. The vias can be partially filled with a spin-on viscous liquid material by first selecting an adequate spin-on film thickness that will suitably planarize the surface formed by hard mask 40 through which vias 50 and 60 were formed. Application of this film thickness will then result in a much thicker film thickness inside the via than outside the via. A suitable etch of the entire surface then removes this material from the surface of hard mask 40 while leaving material in vias 50 and 60 that covers contact structures 12 and 17. An example of an easily removable spin-on material and suitable etch are photoresist and an $O_2$ plasma etch, respectively.

Figure 8A:
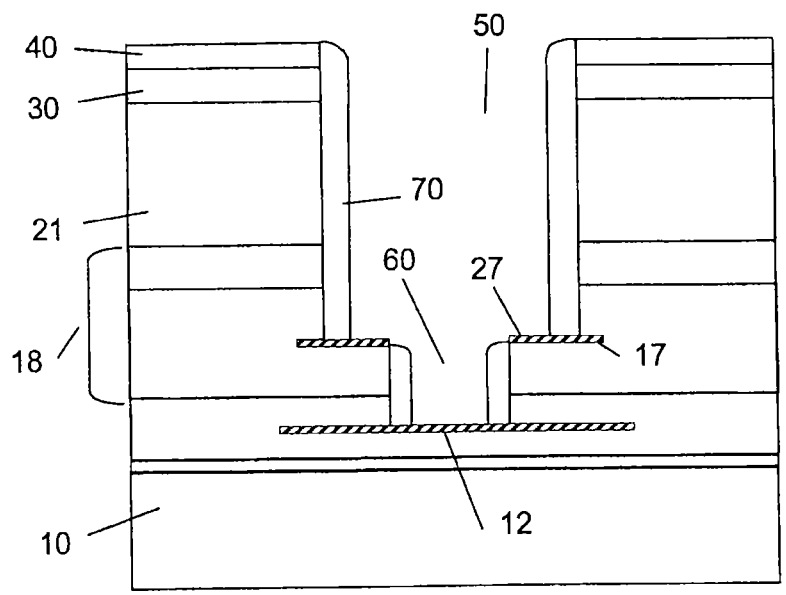
FIG. 8A is a diagram showing anisotropic etching of a conformal insulative sidewall layer.
Figure 8B:
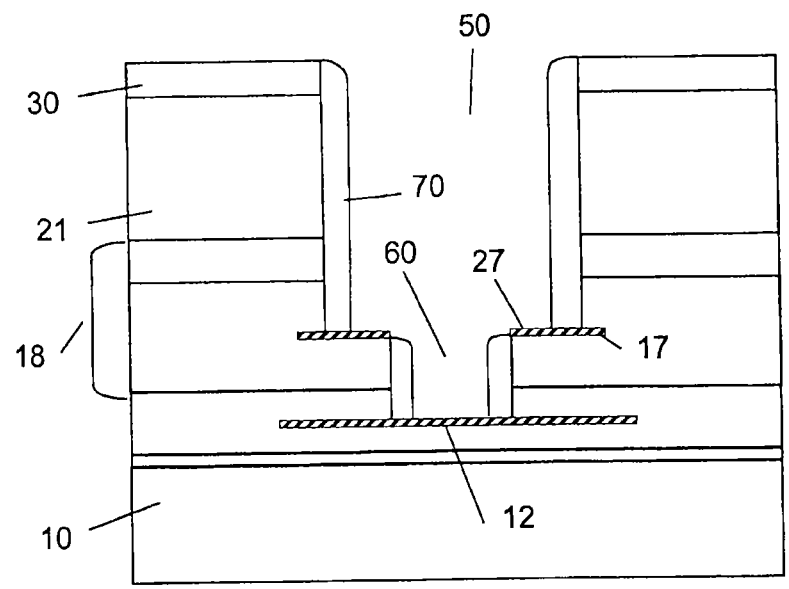
FIG. 8B is a variation of the embodiment where the hard mask is removed.
Figure 8C:
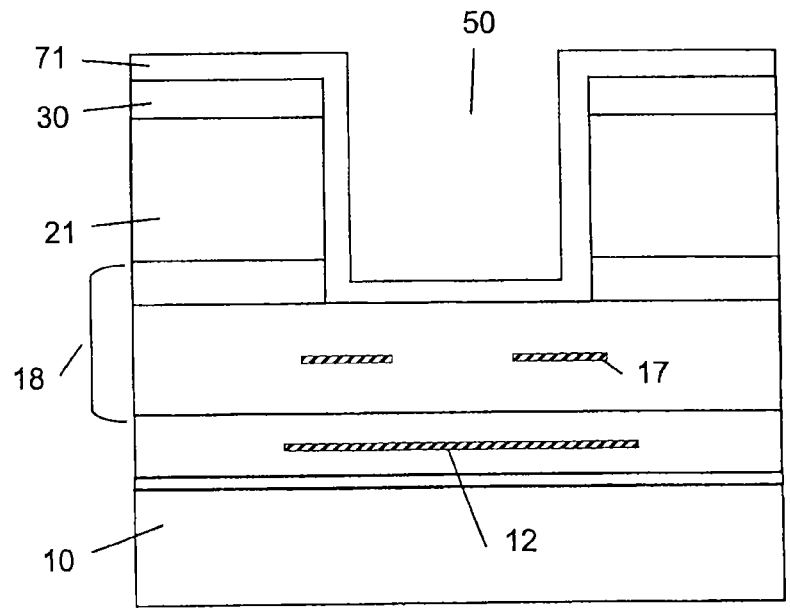
FIGS. 8C-8F illustrate variations in forming a conformal film in the bonded structure.
Figure 8D:
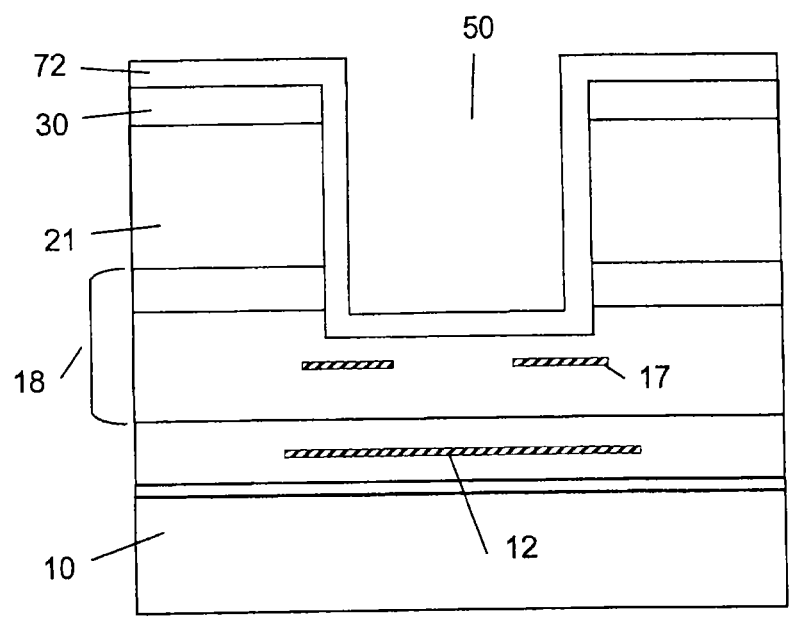
Figure 8E:
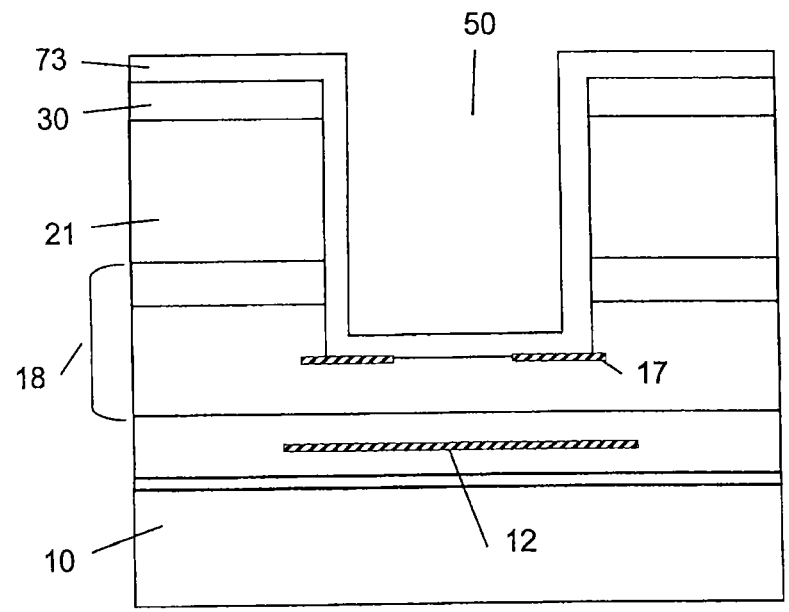
Figure 8F:
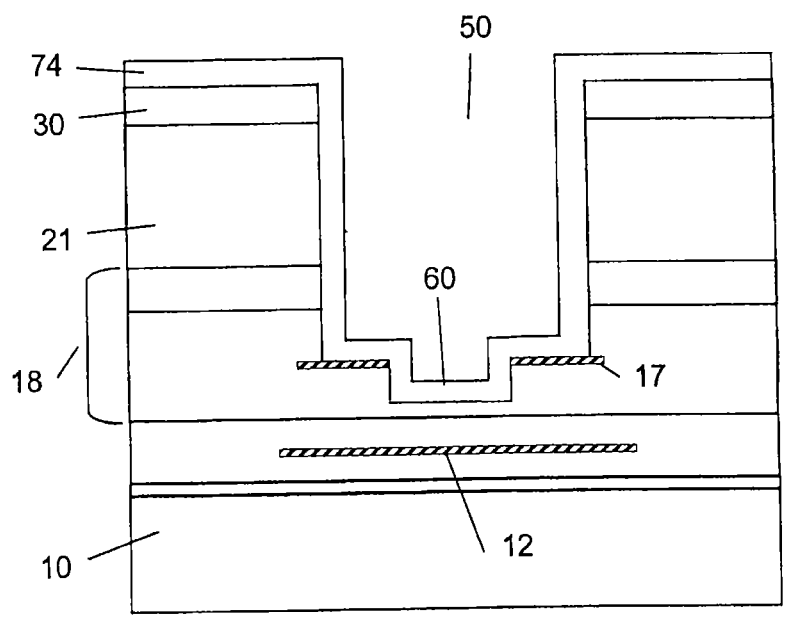
Figure 8G:
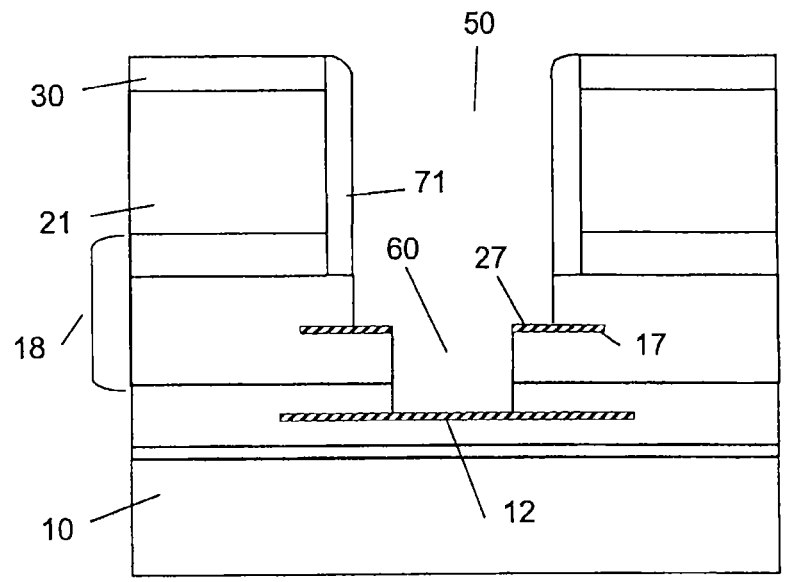
FIGS. 8G-8J illustrate the structures shown in FIGS. 8C-8J after etching the conformal film, respectively.

Conformal film 70 is anisotropically etched to expose contact structures 12 and 17 while leaving film 70 on the sidewalls of vias 50 and 60. A back surface of structures 17 is preferably exposed to create a ledge 27 for increasing the contact surface area, resulting in reduced contact resistance. A typical ledge 27 width in excess of 1 micron is preferred for minimizing the contact resistance, but this distance will vary based upon device and process parameters. FIGS. 8A and 8B depict the etched conformal film 70, without and with mask 40 removed before formation of conformal insulative film 70, respectively. Both of films 30 and 40 may be removed prior to forming layer 70. In this case, following etching of conformal layer 70 another insulating layer may be formed on substrate portion 21 (or device region 18 where portion 21 is completely removed) by oxidation or deposition, for example. Alternative to conformal film 70, conformal films may also be formed before exposure of top surface of contact structure 12. For example, conformal film 71 may be formed after etching through the substrate portions of die 14-16 but before etching into the material adjacent to contact structure 17, conformal film 72 may be formed after etching into the material adjacent to contact structure 17 but before reaching contact structure 17, conformal film 73 may be formed after reaching contact structure 17 but before forming via 60, or conformal film 74 may be formed after reaching conductive structure 17 and forming part of via 60 but before completing via 60 and reaching contact structure 12 as shown in FIGS. 8C, 8D, 8E, and 8F, respectively. Conformal films 71, 72, 73, and 74 may subsequently be anisotropically etched to form isolating sidewalls on the via portion 50 of the substrate portions of die 14-16. For example, conformal film 71 may be subsequently anisotropically etched to form an isolating sidewall on the via portion 50 of the substrate portions of die 14-16, conformal film 72 may be subsequently anisotropically etched to form an isolating sidewall on the via portion 50 of the substrate portion of die 14-16 and the upper portion of via 50 comprised of material adjacent to contact structure 17, conformal film 73 may be subsequently anisotropically etched to form an isolating sidewall on the entire depth of via 50, and conformal film 74 may be subsequently anisotropically etched to form an isolating sidewall on the entire depth of via 50 and the upper portion of via 60, as shown in FIGS. 8G, 8H, 8I, and 8J, respectively.

Figure 8H:
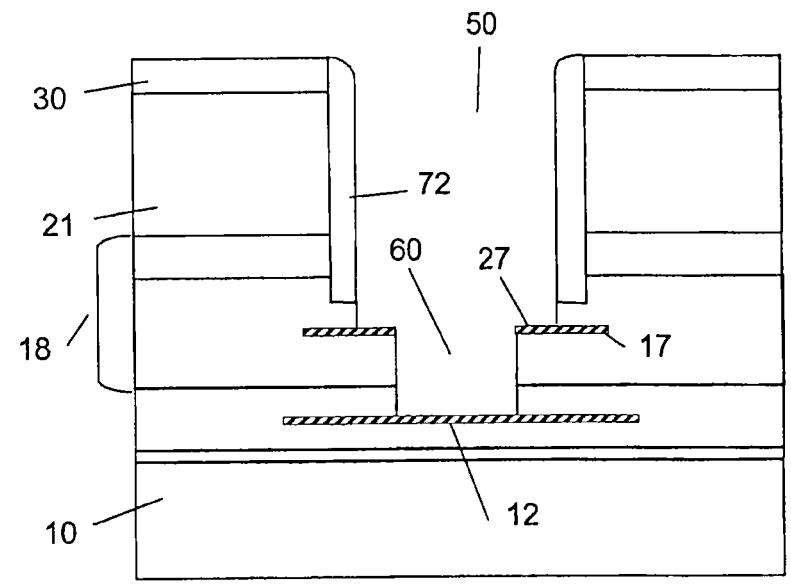
Figure 8I:
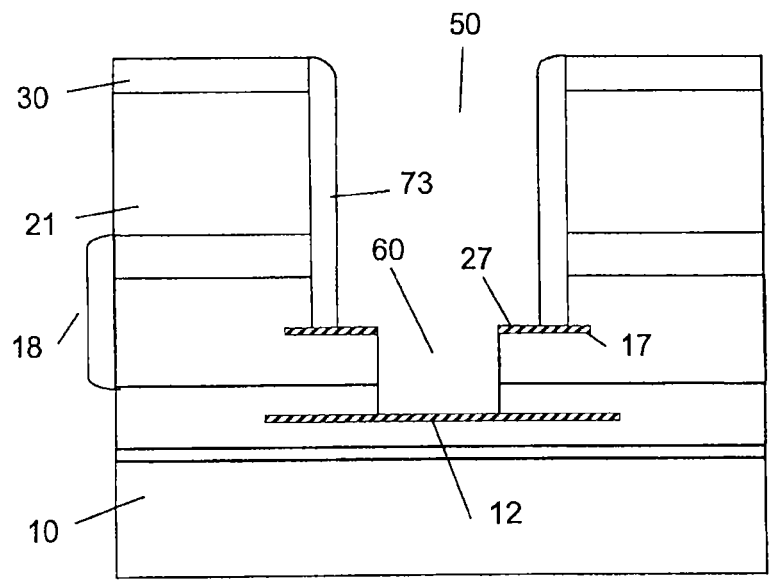
Figure 8J:
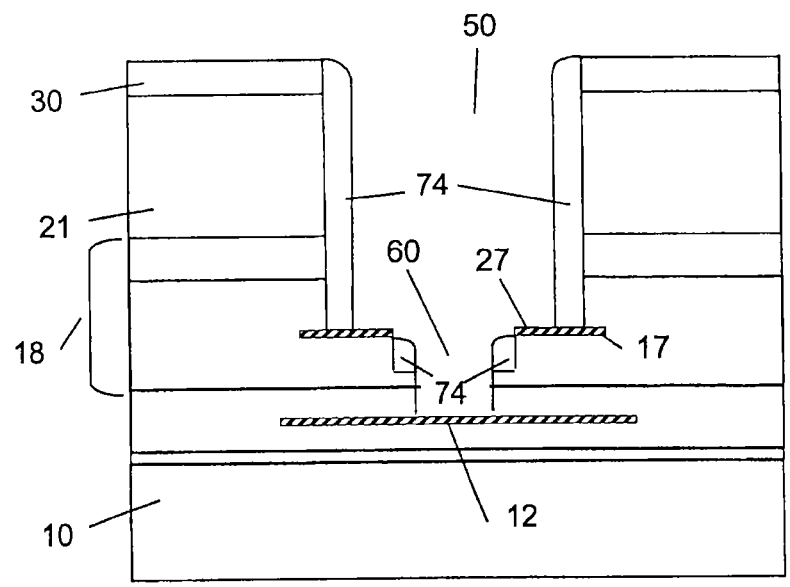
Figure 8K:
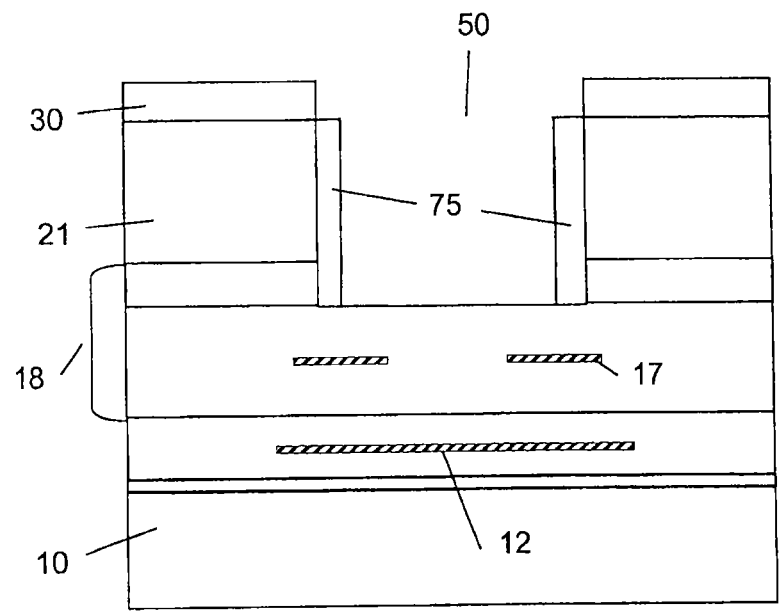
FIG. 8K illustrates an alternative manner of forming a sidewall film in the bond structure.

Alternative to the sidewall formed by the conformal deposition of films 70, 71, 72, 73, or 74 and subsequent anisotropic etching of said films, a sidewall 75 can be formed selectively on the substrate portion of die 14-16 in via 50, after said portion is formed by said via as shown in FIG. 8K. Sidewall 75 can be formed by a process that reacts preferentially to the substrate portion versus material adjacent to contact structure 17. For example, if the substrate portion of die 14-16 is silicon and the material adjacent to contact structure 17 is silicon oxide, a dielectric deposition process that nucleates preferentially on silicon versus silicon oxide may be used, where the dielectric deposition comprises sidewall 75, where sidewall 75 is structurally similar to conformal film 71 in via 50 after anisotropic etching of conformal film 71 shown in FIG. 8K. Here, sidewall 75 is formed after etching through the substrate portions of die 14-16 but before etching into the material adjacent to contact structure 17.

A side surface of contact structures 17 may also be exposed in the anisotropic etching to further increase the surface area and lower the contact resistance. This is also shown in FIGS. 8A and 8B. The vias 50 and 60 can then be further filled or completely filled with metal. Methods of filling vias 50 and 60 with metal include but are not limited to physical vapor deposition (PVD), chemical vapor deposition (CVD) or electroplating. Electroplating is typically used for the deposition of thicker films than PVD or CVD and is typically preceded by the deposition of a thin PVD or CVD seed layer. Examples of films formed by PVD are sputtered aluminum, palladium, titanium, tungsten, titanium-tungsten, or copper, examples of films formed by CVD are tungsten or copper, and examples of films formed by electroplating (which including electroless plating) are nickel, gold, palladium or copper.

Figure 9A:
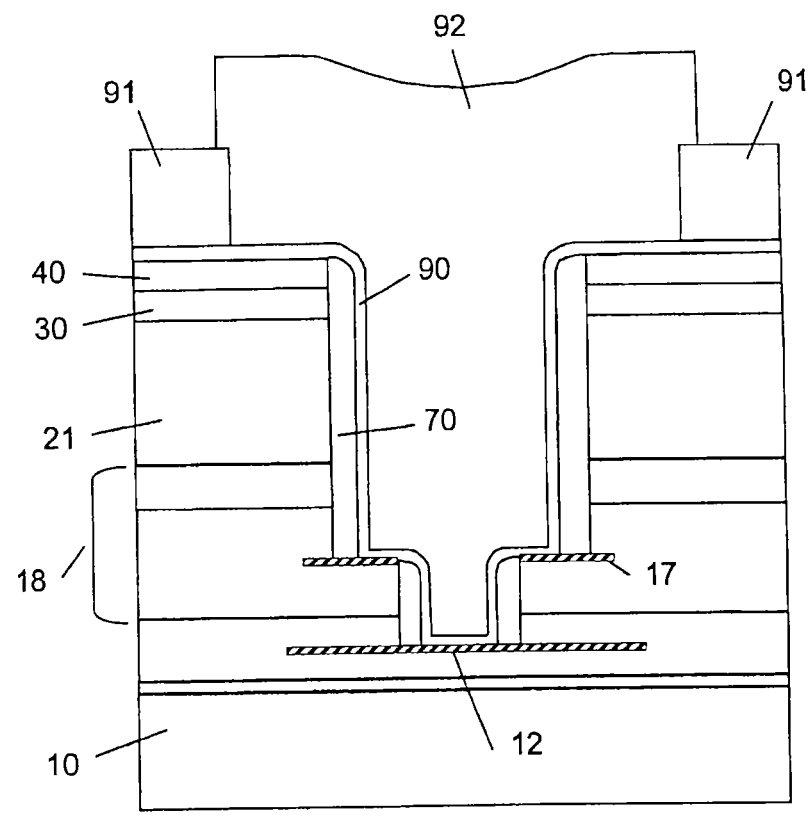
FIG. 9A is a diagram showing forming a metal contact comprising a metal seed layer and a metal fill.
Figure 9C:
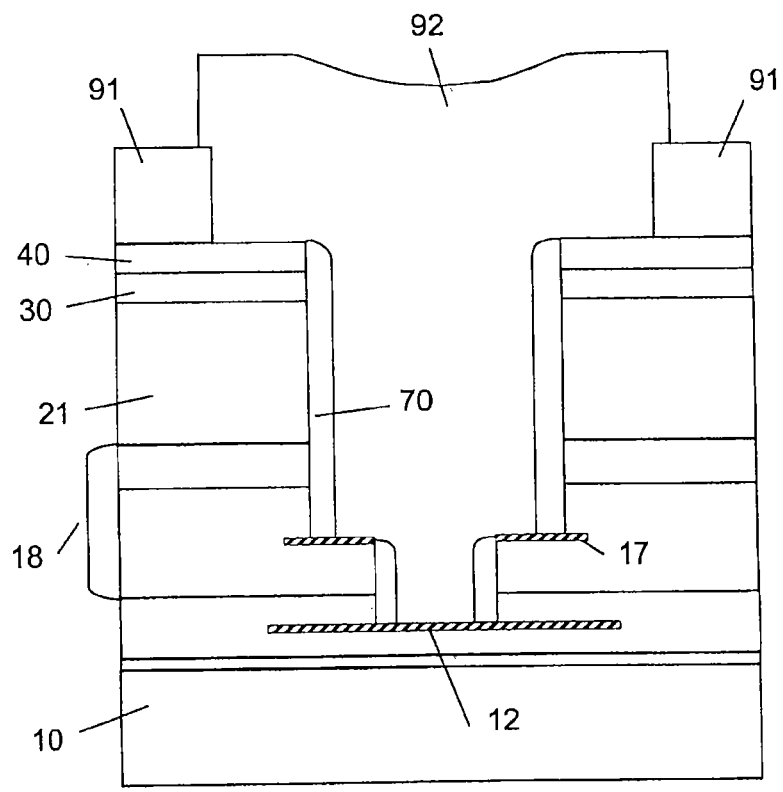
FIG. 9C is a variation of the embodiment where no seed layer is formed.
Figure 9B:
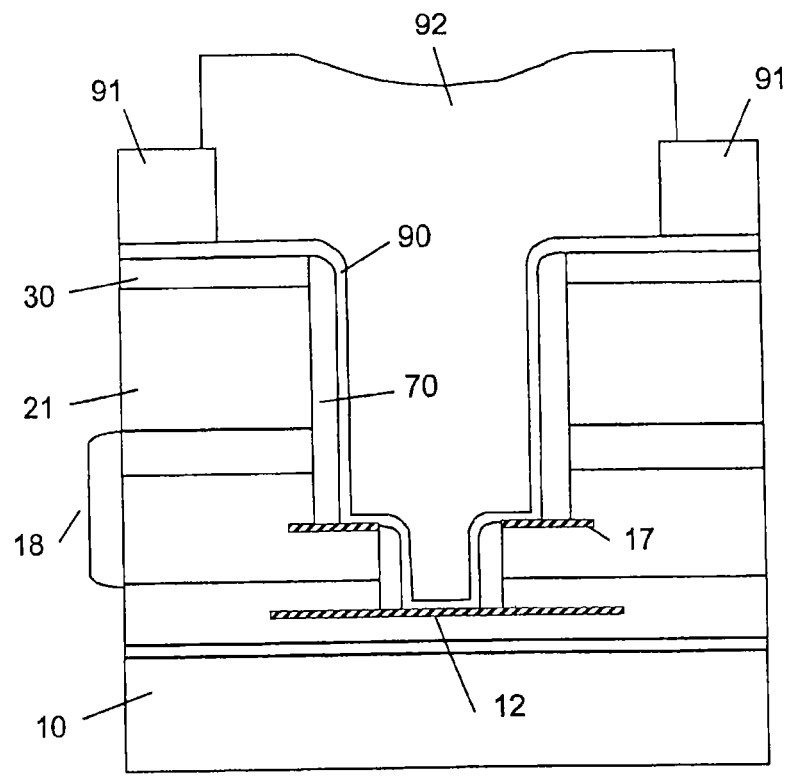
FIG. 9B is a variation of the embodiment where the hard mask is removed.
Figure 10A:
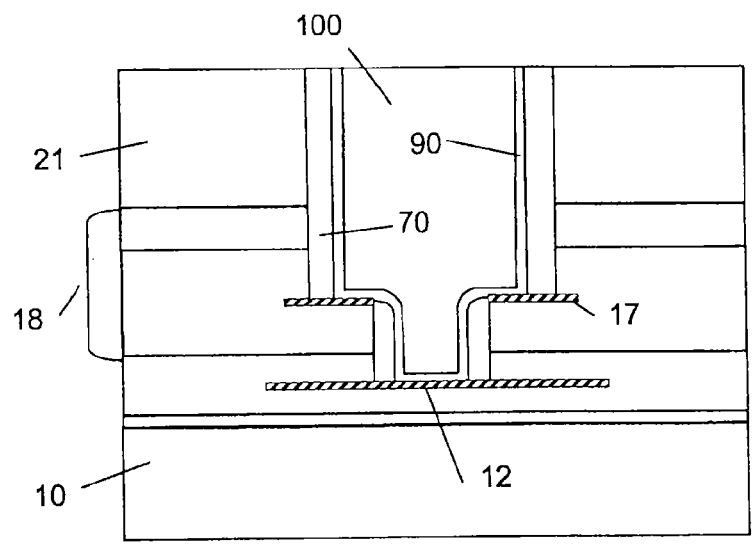
FIG. 10A is a diagram of the structure of FIG. 9A or 9B after chemo-mechanical polishing.

FIG. 9A shows an example of a masked electroplated method whereby a metal seed layer 90 is first deposited over the structure, making electrical contact to contact structures 12 and 17, followed by formation of a mask 91 using, for example, photoresist. Seed layer 90 can be deposited by PVD, CVD, or electroplating as described above. Using mask 91 and electrical contact to seed layer 90, metal contact 92 fills vias 50 and 60. In FIG. 9B, a structure is shown where mask 40 is removed before formation of conformal insulative film 70, and FIG. 9C shows the structure where no seed layer is used. A polishing step, for example chemo-mechanical polishing, can then be used to remove the excess portion of metal contact 92 outside of vias 50 and 60. This polishing step can also remove the metal seed layer 90 on the exposed side of die 14-16. It further can remove the hard mask 40 on the exposed side of die 14-16. The removal of hard mask 40 may be preferred if hard mask is electrically conductive as in the case of aluminum given above, in order to electrically isolate so formed metal filled vias from each other. This polishing step may further remove conformal dielectric film 30, resulting in a substantially planar surface and planar metal structure 100 on the exposed side of die 14-16, as shown in FIGS. 10A and 10B, where the structure in FIG. 10B is distinct from that in FIG. 10A in that no seed layer is used prior to filling the via with metal.

Figure 10B:
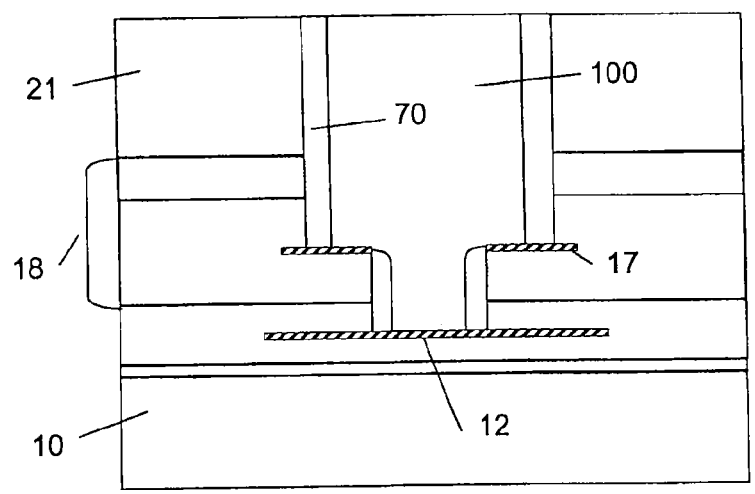
FIG. 10B is a diagram of the structure of FIG. 9C after chemo-mechanical polishing.
Figure 10C:
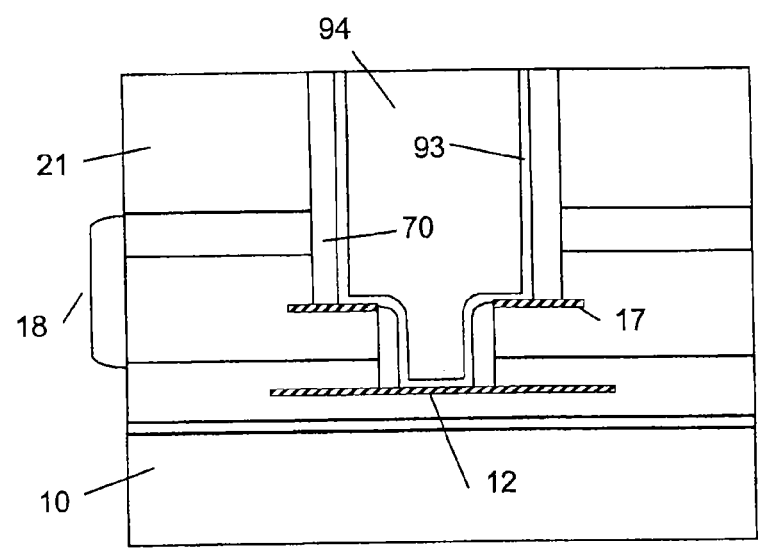
FIGS. 10C-10F are diagrams illustrating alternative methods of filling a cavity in the bonded structure.

Alternatively to filling vias 50 and 60 with metal followed by CMP, vias 50 and 60 can be lined with metal 93, filled with dielectric 94 then followed by CMP as shown in FIG. 10C. Vias 50 and 60 can be lined with metal 93 by deposition using at least one of PVD, electroplating or CVD, as described above. Thickness of metal 93 is typically 0.01 to 0.2 microns and may include a barrier layer adjacent to conformal insulative film 70 to prevent contamination of contact structures 12 or 17 or device regions 18 or 11. Examples of barrier layers include tantalum nitride, tungsten nitride, and titanium nitride and may be preceded by a titanium adhesion layer of typical thickness 0.005 to 0.02 microns. A typical thickness of barrier layers is 0.005 to 0.05 microns. After an initial thickness of 93 has been deposited, electroplating can also be used to conformally increase the thickness of 93 to a desired thickness. A typical increased thickness is 0.5 to 2.0 microns for via 50, subject to via 50 of sufficient width. An example of dielectric 94 is silicon oxide and an example of filling is with plasma enhanced chemical vapor deposition (PECVD). This alternative has the advantages of reduced metal deposition and metal CMP and the potential for a better coefficient of thermal expansion'(CTE) match between the composite metal lined, dielectric filled via and the surrounding substrate portion of die 14-16.

Figure 10D:
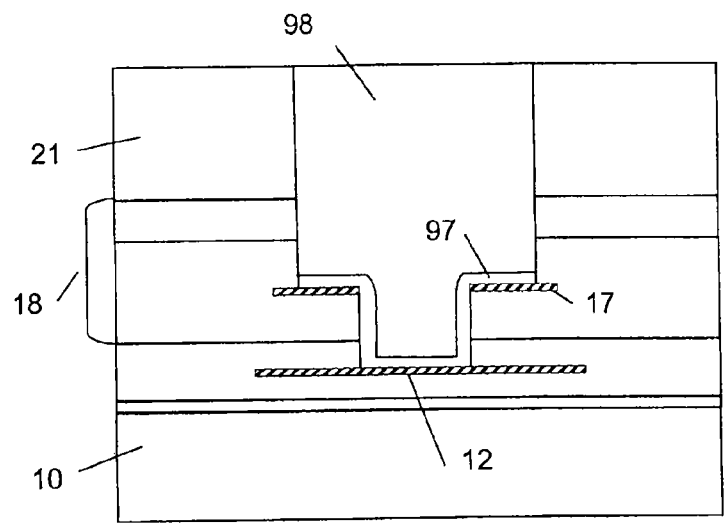

Another alternative to filling vias 50 and 60 with metal or lining vias 50 and 60 with metal 93 followed by filling with dielectric 94 is to fill or line via 60 with metal 97 to form an electrical interconnection between contact structures 12 and 17 without contacting thinned substrate 21, and then fill vias 50 and 60 with dielectric 98, followed by CMP as described above and shown in FIG. 10D. Metal 97 can be formed to interconnect contact structures 12 and 17 without contacting thinned substrate 21 by electroless plating that plates preferentially on contact structures 12 and 17 by plating to sufficient thickness that preferential plating interconnects contact structures 12 and 17. An example of electroless plating that can be plated to sufficient thickness is nickel electroless plating. This alternative has the advantage of not requiring a sidewall 60, 71, 72, 73, 74, or 75 on the via 50 portion of remaining substrate die 14-16 to electrically isolate said electrical interconnection from said remaining substrate die as shown in FIG. 10D.

Figure 10E:
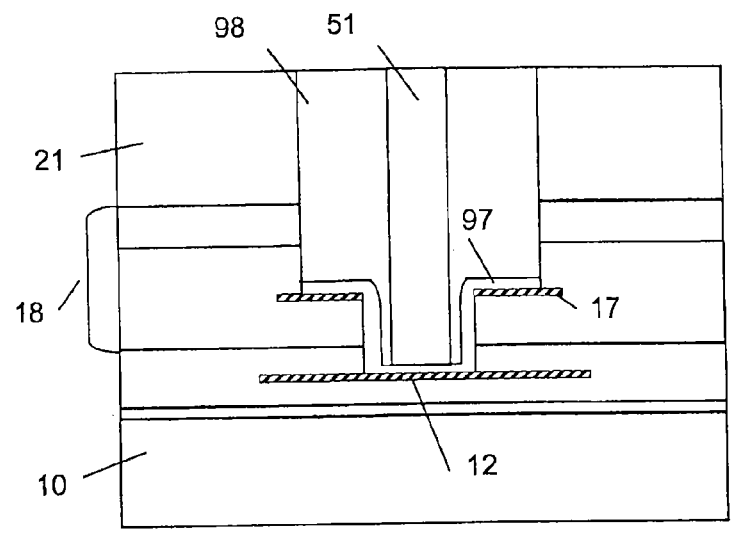
Figure 10F:
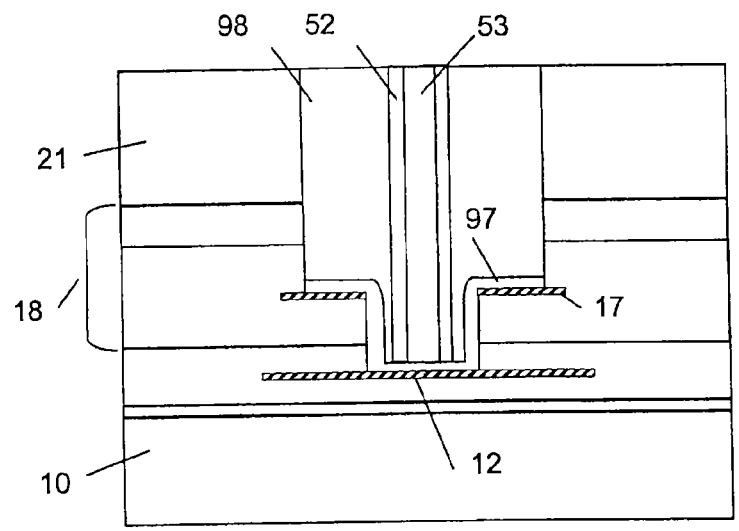

Electrical interconnection to interconnected contact structures 12 and 17 can be formed by etching a via 51 through dielectric 98 to metal 97 and filling via 51 with metal 46 as shown in 10E and similar to the description in FIG. 10B or by lining via 51 with conductive material 52 and filling with dielectric 53 as shown in FIG. 10F and similar to the description in FIG. 10C. Via 51 in FIG. 10E and FIG. 10F is shown connecting to the portion of metal 97 on contact structure 12. Alternatively, via 51 can connect the portion of metal 97 on contact 17 or both contact structures 12 and 17.

The structures of FIGS. 10A-10F are suitable for subsequent processing including but not limited to photolithography-based interconnect routing or underbump metallization to support wirebonding or flip-chip packaging. This processing typically includes the formation of an electrically insulating material on the exposed thinned substrate side 21 to provide electrical isolation for the interconnect routing or underbump metallization.

Figure 11:
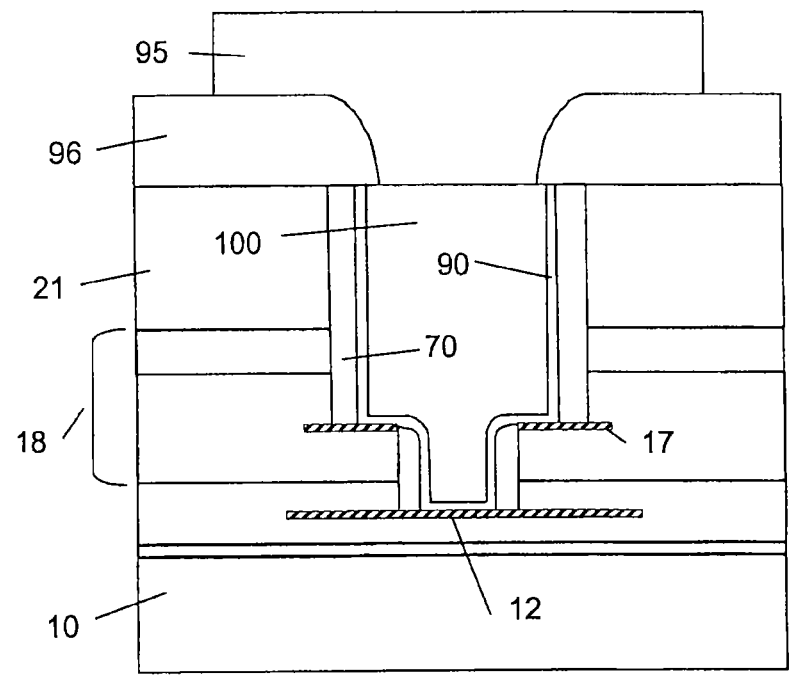
FIG. 11 is a diagram illustrating metallization of the structure of FIG. 10A.

An example is shown in FIG. 11 with insulating material 96, such as a deposited or spun-on oxide or polymer, formed on the die 14-16 after CMP, and interconnect routing or underbump metallization 95 formed on material 96 in contact with metal structure 100. Another filler material may be used between die 14-16, as shown in FIG. 3B, prior to forming material 96. Metallization may include several levels, separated by insulating layers, not shown here, to accommodate a high via density and/or a high degree of routing complexity. Alternatively, if the polishing step does not remove conformal dielectric film 70, conformal dielectric film remains and may provide adequate electrical isolation for the metallization structures.

Figure 12:
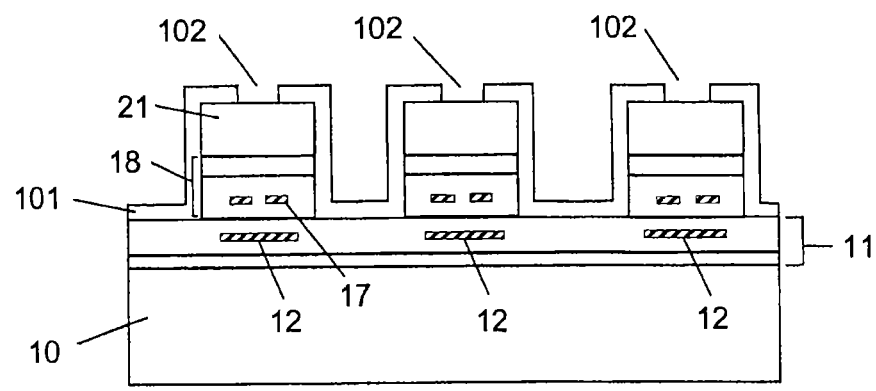
FIG. 12 is a diagram of a second embodiment using a mask layer without an intervening dielectric layer.
Figure 13:
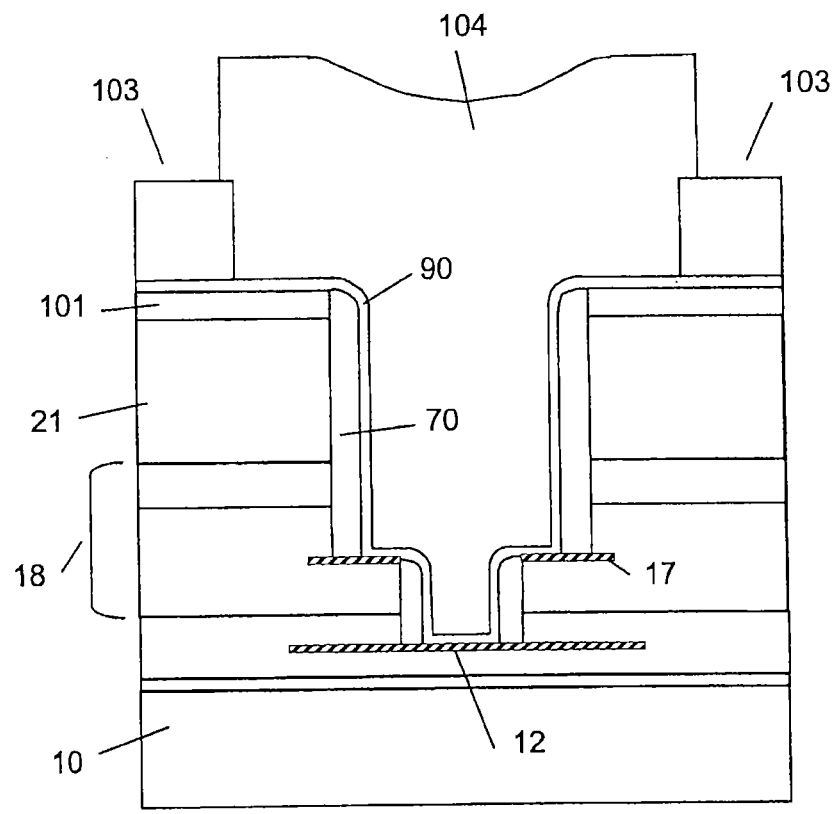
FIG. 13 is a diagram showing forming a metal contact in the second embodiment.

A second embodiment of the method according to the invention is illustrated in FIG. 12. A hard mask 101 is formed on die 14-16 without any intervening dielectric layer. A typical range of hard mask 101 thickness is 0.1 to 1.0 microns. The hard mask 101 is preferably comprised of a material that has a high etch selectivity to a subsequent etch process or processes used to etch a via through thinned substrate 21 and device regions 18 and 11 to contact structures 12. An example of a hard mask is aluminum, tungsten, platinum, nickel, or molybdenum and an example of an etch process is an $SF_6$-based reactive ion etch to etch a via through a thinned silicon substrate and a $CF_4$-based reactive ion etch to etch a subsequent via through device regions 18 and 11 to contact structures 12. Apertures 102 are formed in mask 101 and the structure is processed as in the first embodiment to etch through the die substrates and device regions to expose structures 12 and 17, while preferably exposing the top surface of structures 17 to form a ledge (such as 27 shown in FIGS. 8A and 8B). Metallization is carried out as shown in FIGS. 7-9 using mask 103 to form metal contact 104, to produce the structure shown in FIG. 13. After CMP (FIG. 14), metal 105 is planarized, and the structure is suitable for subsequent processing including but not limited to photolithography-based interconnect routing or underbump metallization to support wirebonding or flip-chip packaging, similar to the metallization structure shown in FIG. 11. This processing may include the formation of an electrically insulating material on the exposed side of die 14-16 to provide electrical isolation for said interconnect routing or underbump metallization that is routed over the exposed side of die 14-16. To further assist interconnect routing or underbump metallization, a planarizing material as described in the first embodiment, for example a dielectric or a metal, or alternatively, a polyimide or benzocyclobutene material may be formed to planarize the surface of the structure, for example by filling any spaces between die, apertures or grooves, either before or after the CMP process.

Figure 15:
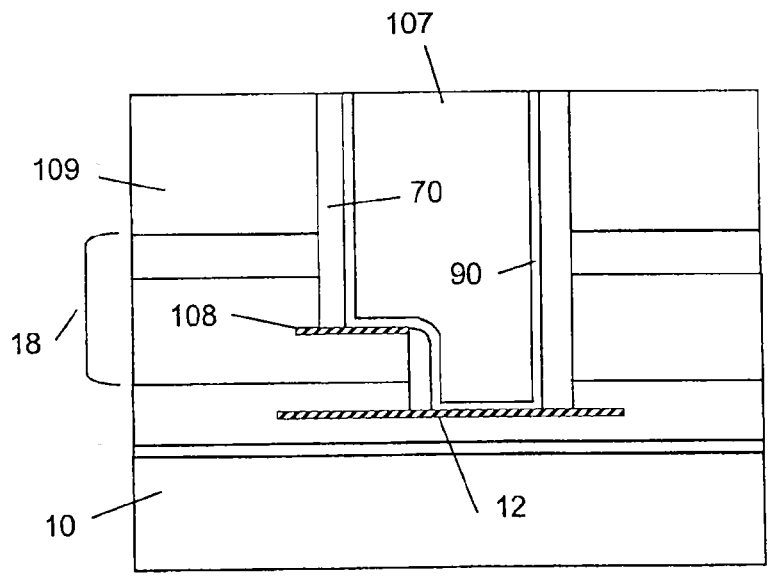
FIG. 15 is a diagram illustrating another embodiment of the invention.

The present invention may also be used with other structures. For example, a pair of contacts 17 is not required but a single contact in a die or wafer may be connected to a contact in the substrate to which it is bonded. This is illustrated in FIG. 15 where metal contact 107 to seed 90 interconnecting contact structures 12 and 108 with structure 108 being offset from structure 12. One part (left side) of metal contact 107 extends from the upper surface of substrate portion 109 directly to seed 90 on structure 108 while another part (right side) of metal contact 107 extends from the upper surface of substrate portion 109 directly to seed 90 on structure 12.

The present invention provides numerous advantages. A single mask is used to etch through the backside of a die or wafer bonded to a substrate to interconnect the die or wafer and the substrate. No photolithography is needed in the via, which typically can be complicated, problematic, and limit scaling. The etching proceeds through a bonding interface. Further, it is possible to expose top surfaces of the contacts to be interconnected, increasing the surface area of the contact and reducing the resistance of the contact. Different technology devices can be interconnected, optimizing device performance and avoiding the problems associated with trying to manufacture different technologies with a single process sequence.

Figure 16A:
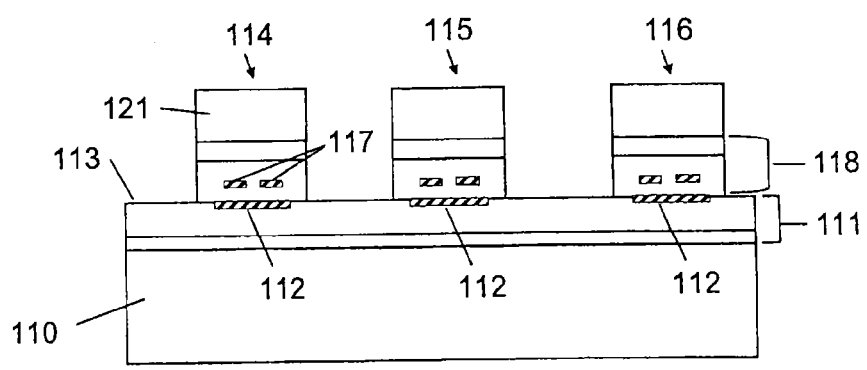
FIG. 16A is a diagram illustrating an embodiment where a contact structure is located in the surface of one of the devices.
Figure 16B:
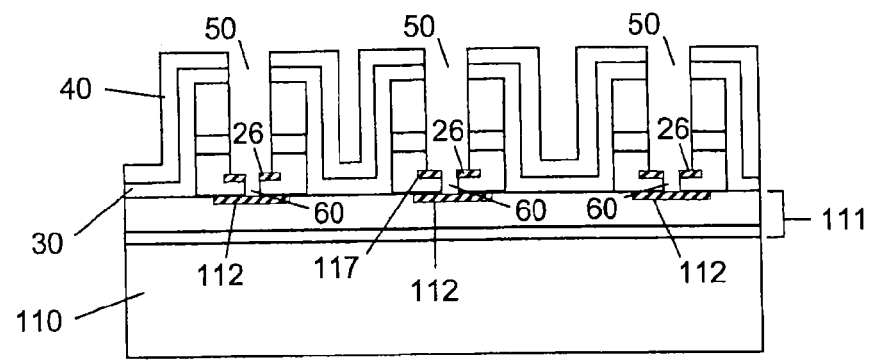
FIG. 16B is a diagram of the structure of FIG. 16A after further processing.
Figure 17:
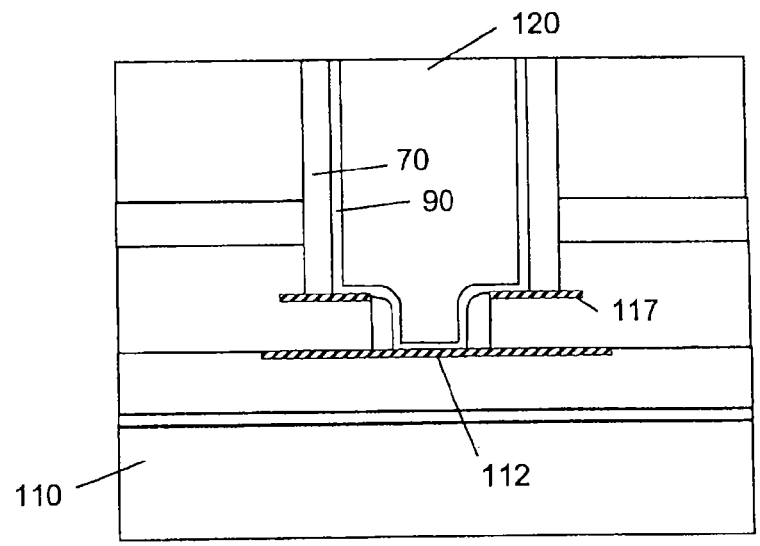
FIG. 17 is a diagram showing a device produced using the method according to the invention with the structure shown in FIGS. 16A and 16B.

A third embodiment is shown in FIGS. 16A, 16B and 17. Substrate 110 has device region 111 with contact structures 112. Die 114-116 each having a device region 118, substrate portion 121 and contact structures 117 are bonded to substrate 110 on surface 113 as shown in FIG. 16A. In this embodiment there is no material covering contact structures 112. Following the single masking process described for the first or second embodiments, the structures shown in FIGS. 16B and 17 is produced. A via 50 is etched through substrate portion 121 and device region 118, exposing a ledge 26 on the back surface of contact structures 117. The etching is continued forming a via 60 and exposing a top surface of contact structure 112. Contact 120 is formed in the via, with or without a seed layer 90, connecting contact structures 112 and 117. Filler material may be used to planarize the device, as discussed above with respect to FIG. 3B. Contact 120 may also be formed in the manner shown above in FIGS. 10C-10F. Also, film 70 may be formed as shown in FIGS. 8C-8K.

Figure 18:
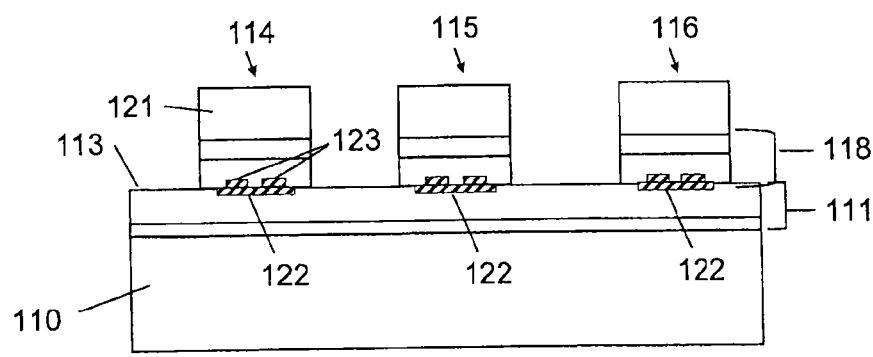
FIG. 18 is a diagram of another embodiment of the invention.

A fourth embodiment is shown in FIGS. 18-19. In this embodiment there is no material covering contact structures 122 or 123. Contact structures 123 comprised of conductive material, for example metal, in die 114-116 may extend above the surfaces of die 114-116 and contact structures 122 comprised of conductive material, for example metal, may extend above surface 113. Contact structures 123 and contact structures 122 may be composed of different metals. For example, contact structures 123 may be comprised of one copper, tungsten, nickel, or gold, and contact structures 122 may be comprised of a different one of copper, tungsten, nickel, or gold. Contact structures 123 or contact structures 122 may further be comprised of different metals, for example, a combination of nickel, palladium, and gold. Contact structures 123 and contact structures 122 may further be comprised of alloys of copper, tungsten, nickel, or gold or other alloys, for example indium-tin-oxide. These metals may be formed by a variety of techniques including PVD, thermal, e-beam, and electroplating.

The portion of surfaces of die 114-116 excluding contact structures 123 and the portion of surface 113 excluding contact structures 122 are preferably a non-conductive material, for example silicon oxide, silicon nitride, silicon oxynitride, or an alternate isolating material compatible with semiconductor integrated circuit manufacturing. Die 114-116 with exposed contact structures 123 are bonded to surface 113 with exposed contact structures 122, as described in application Ser. No. 10/359,608, with an alignment accuracy sufficient to align a portion of exposed contact structures 123 in the surface of die 114-116 with a portion of exposed contact structures 122 in surface 113 and align the non-conductive material portion of the surface of die 114-116 with a the non-conductive material portion of surface 113. The bond between the non-conductive material portion of surface of die 114-116 and the non-conductive material portion of surface 113 is preferably a direct bond as described in application Ser. No. 10/359,608. An alternate type of direct bond, for example as described in application Ser. No. 10/440,099 may also be used. The bond energy, preferably in excess of 1 $J/m^2$, of the direct bond generates an internal pressure of contact structures 122 against contact structures 123 that results in an electrical connection between contact structures 122 and 123. It is thus preferred to use a direct bond that results in a higher bond energy at low temperature, for example those described above, in order to generate the highest internal pressure; however, a direct bond that results in a lower bond energy at low temperature, or requires a higher temperature to obtain a higher bond energy may also be acceptable for some applications. For example, a conventional direct bond that requires moderate temperature, for example less than 400EC, or moderate pressure, for example less than 10 $kg/cm^2$, to achieve a high bond energy, for example greater than 1 $J/m^2$ may also be used.

Alternatively, contact structures 123 in die 114-116 may be nominally planar with the surfaces of die 114-116 and contact structures 122 may be nominally planar with surface 113. Contact structures 122 and 123 may have a greater surface roughness than the non-metal surface portion of die 114-116 and non-metal portion of surface 113. For example, the surfaces of die 114-116 and surface 113 preferably have a Root-Mean-Squared (RMS) surface roughness less than 1 nm and further preferably less than 0.5 nm, while the surfaces of contact structures 122 and 123 preferably have a RMS surface roughness less than 2 nm and further preferably less than 1 nm.

The internal pressure of contact structures 122 against contact structures 123 resulting from the bond between the non-contact structures 123 portion of the surface of die 114-116 and the non-contact structures 122 portion of surface 113 may not be adequate to achieve a bond or result in an electrical connection with a preferably low resistance due to, for example, a native oxide or other contamination, for example, hydrocarbons, on the exposed metal surface of die 114-116 or surface 113. An improved bond or preferably lower resistance electrical connection between contact structures 123 and 122 may be achieved by removing the native oxide on contact structures 123 or 122. For example, dilute hydrofluoric acid may be used before contacting surface 113 with the die surfaces 114-116. Furthermore, surface 113 and the surfaces of die 114-116 may be exposed to an inert ambient, for example nitrogen or argon, after removing the native oxide until contacting surface 113 with die surfaces 114-116. Alternatively, an improved bond or preferably lower resistance electrical connection between contact structures 123 and 122 may be achieved after bonding non-contact structures 123 portion of the surface of die 114-116 and the non-contact structures 122 portion of surface 113 by increasing the temperature of, e.g. heating, contact structures 122 and 123. Temperature increase can result in a preferably low resistance electrical connection by reduction of the native oxide or other contamination or by increasing the internal pressure between contact structures 123 and 122, for example if contact structures 123 or 122 have a higher thermal expansion coefficient relative to the non-metal material surrounding contact structures 123 and 122, or by both reduction of native oxide or other contamination and increase in internal pressure. The temperature increase may also increase interdiffusion between contact structures, such as 122 and 123 to result in a preferable low-resistance electrical connection. The temperature increase may thus enhance the metal bonding, metal contact, metal interconnect or conduction between contact structures 123 and 122. Contact resistances less than 1 ohm/:m$^2$ have been achieved. For example, for two contact structures of about a 5 and 10:m in diameter and each about 1:m thick, resistances less than 50 mohms have been obtained.

If there are ICs, for example silicon ICs, in die 114-116 or in layer 111 below surface 113, the temperature increase is preferably less than 400EC for 2 hours and further preferably less than 350EC for 2 hours to avoid damage to the ICs, contact structures or other metal structures. The temperature increase resulting in enhanced metal bonding, metal contact, metal interconnect or conduction between contact structures 122 and 123 may be very low, for example as low as 50EC for 10 minutes, if contact structures are comprised of a conductive material with susceptibility to thermal expansion or internal pressure or negligible native oxide, for example, gold.

The use of contact structures 123 and 122 that result in a greater increase in internal pressure at lower post-bond temperature and furthermore, are deformable at a lower pressure are preferred to minimize the post-bond temperature increase required to achieve the desired enhancement in metal bonding, metal contact, metal interconnect or conduction between contact structures 123 and 122, if required. For example, the internal pressure generated as a result of post-bond temperature increase is dependent on the metal comprising contact structures 123 and 122. For example, metals with high values of Coefficient of Thermal Expansion (CTE), for example, copper, nickel, and gold, result in more expansion at a given temperature. Furthermore, metals with a higher shear modulus, for example tungsten and nickel, will generate more stress for a given expansion. Metals with a high product of CTE and shear modulus, for example copper, tungsten, and nickel, will thus be the most effective at generating an increase in internal pressure with increased temperature. Furthermore, metals with a low yield stress, for example copper, nickel, and gold, preferably at very high purity, for example over 99.9%, are more readily deformed at lower stress and can thus result in improved metal bonding, metal contact, metal interconnect, and conductance between contact structures at lower stress: Contact structures 123 and 122 comprised of metals with a high product of CTE and shear modulus, or high product of CTE and shear modulus normalized by yield stress, for example copper, nickel, and gold, are thus preferred for contact structures 123 and 122 that exhibit improved metal bonding, metal contact, metal interconnect, and conductance between contact structures as a result of internal pressure generation with post-bond temperature increase.

Alternatively, contact structures 123 may be slightly below the surfaces of die 114-116 or contact structure 122 may be slightly below surface 113. The distance below surfaces of die 114-116 and surface 113 is preferably less than 20 nm and further preferably less than 10 nm. Subsequent bonding followed by temperature increase may increase the internal pressure between contact structures 122 and 123 as described above and result in improved metal bonding, metal contact, metal interconnect, or conductance between contact structures 122 and 123. The slight distance of contact structures 122 below surface 113 and the slight distance of contact structures 123 below the surfaces of die 114-116 is an average distance over the extent of the contact structures. The topography of the contact structures will include locations equal, above, and below the average distance. The total height variation of the contact structures, given by the difference between the maximum and minimum height, may be substantially greater than the RMS variation. For example, a contact structure with a RMS of 1 nm may have a total height variation of 10 nm. Accordingly, although contact structures 123 may be slightly below the surfaces of die 114-116 and contact structures 122 may be slightly below the surface 113 as described above, a portion of contact structures 122 may extend above the surfaces of die 114-116 and a portion of contact structures 123 may extend above the surface 113, resulting in a mechanical connection between contact structures 122 and contact structures 123 after bonding of the non-metal portion of surface 113 to non-metal portion of die 114-116. This mechanical connection may not result in an adequate electrical connection between contact structures 122 and contact structures 123 due to an incomplete mechanical connection or native oxide or other contamination on contact structures 122 or contact structures 123. Subsequent temperature increase may improve the metal bonding, metal contact, metal interconnect, conductance between contact structures 122 and 123 as described above.

Alternatively, the temperature increase may result in mechanical contact and/or desired electrical interconnection between contact structures 123 and 122 if the highest portion of contact structures 123 is below the surface of die 114-116 or the highest portion of contact structures 122 is below surface 113 and there is not a mechanical contact between contact structures 123 and 122 after bonding.

Alternatively, contact structures 123 may be below the surface of die 114-116 and contact structures 122 may above surface 113, or contact structures 123 may be above the surface of die 114-116 and contact structures 122 may be below surface 113. The difference between the distances of contact structure 122 below surface 113 and contact structures 123 below the surface of die 114, 115, or 116 (or vice versa) can be slightly positive as described in application Ser. No. 10/359,608. Alternatively, the difference between the distances of contact structure 122 below surface 113 and contact structures 123 below the surface of die 114, 115, or 116 (or vice versa) can be nominally zero or slightly negative and a post-bond temperature increase may improve the metal bonding, metal contact, metal interconnect, conductance between contact structures 122 and 123 as described above.

The height of contact structures 123 relative to the surface of die 114-116 and the height of contact structures 122 relative to the height of surface 113 can be controlled with a polishing process that forms the surfaces of die 114-116 or surface 113, for example chemo-mechanical polishing (CMP). The CMP process typically had a number of process variables including but not limited to type of polishing slurry, rate of slurry addition, polishing pad, polishing pad rotation rate, and polish pressure. The CMP process is further dependent on the specific non-metal and metal materials comprising surface 113 and the surface of die 114-116, relative polishing rates of non-metal and metal materials (similar polishing rates are preferred, for example nickel and silicon oxide), size, pitch and grain structure of the contact structures 122 and 123, and non-planarity of surface 113 or surface of die 114-116. Optimization of these process parameters can be used to control the height of contact structures 123 relative to the surface of die 114-116 and the height of contact structures 122 relative to the height of surface 113. Alternate polishing techniques, for example slurry-less polishing, may also be used.

The height of contact structures 123 relative to the surface if die 114-116 and the height of contact structures 122 relative to the height of surface 113 may also be controlled with a slight dry etch of the material around contact structures 123 on the surface of die 114-116 or the material around contact structures 122 on surface 113, for example a plasma or reactive ion etch using mixture of $CF_4$ and $O_2$, for the surfaces comprised of certain dielectric materials, for example silicon oxide, silicon nitride, or silicon oxynitride, preferably such that an increase in surface roughness, that would significantly decrease the bond energy between said surfaces, results. Alternatively, the height of contact structures 123 and contact structures 122 may be controlled by the formation of a very thin metal layer on contact structures 123 and 122. For example, electroless plating of some metals, for example gold, can be self-limiting to a very thin layer, for example approximately 5-50 nm. This method may have the additional advantage of terminating an oxidizing metal with very thin non-oxidizing metal, for example gold on nickel, to facilitate the formation of electrical connections.

Furthermore, contact structures 122 can have a lateral dimension larger or smaller than the lateral dimension of contact structures 123 such that after bonding, the perimeter of a contact structure 123 is contained within contact structure 122 or the perimeter of a contact structure 122 is contained within the perimeter of contact structure 123. The minimum lateral dimension larger or smaller is typically determined by at least twice the alignment accuracy of bonding die 114-116 to surface 113. For example, if the alignment accuracy in bonding die 114-116 to surface is one micron, contact structures 122 are preferably at least two microns larger than contact structures 123 in order for the perimeter of contact structures 123 to be contained within the perimeter of contact structures 122.

The maximum internal pressure of contact structures 122 against contact structures 123 that can be generated from the bond between the portion of the surface of die 114-116 around contact structures 123 and portion of surface 113 around contact structures 122 or accommodated by post-bond temperature increase depends on the bond area of this portion of the surface of die 114-116 to this portion of surface 113 and the area of contact structures 123 against the area of contact structures 122. The sum of these two areas is typically less than the entire area of die 114-116 against surface 113 due to a residual area of contact structures 123 aligned with a non-contact structures 122 portion of surface 113 and a residual area of contact structures 122 aligned with a non-contact structures 123 portion of the surface of die 114-116 that results from a difference in lateral dimension between contact structures 123 and 122 and a bond misalignment between the surfaces of die 114-116 and surface 113. The maximum internal pressure that can be generated by bonding or accommodated by post-bond temperature increase can be approximated by the fracture strength of the bond between the portion of the surface of die 114-116 and the portion of surface 113 times the ratio of the area of this bond to the area of contact structures 123 against the area of contact structures 122. For example, if the portion of the surfaces of die 114-116 and the portion of surface 113 is comprised of silicon oxide with a fracture strength of 16,000 psi and the direct bond between the aligned portion of these portions has a fracture strength about one half that of silicon oxide, or 8,000 psi, and the contact structures 123 and 122 are circular with a diameter of 4 microns on a pitch of 10 microns, and perfectly aligned, a maximum internal pressure between contact structures 123 and 122 in excess of 60,000 psi is possible. This pressure is typically significantly greater than that generated by a post-bond temperature increase. For example, if contact structures 123 and 122 are comprised of copper with a CTE of 17 ppm and a shear modulus of 6,400,000 psi and the portion of the surface of die 114-116 and the portion of surface 113 is comprised of silicon oxide with a CTE of 0.5, and contact structures 123 are planar with the portion of die 114-116 and contact structures 122 are planar with the portion of surface 113, a stress of approximately 37,000 psi between contact structures 123 and 122 is expected at a post-bond temperature increase of 350EC.

Contact structures 123 and 122 are typically not perfectly aligned and of the same lateral dimension. This may result in a portion of contact structures 123 in contact with a portion of surface 113 around contact structures 122 or a portion of contact structures 122 in contact with a portion of the surface of die 114-116 around structure 123. If a portion of contact structures 123 is in contact with this portion of surface 113 and further, if contact structures 122 are below surface 113 or, alternatively, if a portion of contact structures 122 is in contact with this portion of the surface of die 114-116 and further, if contact structures 123 are below the surface of die 114-116, then post-bond temperature increase can result in an increase of internal pressure preferentially between contact structures 122 and this portion of the surface of die 114-116 or contact structures 123 and this portion of surface 113, and result in a decrease in internal pressure at a given post-bond temperature increase between contact structures 123 and 122 that would otherwise be obtained. To avoid this decrease in internal pressure increase between contact structures 123 and 122, it is preferred that if contact structures 123 are below the surface of die 114-116, the perimeter of contact structures 122 is within the perimeter of contact structures 123 after bonding by an amount to accommodate misalignment and mismatch in size and shape of contact structures 123 and contact structures 122 (such as twice the alignment tolerance) so that internal pressure increase will be primarily between contact structures 123 and contact structures 122. Alternatively, it is preferred that if contact structures 122 are below surface 113, the perimeter of contact structures 123 is within the perimeter of contact structures 122 after bonding by an amount to accommodate misalignment and mismatch in size and shape of contact structures 123 and contact structures 122 so that internal pressure increase will be primarily between contact structures 123 and contact structures 122.

Further alternatively, if contact structures 123 are below the surfaces of die 114-116 and contact structures 122 are below surface 113, the contact structures least below the surface, normalized by the contact structures CTE, has a perimeter within the perimeter of the opposing contact structure after bonding by an amount to accommodate misalignment and mismatch in size and shape of contact structures 123 and contact structures 122 so that internal pressure increase will be primarily between contact structures 123 and contact structures 122.

The temperature of contact structures 123 and contact structures 122 can be increased before or after thinning the substrates of die 114-116 to form thinned die substrates 121. The temperature of contact structures 123 and contact structures 122 can be increased after bonding with a variety of types of heating including but not limited to thermal, infrared, and inductive. Examples of thermal heating include oven, belt furnace, and hot plate. An example of infrared heating is rapid thermal annealing. The infrared heating source can be filtered to preferentially heat contact structures 123 and 122 with photons of a preferred energy. For example, if substrate 110, die 114-116 substrate, thinned die substrate 121, device region 111, or device region 118 are comprised of a semiconductor, for example silicon, the infrared heat source can be filtered to prevent photons with energy in excess of the semiconductor bandgap from being absorbed by the semiconductor, resulting in a reduced temperature increase of the semiconductor compared to the temperature increase of contact structures 123 or contact structures 122. An example of inductive heating is inductive magnetic resonance when contact structures 123 or contact structures 122 are magnetic, for example comprised of nickel.

A plurality of contact structures 123 may contact a single contact structure 122 without covering the entirety of a single contact structure 122 as shown in FIG. 18. Alternatively, a single contact structure 123 may contact a single contact structure 122, either partially or in its entirety, a single contact structure 122 may contact a single contact structure 123, either partially or in its entirety, or a single contact structure 123 may contact a plurality of contact structures 122.

Figure 19A:
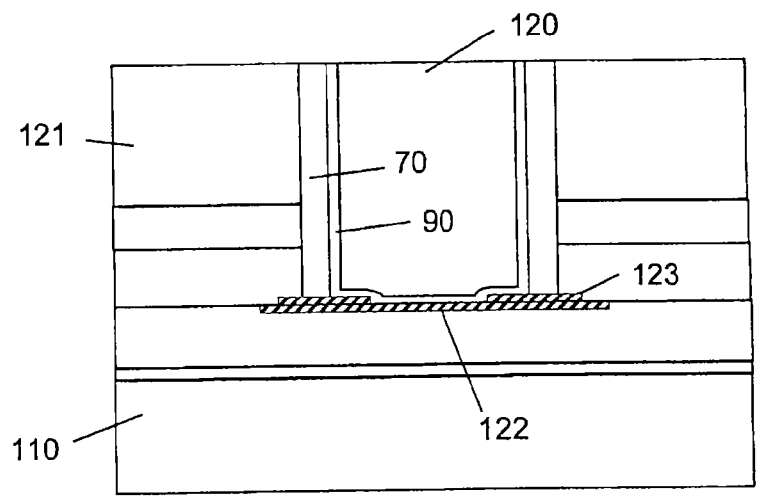
FIG. 19A is a diagram showing a device produced using the method according to the invention with the structure shown in FIG. 18.
Figure 19B:
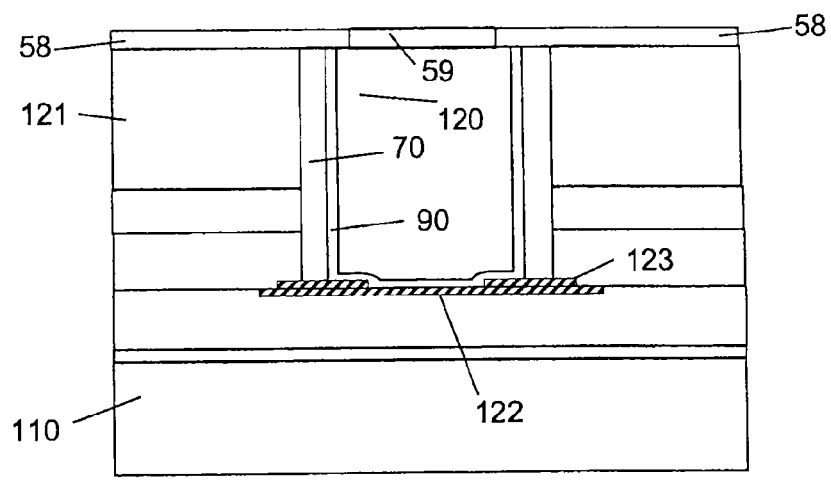
FIG. 19B illustrates the structure having a planarized material and contact formed over the structure of FIG. 19A.
Figure 19C:
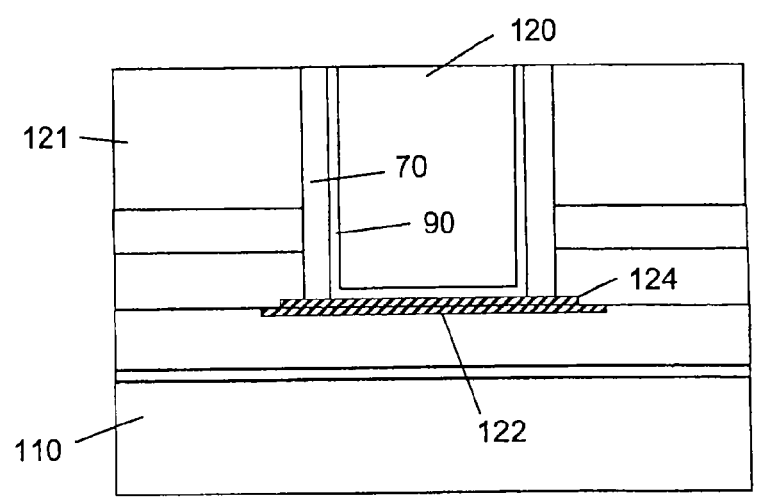
FIG. 19C illustrates directly bonded contacts similar to the structure of FIG. 19A but without an aperture.

Following the single masking process described for the preceding embodiments, the structure shown in FIG. 19A may be produced when a plurality of contact structures 123 contacts a single contact structure 122 without covering the entirety of a single contact structure 122, where metal seed layer 90 forms an electrical interconnection to both contact structures 122 and 123. Alternatively, metal seed layer 90 may only contact structures 123, particularly if contact structures 123 cover the entirety of contact structures 122. The structure shown in FIG. 19A may be further processed to form a surface similar to surface 113 in FIG. 18 as described earlier in this embodiment and shown in FIG. 19B where contact structure 59 is similar to contact structure 122 and planarized material 58 is similar to the non-contact 122 portion of surface 113. Additional die with exposed contact structures 123 may then be bonded and interconnected to the surface with exposed contact 59 similar to the bonding of die 114-116 with exposed contact structures 123 to exposed contact structure 122. FIG. 19C illustrates a filled via with contact 124 without an aperture or gap.

In this fourth embodiment, a via etch followed by metal interconnection is not needed to make an electrical interconnection between contact structures 123 and 122. However, a via etch followed by metal interconnection as shown in FIG. 19A may be desired to provide for electrical access from the exposed side of die 114-116. An example of an application where this may be desired is in the flip-chip bump bonding of the exposed side of die 114-116 to a package, board, or integrated circuit to make electrical connection between contact structures 123 or 122 and this package, board, or integrated circuit. There are also applications where a via is not required for this purpose, for example in the fabrication of certain types of Staring Focal Plane Arrays. For these applications, the method and devices fabricated thereby as shown in FIG. 18 including, but not limited to, the derivations described above may suffice.

Figure 20A:
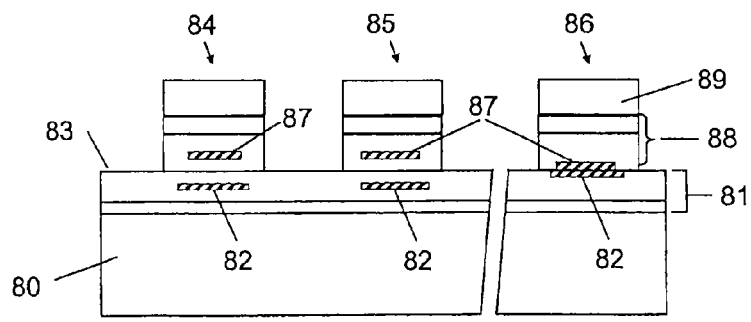
FIGS. 20A-20H illustrate a fifth embodiment with sidewall films.
Figure 20B:
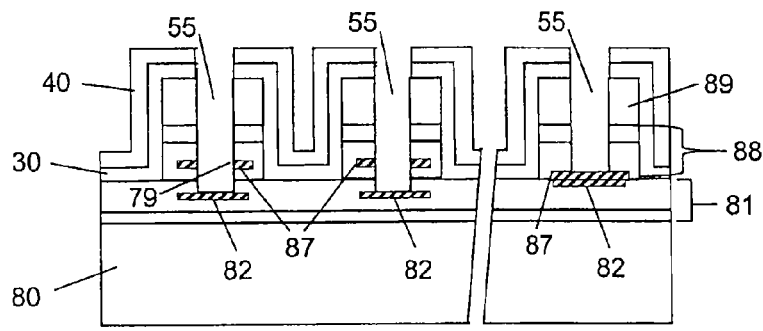

A fifth embodiment is shown in FIGS. 20A-20H. This embodiment is similar to the previous embodiments before the formation of via 50 with the exception that contact structures in die 17, 108, 117, or 123 with an aperture or edge that overlaps via 50 is replaced with contact structure 87 without an aperture or overlapping edge. In this embodiment, contact structures 87 in die 84-86 with substrate portion 89, device region 88 are bonded to surface 83 with device region 81, substrate 80, and contact structures 82. Contact structure 87 is positioned over contact structure 82 as shown in FIG. 20A. Die 84-86 can also be bonded to a surface 113 with exposed contact structures 112 similar to that shown in FIGS. 16 and 17 or contact structures 122 similar to that shown in FIGS. 18 and 19. Note that the contact structure 87 may be bonded in direct contact with contact structure 82, which is illustrated in device 86. Dies 84-86 may also have the same contact structure configuration. FIGS. 20A and 20B are drawn to show two contact structure configurations, with a cutout between the two configurations for brevity. Typically each of the die bonded to a substrate will have the same contact structure configuration. If die with different contact structures are bonded to the same substrate, certain process variations may be required such as adjusting etch parameters or etching vias separately. The figures are drawn to illustrate the invention where either the same or different structures are present on a substrate, and do not necessarily show such variations.

Patterned hard mask 40 and aperture 41 are formed as described in the first embodiment and shown in FIG. 20B. Via 55 is then formed by sequentially anisotropically etching remaining substrate portions 89 in die 84-86, portion of device region 88 in die 84-86 to contact structure 87, contact structure 87 creating side surface 79, remainder of device region 88 to surface 83 (if needed), and device region 81 (if needed) to contact structure 12. With the exception of etching contact structure 87, these anisotropic etches may be done as described in the first embodiment. Regarding the anisotropic etching of contact structure 87, an RIE etch that etches conductive structure 87 selective to hard mask 40 may be used. If hard mask 40 and conductive structure 87 have similar etch rates, hard mask 40 may be formed substantially thicker than contact structure 87 to cause exposed contact structure 87, along with substrate portion 89, device region 88, contact structure 87, and device region 81 to contact structure 82 (as needed), to be etched without entirely etching hard mask 40. The etch for contact structure 87 may be substantially different than the etch for the remaining substrate portion 89 and device region 88 in die 84-86 and device region 81. For example, if the remaining substrate portion 89 is comprised of silicon, and the etched portions of device regions 88 and 81 are comprised of silicon oxide, and contact structure 87 is comprised of Al, a non-chlorine-based RIE etch can be used to etch the remaining substrate portion 89 and device regions 88 and 81, and a chlorine-based RIE etch can be used to etch contact structure 87.

Figure 20C:
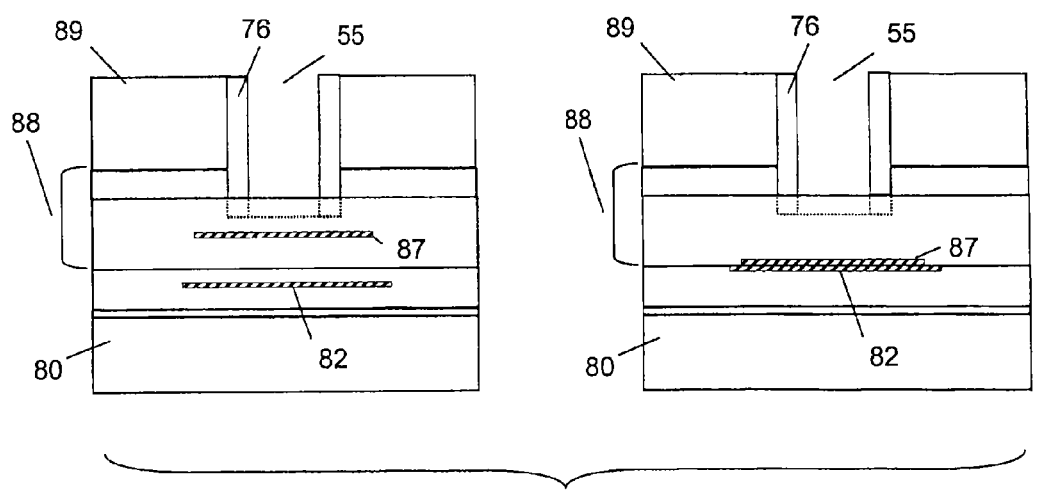

The sidewall 76 is preferably formed before the etching of contact structure 87. Specifically, the structure is anisotropically etched through substrate portion 89 and can stop after reaching device region 88, or continue into device region 88 while stopping short of contact structure 87. Layer 76 is then formed, as shown in FIG. 20C for these two cases, for separated contact structures and directly bonded contact structures. Layer 76 may be formed by depositing an insulating layer such as a silicon oxide in via 55 followed by removal of the layer from the bottom of via 55 by, for example, anisotropic etching. The remainder of device region 88 and contact structure 87 are etched through to expose contact structure 82, as shown in FIG. 20D (left side) and the remainder of device region 88 is etched through to expose contact 87 in FIG. 20D (right side).

The subsequent steps of sidewall formation, electrical interconnection between contact structures 82 and 87, and via lining and/or filling follows as described in the previously described embodiments with the primary exception that the electrical interconnection to contact structure 87 is limited to a side surface 79 exposed by anisotropically etching through contact structure 87. A second exception is sidewall formation similar to that shown by sidewall 70 in FIG. 8A or 8B, or sidewall 74 shown in FIG. 8J where the sidewall extends below contact structure 17 and would inhibit an electrical interconnection to side surface 79 of contact structure 87. FIG. 20D (left side) illustrates one of the die 84-86 in detail to more clearly illustrate an example of a sidewall 76 not inhibiting an electrical interconnection to side surface 79.

Figure 20D:
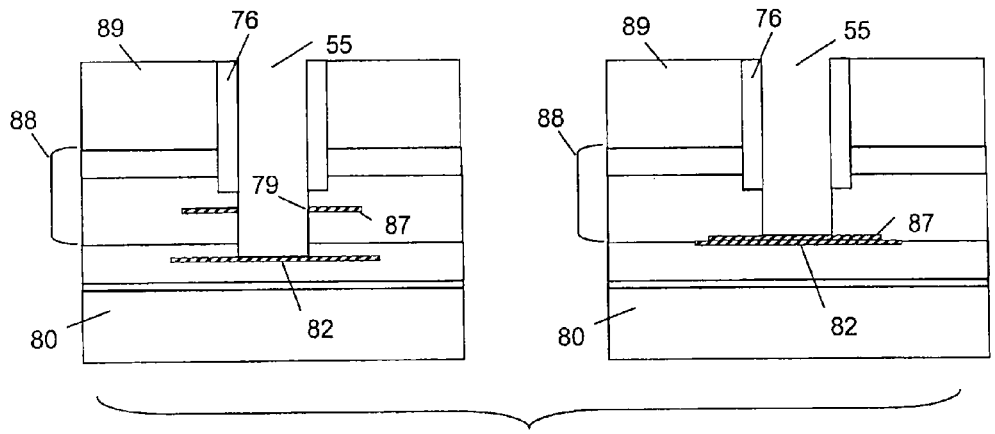
Figure 20E:
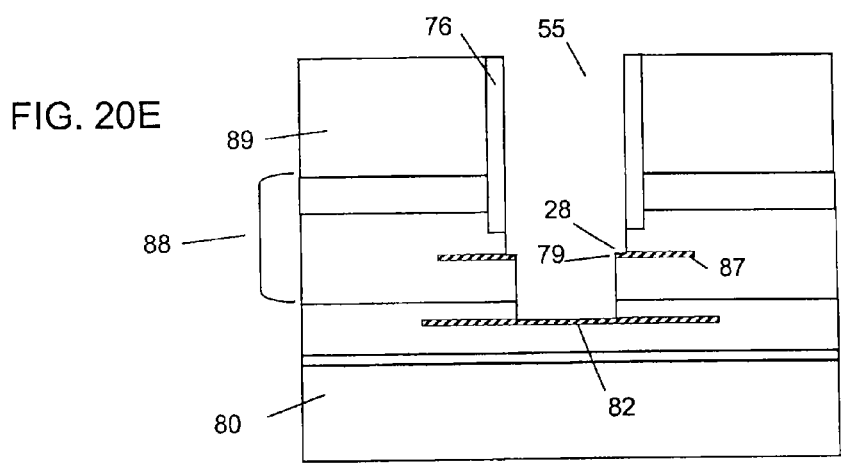
Figure 20F:
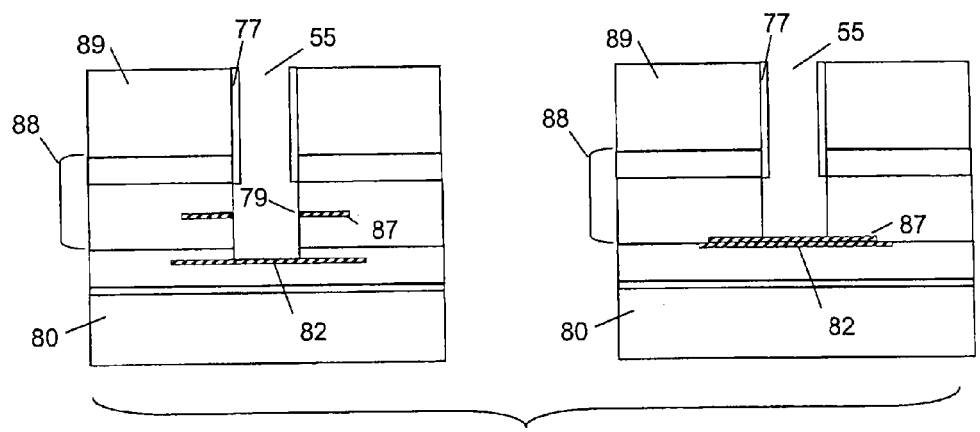

The example of sidewall formation in FIG. 20D is similar to that previously given in FIG. 8H where the sidewall 72 extends below thinned die substrate 21, but above contact structures 17. The etching of via 55 through contact structure 87, or through the region between contact structure 87 and contact structure 82 can also be slightly isotropic above contact structure 87 to form a very small self-aligned ledge 28 on the topside of contact structure 87 to reduce the interconnect resistance of the subsequently formed electrical interconnect between contact structures 82 and 87 without substantially increasing the cross-section of via 55, as shown in FIG. 20E. A selective sidewall 77 similar to the sidewall 75 formed as shown in FIG. 8K can also be formed before etching of contact structure 87 (FIG. 20F, left or right side) or after etching of contact structure 87 (FIG. 20F, left side). The formation of a selective sidewall 77 after etching of contact structure 87 overhangs exposed side surface 79 and can complicate formation of an electrical interconnection between exposed side surface 79 and contact structure 82. This complication can be avoided by the formation of electrical interconnection 99 between exposed side surface 79 and contact structure 87 in a manner similar to the formation of electrical interconnection 97 electrically interconnecting contact structures 12 and 17 but not contacting thinned substrate 21 shown in FIG. 10D. Interconnect 99 can extend above contact structure 87 but below any conductive material in 88 or 89.

Figure 20G:
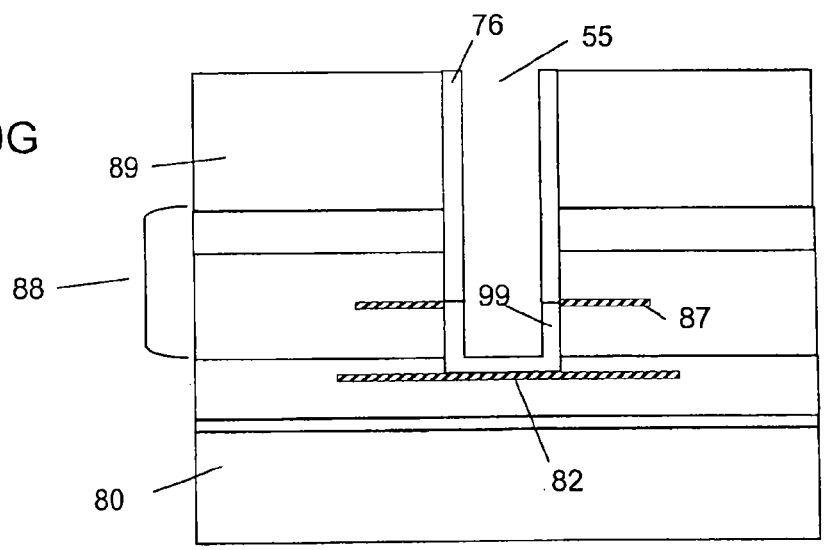
Figure 20H:
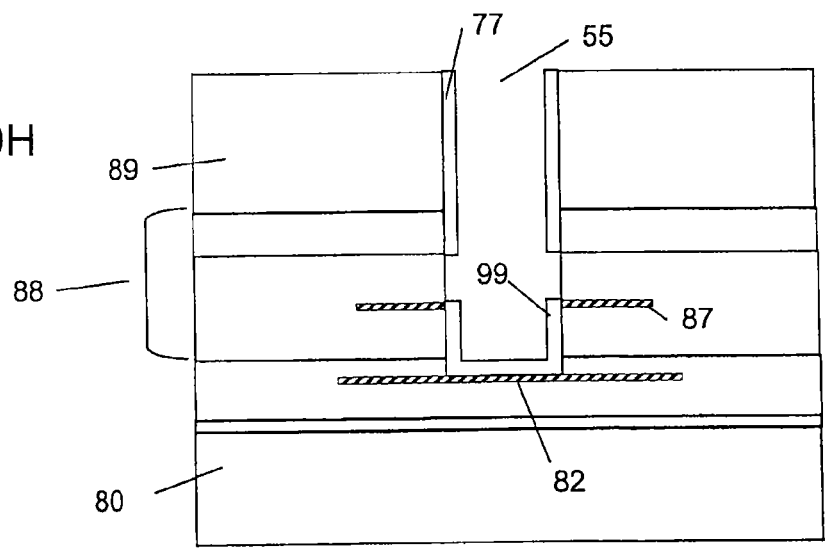

Subsequent to electrical interconnection 99 formation, a sidewall 76 covering substrate portion 89 exposed to via 55 similar to sidewall 70 in FIG. 8A or 8B can be formed as shown in FIG. 20G where a sidewall thickness comparable to interconnect 99 thickness is assumed. Alternatively, a selective sidewall similar to sidewall 75 in FIG. 8K can be formed as shown in FIG. 20H. The remaining portion of via 55 can then be filled with metal or lined with metal and filled with dielectric as described in previous embodiments.

These resulting structures are also suitable for subsequent processing including but not limited to photolithography-based interconnect routing or underbump metallization to support wirebonding or flip-chip packaging as described in previous embodiments. It is noted that the structures shown in FIGS. 20C-20F may also include the contact structures configured as shown in die 86.

Figure 21A:
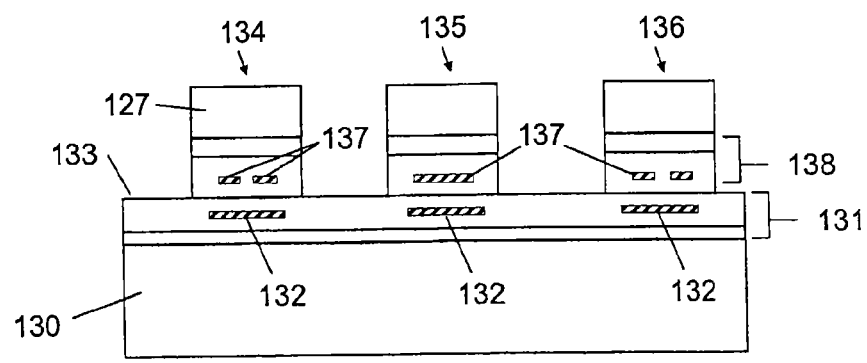
FIGS. 21A-21E illustrate a sixth embodiment where the substrate is substantially completely removed.
Figure 21B:
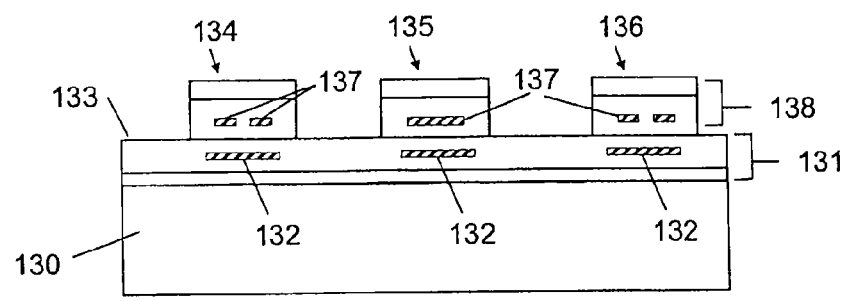

A sixth embodiment is shown in FIGS. 21A-21E where the entire die substrate portion 127, or substantially all of portion 127, similar to 19, 21, 89, 109, 121, in previous embodiments, may be removed leaving a layer of devices, a circuit, or a circuit layer. In this embodiment, substrate 130 has device region 131 with contact structures 132. Die 134-136 each having a device region 138, contact structures 137, and substrate portion 127 not required for proper operation. Contact 137 is shown having an aperture in die 134, and contact 137 is unitary in die 135 and an aperture may be etched therethrough, as in the fifth embodiment. Die 134-136 are bonded to substrate 130 on surface 133 as shown in FIG. 21A. Die substrate 127 is removed entirely by, for example, grinding and/or polishing, exposing device region 138 as shown in FIG. 21B. The number of steps subsequently required to etch a via to expose contact structures and form an electrical interconnection between contact structures is substantially reduced and simplified for this embodiment compared to the previous embodiments due to the lack of substrate portion 127.

Figure 21C:
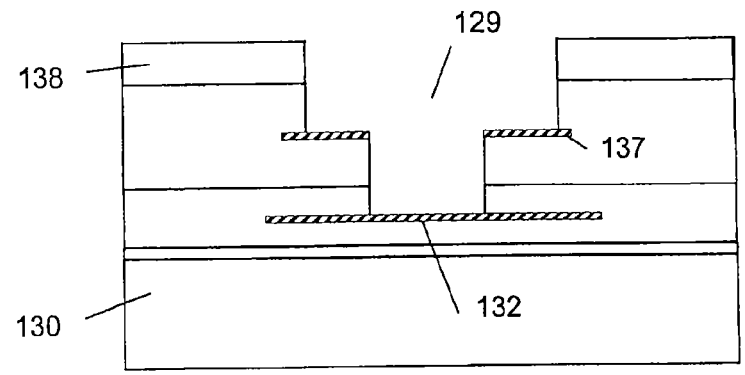
Figure 21D:
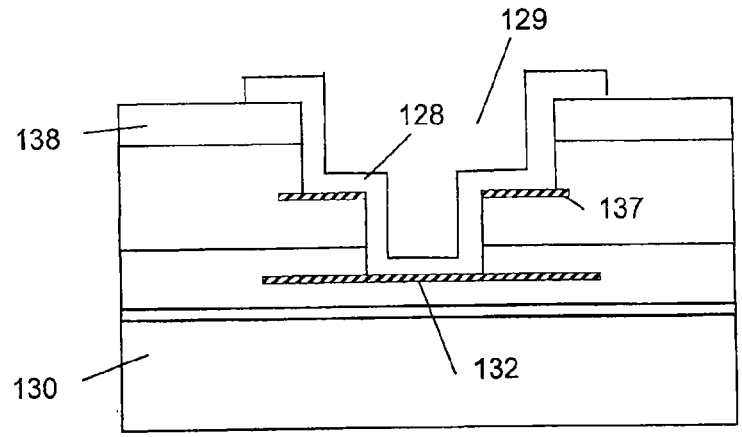
Figure 21E:
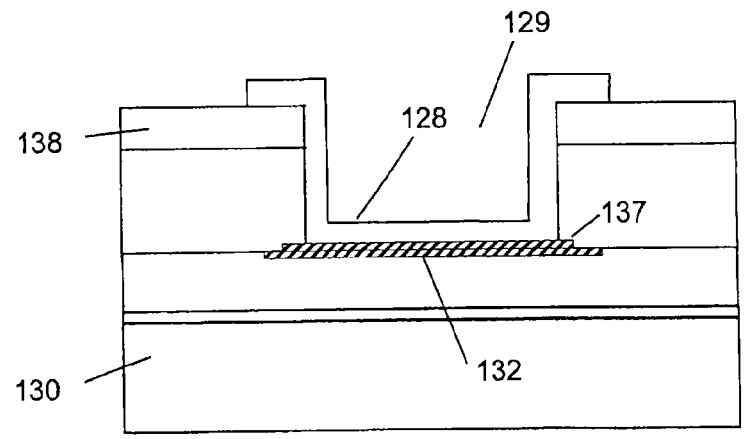

For example, in FIG. 21C, where only one of the die 134-136 is shown, the step of etching a via 129 to expose contact structures 132 and 137 is simplified because there is no substrate portion 127 through which a via is required to be etched. Via 129 can thus be substantially less deep than the vias described in earlier embodiments, resulting in a substantial reduction in via cross section and corresponding increase in via density. In another example, in FIG. 21D, where only one of the die 134-136 is shown, the step of forming an electrical interconnection 128 between exposed contact structures 132 and 137 is simplified because there is no substrate portion 127 that requires a sidewall to electrically isolate electrical interconnection 128. FIG. 21E illustrates this embodiment including contact structures bonded in direct contact. It is noted that the structure shown in FIG. 21E may also include the contact structures configured as shown in die 135 and similar to contact structures 124 and 122 in FIG. 19C.

Examples of applications where the entire die substrate portion may be removed include some silicon-on-insulator and III-V ICs where the die substrate portion of said ICs is not used for active transistor or other IC device fabrication.

The structures resulting from the sixth embodiment are also suitable for subsequent processing including but not limited to photolithography-based interconnect routing or underbump metallization to support wirebonding or flip-chip packaging as described in previous embodiments.

Figure 14:
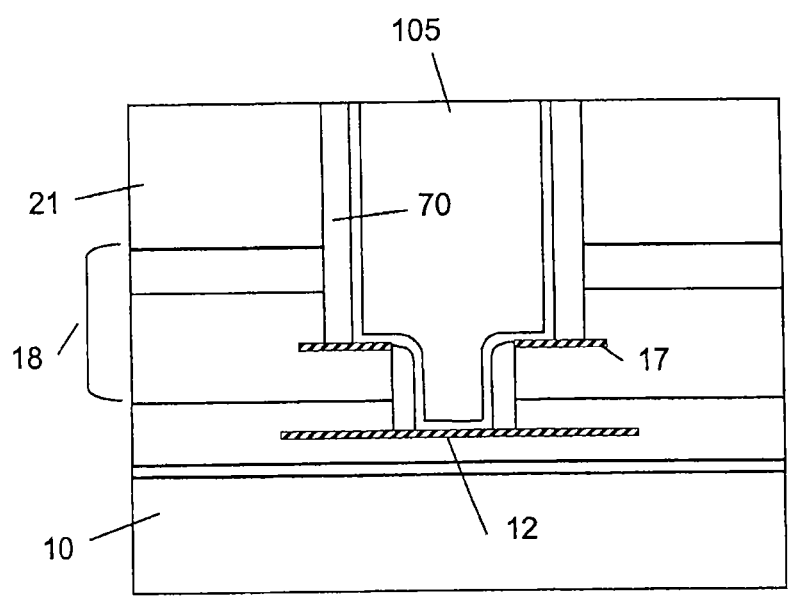
FIG. 14 is a diagram showing the structure of FIG. 13 after chemo-mechanical polishing.

Other variations to those shown in FIGS. 21A-21E include, but are not limited to, those described in earlier embodiments, for example; via filling or via lining and filling as shown in FIG. 10 and FIG. 14; interconnection to a die contact structure edge as shown in FIG. 15; bonding die with wafer contact structures exposed as shown in FIG. 17 and FIG. 18, or die and wafer contact structures exposed as shown in FIG. 19; Contact to an exposed side surface of die contact structures as shown in FIG. 20 is also possible.

A seventh embodiment of the invention is shown in FIGS. 22A-L and FIGS. 23A-K. Note that the surface contact structure configuration is illustrated by die 146. All dies may have the same or different contact structure configuration in a substrate and certain process variations may be needed when different contact structures are bonded to the same substrate, as discussed above. Substrate 140 may contain die such as 144-146 (indicated by dashed lines) separated by scribe alleys 38. Each of die 144-146 has contact structures 147 located in device region 148. It is noted that the contact structures are not drawn to scale, for ease of explanation. Contact structures 147 may be separate members or may consist of one member having an aperture therethrough.

Contact structures 147 can be formed by conventional methods of metal deposition and liftoff or metal deposition and etch. Alternatively, contact structures 147 can be formed by patterning and etching through a pre-existing conductive layer or a combination of patterning and metal deposition within an aperture of a conductive layer. Formation of contact structures 147 is preferably followed by deposition of a planarizing layer of electrically isolating dielectric material 151 similar to that under contact structures 147 in device region 148. A typical planarization material is silicon oxide formed by plasma enhanced chemical vapor deposition as indicated by layer 151 in FIG. 22A. When surface contacts are desired, as in device 146, layer 151 may be not formed, not formed in certain areas of substrate 140, or may be later removed.

A via may be formed in dies 144-146. Etching of the via is preferably done at wafer-scale, prior to singulation of die 144-146 along scribe alleys 38, into individual die so that all vias on all die on a wafer can be etched simultaneously. Die 144-146 can thus have all their vias etched simultaneously, or alternatively, at separate times if die 144-146 originate from different wafers. The vias are preferably etched anisotropically to consume a minimum amount of device region material 148 and substrate 140.

Figure 22A:
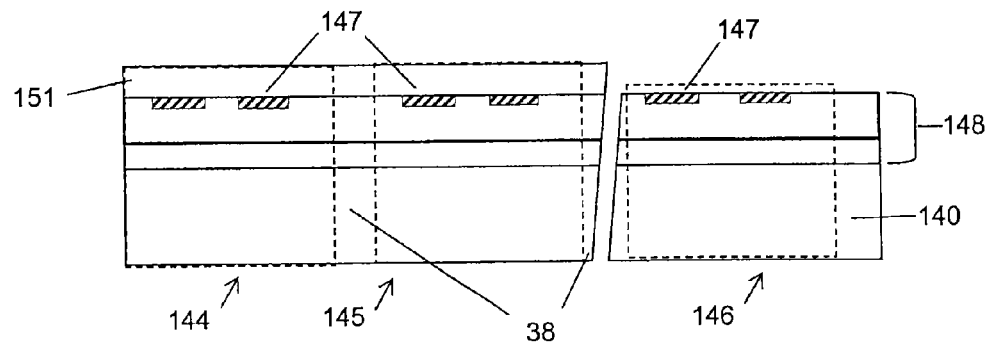
FIGS. 22A-22L illustrate a seventh embodiment of where vias are formed prior to die singulation.
Figure 22B:
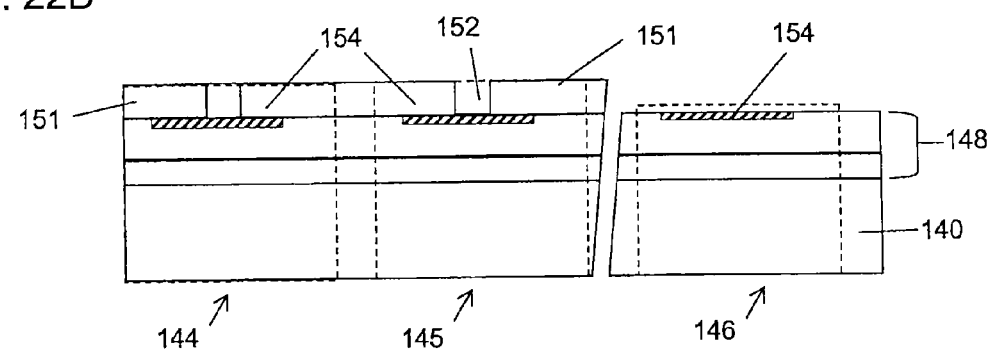
Figure 22C:
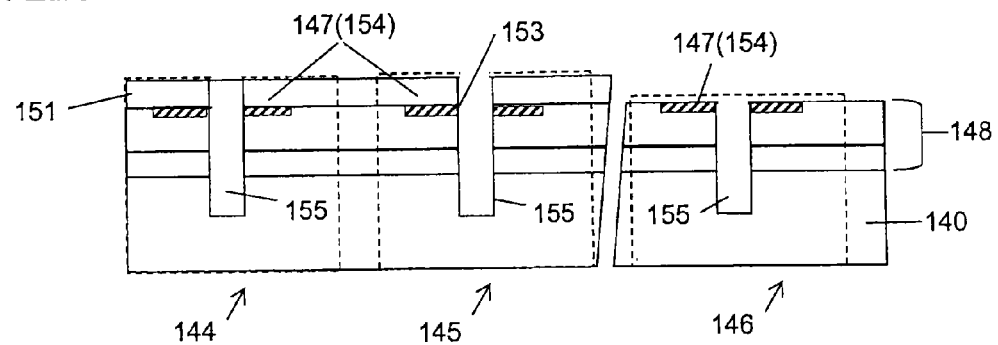
Figure 22D:
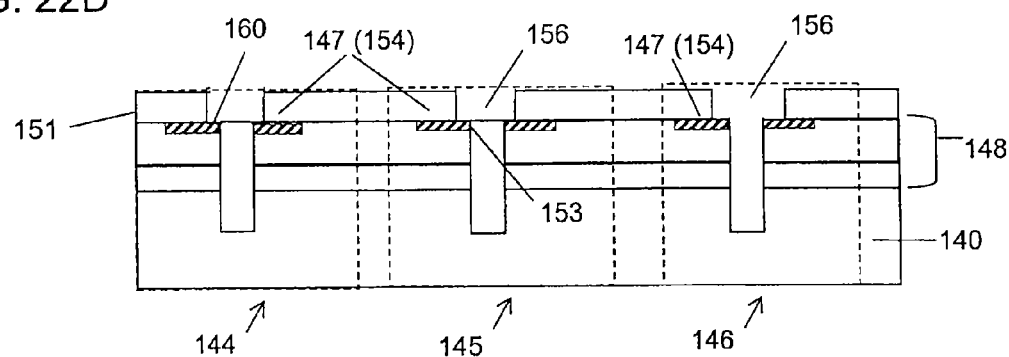
Figure 22E:
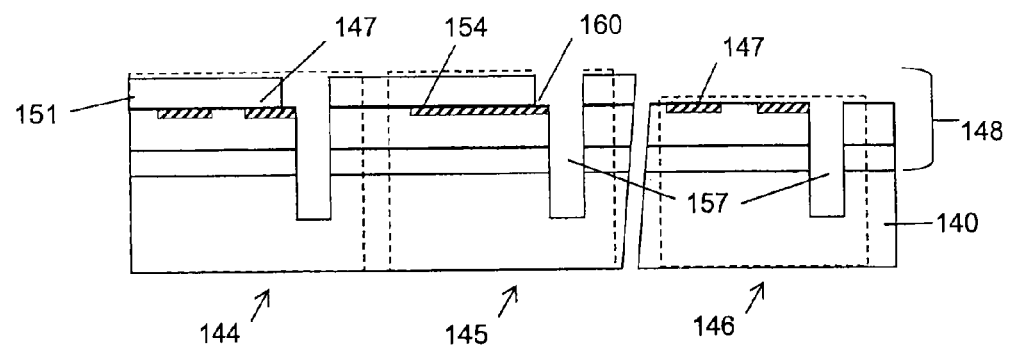
Figure 22F:
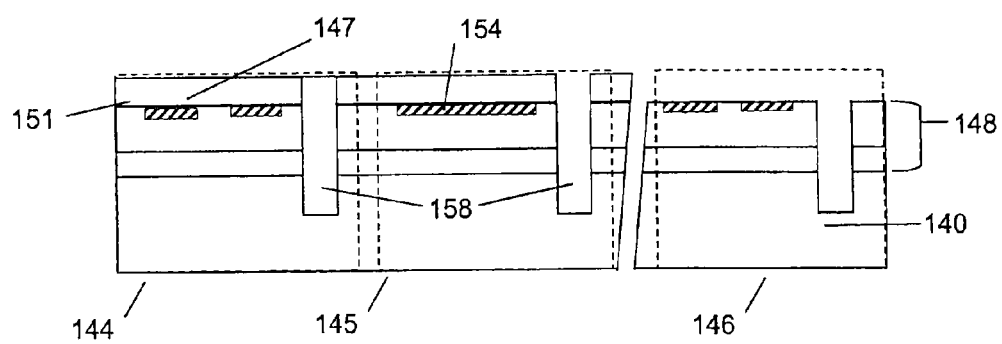
Figure 22G:
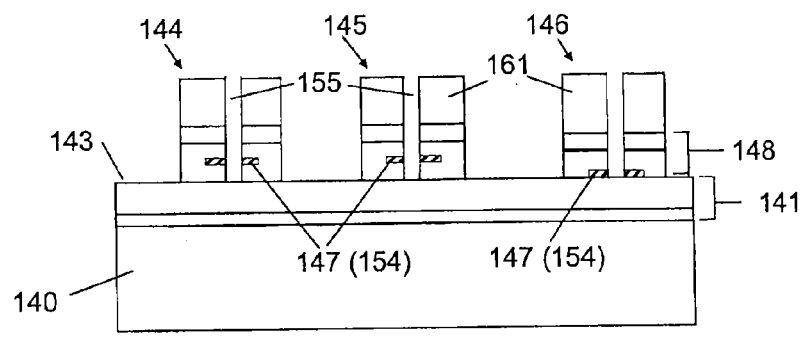

The contact structures in die 144-146 may also be formed in a manner similar to that described previously in the fifth embodiment. For example, planarization material 151 is patterned and etched to form a via 152 through planarization material 151 to conductive material 154 as shown in FIG. 22B, followed by etching a via through conductive material 154 to form contact structures 147 (154) with an exposed side surface 153, followed by further etching through device region 148 and into substrate 140 to form via 155 as shown in FIG. 22C. This etch is preferably anisotropic to minimize the lateral extent of via 155. Planarization material 151 may also be patterned and etched to form vias 156 exposing two ledges 160 as shown in FIG. 22D, vias 157 exposing one ledge 160 as shown in FIG. 22E, or vias 158 where no ledge is exposed as shown in FIG. 22F. The patterning and etching of planarization material 151 may be of an area slightly larger than the aperture formed by contact structures 147 (or in contact structures 154) resulting in a location and lateral extent of vias 156 below contact structure 147 given by contact structure 147 (154) and an upper portion of vias 156 above contact structure 147 (154) slightly wider than the lower portion of vias 156. The ledges 160 and side surface 153 of contact structures 147 (154) are revealed, as shown in FIG. 22D. Alternatively, the patterning and etching of planarization material 151 may overlap an edge of contact structures 147 (154) resulting in a portion of the location and lateral extent of vias 157 given by contact structure 147 (154) and the upper portion of via 157 slightly wider than the lower portion. One ledge 160 of contact structure 147 and 154 and a side surface 153 of contact structures 147 (154) are revealed, as shown in FIG. 22E. Alternative to FIGS. 22D and 22E, the patterning and etching of planarization material 151 may not overlap any portion of contact structures 147 (154) resulting in a location and lateral extent of via 158 not given by contact structure 147 (154) and not revealing a side surface 153 of contact structures 147 (154) as shown in FIG. 22F. It is noted that any of the contacts in FIGS. 22E and 22F need not have an aperture. Vias 156, 157 or 158 are preferably etched to a sufficient depth such that subsequent thinning of substrate 140 of singulated die 144-146 to form thinned substrate 161 after bonding die 144-146 to surface 143 of substrate 140 reveals the vias 156, 157 and/or 158, as shown in FIG. 22G for vias 155 and contact structures 147 (154) formed as shown in FIG. 22C.

Figure 22H:
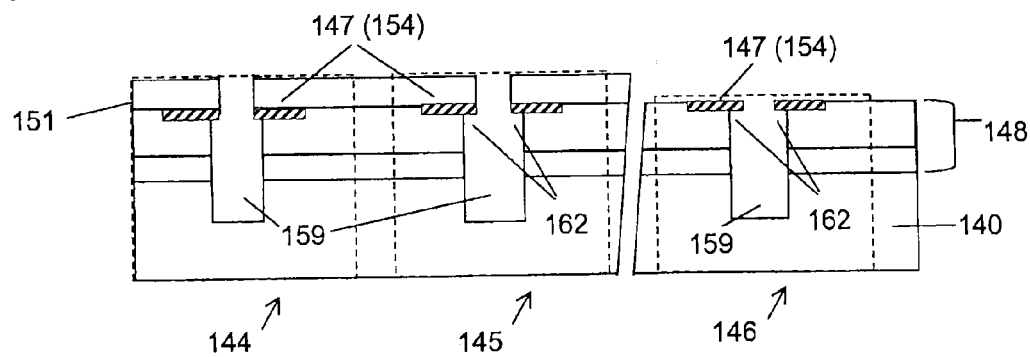
Figure 22I:
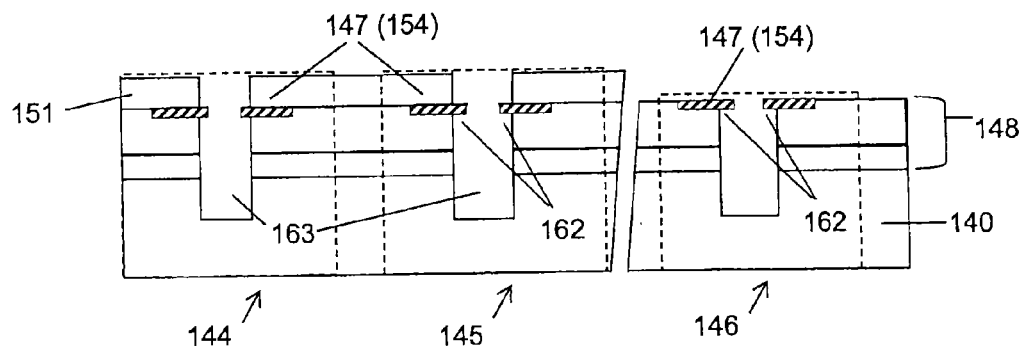
Figure 22J:
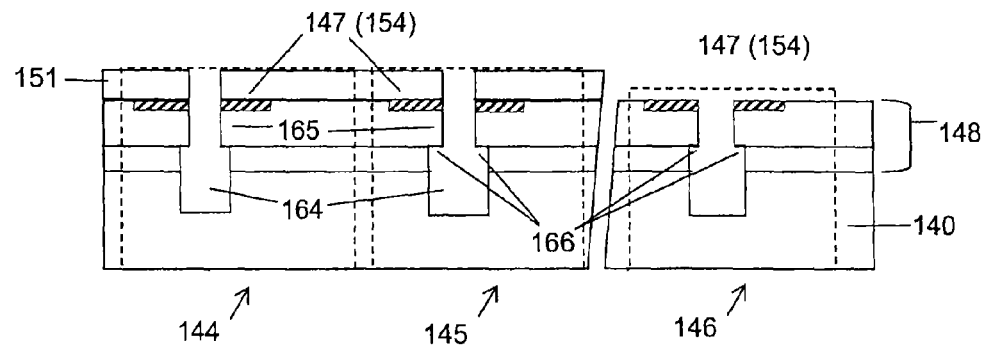

The etching of the via defined by contact structures 147 or in contact structure 154 can be isotropic to a desired extent to form a self-aligned ledge 162 on the backside of contact structures 147 (154) as shown in FIG. 22H for via 155 of FIG. 22C to produce via 159, or as shown in FIG. 22I for vias 156 of FIG. 22D to produce via 163. The isotropic etching can include the device region 148 underneath contact structures 147 (154) and the substrate 140 to reveal the backside of contact structures 147 (154) as shown in FIG. 22H or FIG. 22I. The isotropic etching can be achieved by modifying the etch conditions used to etch vias 155 or vias 156. For example, if the etch conditions used to etch vias 155 or vias 156 include a Reactive Ion Etch at low pressure, a similar Reactive Ion Etch can be used at a higher pressure. The increase in pressure required to reveal the desired amount of backside of contact structures 147 and form the self-aligned ledge 162 depends on a number of factors including the thickness of planarization material 151 and depth of vias 156, 157, or 158 and can be determined experimentally. Alternatively, the isotropic etching can include substrate 140 but not device region 148, resulting in a self-aligned ledge 166 and residual portion 165 of device region 148 on the backside of contact structures 147 (154) and above via 164 as shown in FIG. 22J. Similar to FIGS. 22H and 22I as described above, residual portion 165 of device region 148 on the backside of contact structures 147 (154) and above via 164 forming a self-aligned ledge 166 results with isotropic etching to a desired extent below contact structures 147 (154). This structure can be formed, for example, if residual portion 165 is comprised of an insulator, for example silicon oxide, and isotropically etched device region 148 and substrate 140 is comprised of a semiconductor, for example silicon.

Figure 22K:
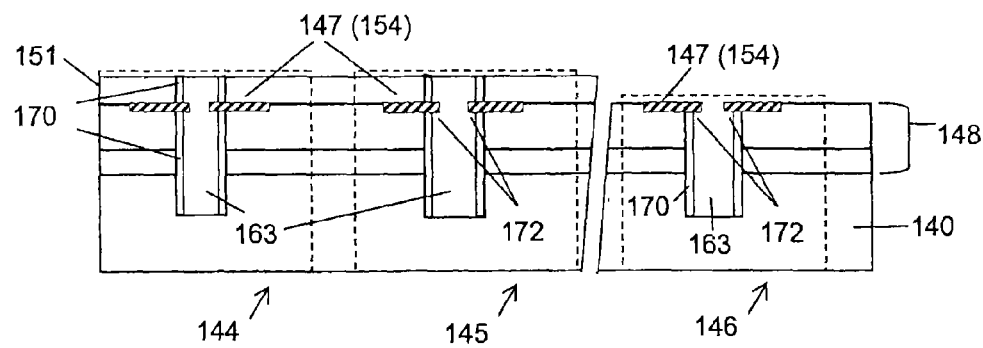
Figure 22L:
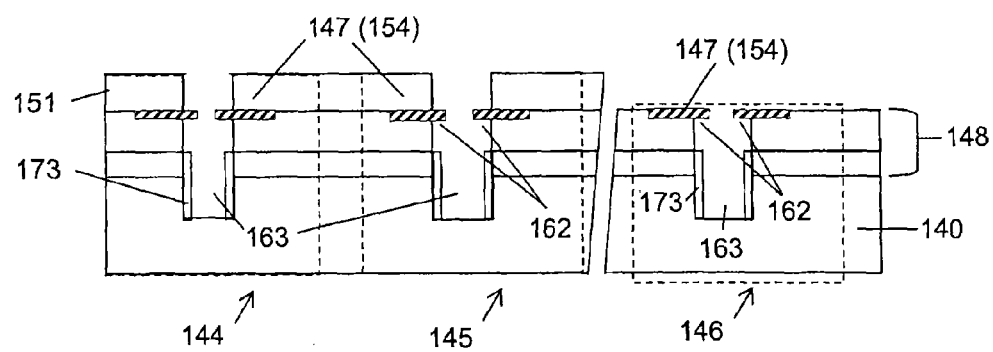
Figure 23A:
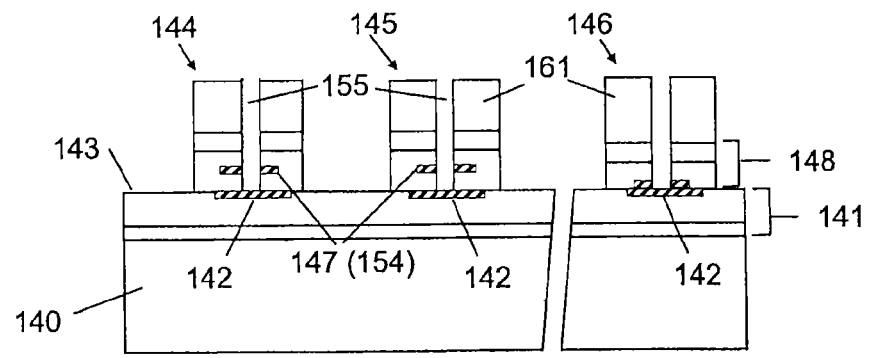
FIGS. 23A-23K illustrate an eighth embodiment die are mounted top down.
Figure 23B:
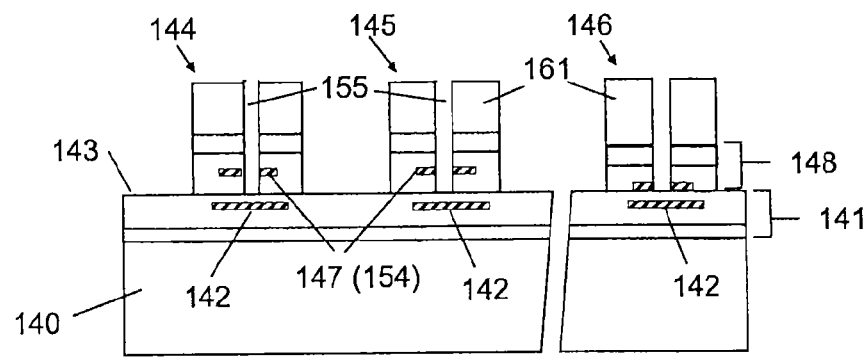

After formation of vias, a non-selective dielectric sidewall 170 may be formed as described in the first embodiment to electrically isolate substrate 140 from interconnect metal that may subsequently be formed in the vias as shown in FIG. 22K. FIG. 22K shows the example for via 163 formed as shown in FIG. 22I to produce via 171 with ledges 172. A selective dielectric sidewall 173 similar to sidewall 77 described in the first embodiment and shown in FIG. 22L may also be formed. After etching vias, die 144-146 are singulated, if desired, and bonded to surface 143 of substrate 140 with contact structures 142, and device region 141. Alternatively, die 144-146 may be bonded without singulation. For example, an entire wafer or die may be bonded to a substrate with a single placement instead of separate die placements, and result in a nominally planar surface instead of a non-planar surface resulting from the spacing between die. Substrate 140 may also contain contact structures but not devices or a device region. Substrate 140 is then thinned, for example with at least one of backgrinding, chemical mechanical polishing, or etching, to leave thinned substrate die 161 and reveal vias, for example via 155 if vias are formed as described in FIG. 22C and shown in FIGS. 23A-23B. Contact structures 142 can be planar with the bond surface as shown in FIG. 23A, or recessed to the bond surface as shown in FIG. 23B. A contact structure 142 planar with the bond surface as shown in FIG. 23A can be formed by depositing a conductive material, for example copper or nickel plating, on the surface of substrate 140, then depositing an isolating material, over the conductive material, followed by a chemical mechanical polish to form contact structure 142 and surface 143. The polish rate of the conductive material is preferably comparable to the polish rate of the isolating material. A comparable polish rate of the conductive material can be obtained with appropriate selection of conductive material, isolating material, conductive material size, shape and area coverage of the conductive material, and polishing parameters, including slurries and pads as described in the fourth embodiment.

Figure 23C:
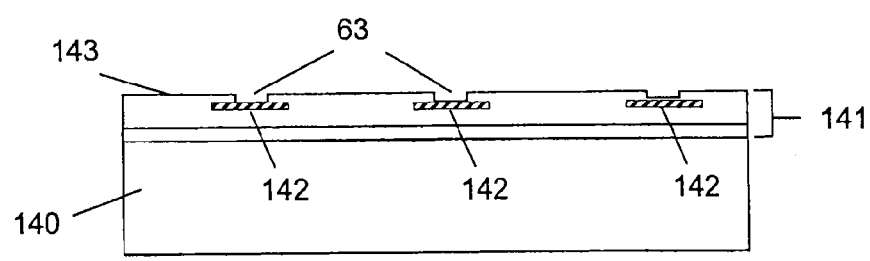
Figure 23D:
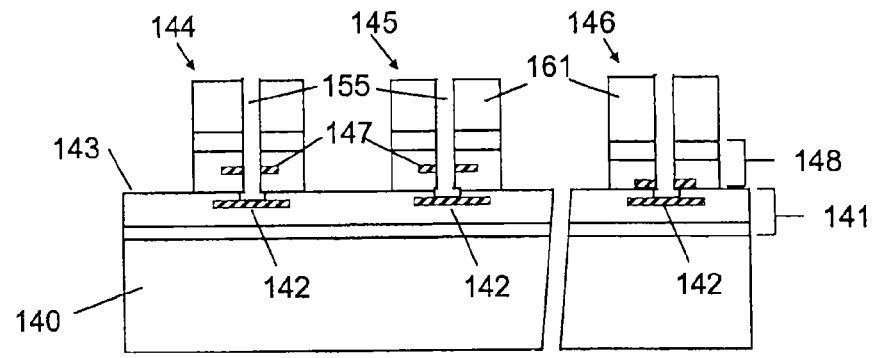
Figure 23E:
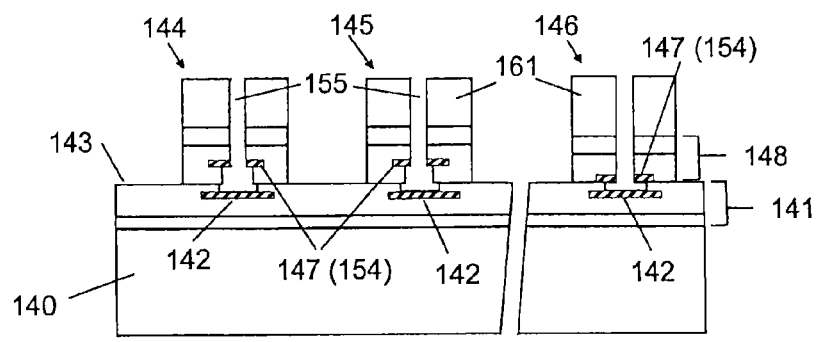

Alternatively, a contact structure 142 recessed to the bond surface as shown in FIG. 23B may be formed by deposition of an isolating material, for example, silicon oxide, followed by a chemical mechanical polish of the isolating material that planarizes the surface by selectively polishing elevated features, resulting in a thin planarized dielectric material on top of contact structure 142. Alternatively, contact structure 142 recessed to surface 143 as shown in FIG. 23B may be formed by first forming the planarized surface 143 indicated in FIG. 23A, followed by the deposition or deposition and polishing of a very thin layer of isolating material on surface 143 shown in FIG. 23A to form surface 143 shown in FIG. 23B. A contact structure 142 recessed to the bond surface may have an exposed surface as shown in FIG. 23C, formed, for example, by patterning and etching the planarized dielectric material to expose contact structure 142 with vias 63. The bonding and thinning of die 144-146 then results in exposed surface of contact structure 142 as shown in FIG. 23D. The exposure of contact structures 142 and 147 (154), for example as shown in FIGS. 23A and 23D, are preferred to facilitate subsequent electrical interconnection between contact structures 142 and 147 (154) described below. The lateral extent of exposed contact structure 142 can be less than, greater than, or equal to the lateral extent of via 155 depending on the relative size of via 63 and the lateral extent of via 155 etched as shown in FIG. 22C. For example, when the lateral extent of via 155 in FIG. 22C is less than the lateral extent of via 63 in FIG. 23C, the lateral extent of exposed contact structure 142 is greater than the lateral extent of via 155 as shown in FIG. 23D. Alternatively, the extent of exposed contact structures 142 may be widened after bonding, thinning, and revealing vias, for example vias 155, with an isotropic etch of exposed device regions 141 and 148 to contact structures 142, as shown in FIG. 23E. Alternatively, exposed contact structure 142 shown in FIG. 23C may be protected by a thin layer during a bonding process that may otherwise be detrimental to contact structure 142. For example, if contact structure 142 is comprised of aluminum, it may be compromised by exposure to ammonia-based solutions used to achieve room temperature covalent bonding. An example of such a thin layer is silicon oxide that may be formed by PECVD. Chemical mechanical polishing of the thin layer may also be done to maintain a desired surface 143 without removing said thin layer from contact structure 142. The thin layer may then be removed after bonding die 144-146 to substrate 140 and thinning substrate 140 to reveal the vias and form thinned die substrate 161 and is thus preferably thin, in the range of 0.05 to 0.5 microns, to simplify removal after revealing the vias.

Figure 23F:
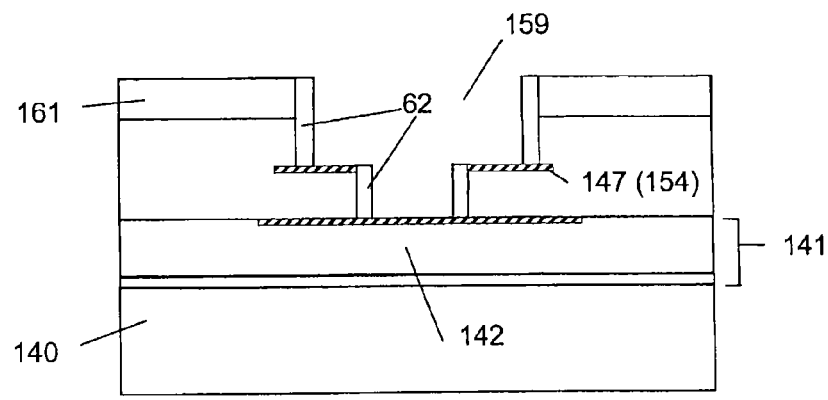

If thinned die substrate 161 is non-conductive, revealed contact structures 142 and contact structures 147 (154) may be interconnected with the formation of conductive material overlapping contact structures 142 and contact structures 147 (154). Alternatively, if thinned die substrate 161 is conductive, for example if thinned die substrate is comprised of silicon, an isolating sidewall electrically isolating thinned die substrate 161 from conductive material interconnecting contact structures 142 and contact structures 147 (154) is preferred. An isolating non-selective sidewall as described in earlier embodiments, for example sidewall 70 in FIG. 8A or 8B, can be formed after bonding of die 144-146 and subsequent thinning of die 144-146 to leave thinned die substrate 161 as shown in FIG. 23F for sidewall 62 when exposed contact structure 142 is planar to surface 143, similar to that shown in FIG. 23A and via 159 formed as shown in FIG. 22H, instead of sidewall formation before bonding as shown previously in FIG. 22K or FIG. 22L for via 163 formed as shown in FIG. 22I. An isolating selective sidewall similar to that described in the first embodiment but formed after bonding, thinning of die substrate, and revealing vias can also be used. As described in previous embodiments, sidewall formation is preferred to prevent undesired electrical conduction between the thinned die substrate and electrical interconnection between contact structures 142 and contact structures 147 (154).

Figure 23G:
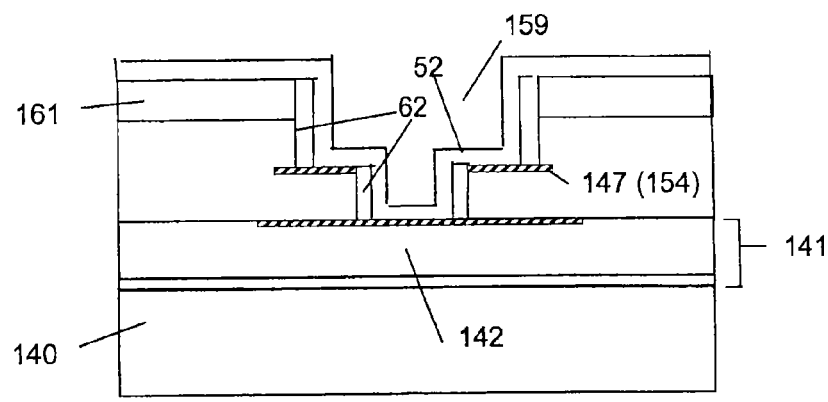
Figure 23H:
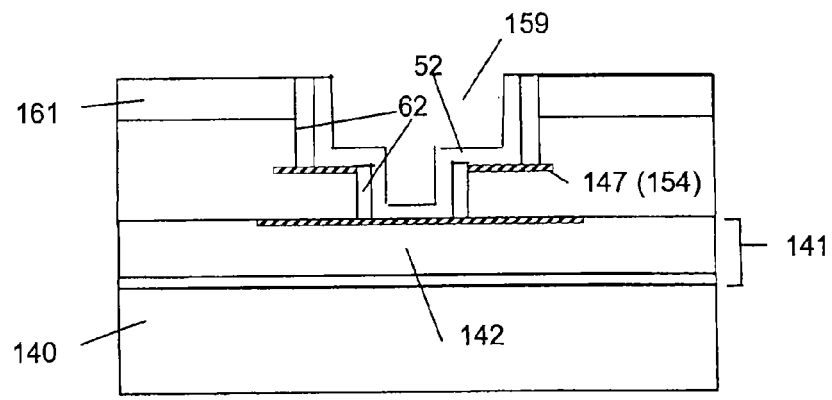
Figure 23I:
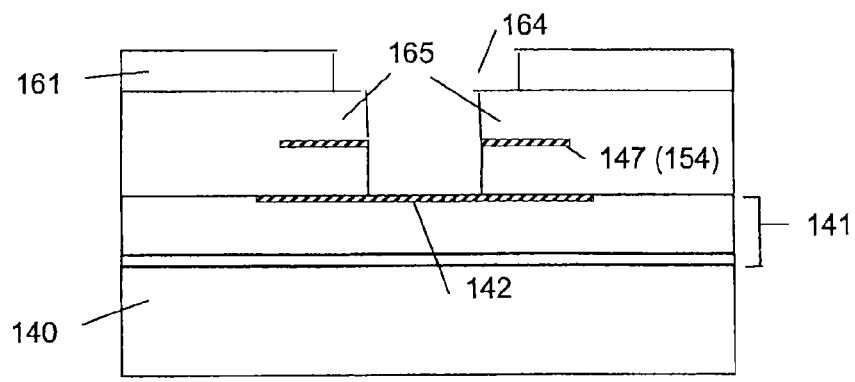
Figure 23J:
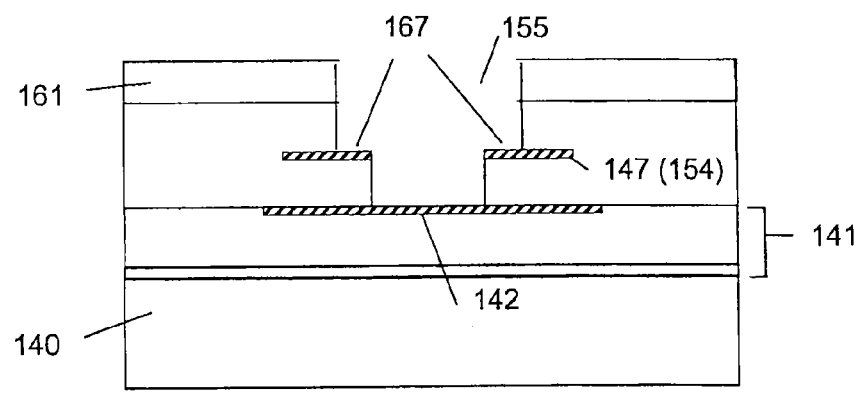

With contact structures 147 (154) and contact structures 142 exposed, and a sidewall on thinned die substrate 161 if preferred, an electrical interconnection between contact structures 147 (154) and contact structures 142 can be made by forming conductive material over exposed surfaces of contact structures 142 and 147 (154). A typical conductive material is metal and typical metals are aluminum, copper, nickel, and gold. These metals can be formed with a variety of methods as described in earlier embodiments. This formation may result in coverage of the exposed thinned die substrate 161 surface with conductive material 52 as shown in FIG. 23G. This coverage may be removed in a self-aligned manner and without using photolithography patterning and etching by polishing the thinned die substrate 161 surface covered with conductive material 52 until conductive material 52 is removed from thinned die substrate 161, as shown in FIG. 23H. When there is a residual portion 165 of device region 148 with self-aligned ledge 166 as shown in FIG. 22J, a structure similar to that shown in FIG. 23I results after bonding die 144-146 to substrate 140 and thinning of substrate 140 to reveal vias 164 and form thinned substrate 161, when exposed contact structure 142 is planar to surface 143 similar to that shown in FIG. 23A. Residual portion 165 is then preferably removed with an anisotropic etch to reposition the self-aligned ledge against the backside of contact structures 147 (154) resulting in self-aligned ledge 167 as shown in FIG. 23J.

Conductive material can then be formed to electrically interconnect contact structures 147 with contact structures 142 without forming an electrical interconnection to thinned substrate 161, if preferred, similar to that described above and shown in FIGS. 23F, 23G, and 23H. As described previously, the formation of interconnect metal can be made with one or a combination of e-beam, thermal, physical vapor deposition, chemical vapor deposition, and electroplating. Interconnect metals formed can be one or a combination of titanium, tungsten, gold, copper, or aluminum.

Figure 23K:
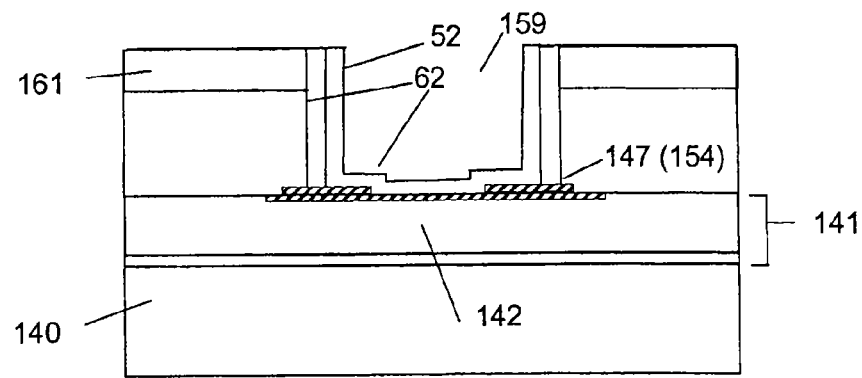

After contact structures 142 and 147 (154) are electrically connected with conductive material, the vias can be filled and planarized with a combination of metallization, dielectric deposition, and chemical mechanical polishing as described in previous embodiments. After vias are filled and planarized, underbump metallization, bumping, dicing, and flip-chip packaging can be done as described in previous embodiments. It is noted that FIGS. 23F-J illustrate a surface contact 142 but this contact may also be recessed, as shown in FIG. 23B. Also, dies with surface contact structures may be bonded and configured and/or connected as illustrated in FIGS. 23F-23J. FIG. 23K illustrates the case of FIG. 23H.

Also, the vias in this embodiment (e.g., FIGS. 22C-22F, 22H-L) may be filled with conductive material 168 prior to singulation so that the conductive material is exposed when the singulated portions of substrate 140 are thinned. Insulating material for electrical isolation may be formed on the sidewalls of the via as needed, as discussed above. The die (or wafer) filled vias may then be bonded with exposed surface of die (or wafer) device region 148 (or die down) as described below in the ninth embodiment or with the opposing surface to exposed device region 148 surface (or die up) as described below in the tenth embodiment. The bonding may be performed as described in the fourth embodiment using contact structures 147 and shown in the left-hand side of FIG. 23L for die down and described in more detail below in the ninth embodiment, or in the middle structure of FIG. 23L for die up where conductive material 168 is connected to contact structure 142 and described in more detail below in the tenth embodiment, or in the right-hand side of FIG. 23L for die up where contact structures 179 are formed similar to the formation of contact structures 147 as described in the fourth embodiment and described in more detail below in the tenth embodiment. If needed, dielectric material 169 may be formed on substrate portion 161, and polished as needed for bonding to substrate 140. Vias may be filled with a variety or combination of conductive materials, including but not limited to polysilicon or a variety of metals, for example tungsten, nickel or copper, deposited by a variety of methods including but not limited to chemical vapor deposition, physical vapor deposition and electroplating. The conductive material may be chosen to facilitate good electrical contact with the contact structures to which the conductive material is bonded, low electrical resistivity, or high thermal conductivity and may be separated from the substrate portion outside the via or insulating material on the via sidewall by a barrier layer, for example titanium nitride or tungsten nitride, deposited, for example, by metal organic vapor phase deposition or physical vapor deposition, if needed, to prevent the conductive material from diffusing into the substrate portion outside the via. For example, when building silicon-based ICs, where vias are etched into silicon, copper may be preferred due to its low resistivity, but typically requires a suitable barrier layer, typically titanium nitride or tungsten nitride between a suitable via insulating layer, typically silicon oxide to avoid diffusion of copper into the silicon. Alternatively, other metals, for example tungsten, may also be used, with an insulating or barrier layer, if required. Also, a material whose polishing properties are advantageous, as discussed above, such as nickel, may be used, with an insulating or barrier layer, if required.

Figure 24A:
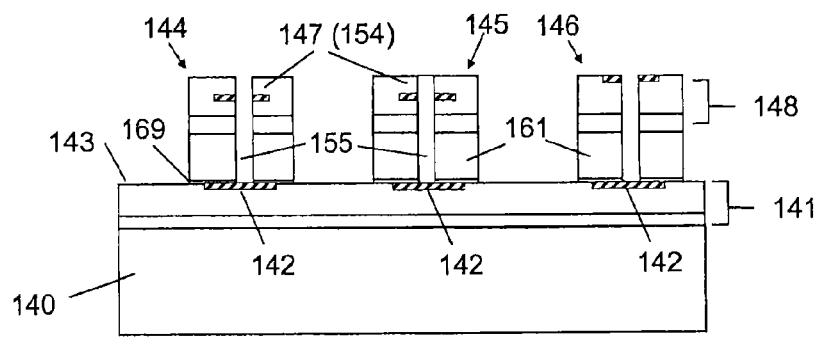
FIGS. 24A and 24B illustrate a variation of the eighth embodiment where die are mounted top up.
Figure 24B:
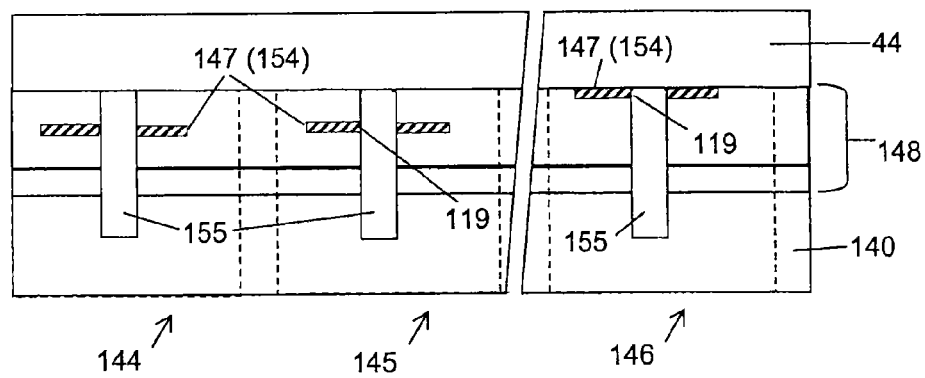

An eighth embodiment is illustrated in FIGS. 24A-B. This embodiment is distinct from the seventh embodiment in that the opposing side of die 144-146, e.g., thinned die substrate, 161 is bonded to surface 143 of substrate 140 after thinning the die substrate to reveal the vias. This results in bonding of thinned die substrate 161 to surface 143 and exposure of vias 139 to the surface 143 as shown in FIG. 24A for vias 155 formed as shown in FIG. 22C and contact structures 142 formed as shown in FIG. 23A. Thinned substrate 161, for example silicon, can be bonded directly to surface 143 of substrate 140 or a dielectric, for example, silicon oxide, can be formed on thinned substrate 161 before directly bonding to surface 143 of substrate 140. The formation of thinned substrate 161 is preferably done at wafer-scale, prior to singulation of die 144-146 into individual die, so that all vias, for example vias 155 shown in FIG. 22C, on all die on a wafer are revealed simultaneously. Die 144-146 can thus have all their vias revealed simultaneously, or alternatively, at separate times if die 144-146 originate from different wafers.

The formation of thinned substrate 161, for example from substrate 140 in FIG. 22C, may compromise the mechanical integrity if the vias are not sufficiently deep. For example, a via depth of less than approximately 0.1 to 0.3 mm for a thinned substrate of 200 mm diameter and comprised of silicon is typically sufficient. This depth for vias below which mechanical integrity is compromised will be greater for a thinned substrate of greater diameter and less for a thinned substrate of lesser diameter. This compromise in mechanical integrity can be avoided by attaching the opposing side of the exposed surface of substrate 140 to a handle wafer 44 before the thinning of substrate 140 as shown in FIG. 24B for via 155 and contact structures 147 (154) formed as shown in FIG. 22C. The handle wafer 44 attachment can be done with a variety of bonding methods including direct bonding or adhesive bonding. After attaching the opposing side of the exposed surface of substrate 140 to a handle wafer 44 and thinning substrate 140 to formed thinned substrate 161 and reveal via 155, the thinned substrate 161 may be used as a bonding surface or a dielectric, for example, silicon oxide, may be deposited as a bonding layer as described above. After forming the preferred bonding surface, die 144-146 are singulated and bonded to surface 143 of substrate 140, and the singulated portion(s) of handle wafer 44 is removed. Singulation may done with at least one of dicing or scribing. Removal of the singulated portion(s) of handle wafer 44 may be done with at least one or a combination of grinding, chemical mechanical polishing, or etching.

Prior to bonding to handle wafer 44 and thinning to form thinned substrate 161, contact structures 147 (154) can be formed in die 144-146 as described in the seventh embodiment. However, the formation of a ledge on contact structures 147 to improve the electrical connection resistance between conductive material 52 and contact structures 147 is on the opposing side of contact structures 147 described in the seventh embodiment and shown in FIG. 23F and FIG. 23G. This ledge can thus be formed by etching the device region 148 above the contact structures 147 over an extent greater than the aperture in contact structures 147 to form a via, similar to that shown for via 156 and contact structures 147 in FIG. 22D.

Further, prior to bonding to handle wafer 44 and thinning to form thinned substrate 125, a sidewall can be formed in the vias. The sidewall can be non-selective similar to that shown in FIG. 22K for non-selective sidewall 170 and via 163 or selective similar to that shown in FIG. 22L for selective sidewall 173 and via 163. Alternatively, a selective or non-selective sidewall may be formed after bonding die 144-146 as described in earlier embodiments.

The bonding of die 144-146 to substrate 140 can be done with contact structures 142 planar or recessed to the bond surface and exposed or protected by a thin layer as described in the seventh embodiment. After bonding die 144-146, and removing singulated portion of handle wafer 44, if used, and removal of thin protective layer, if used, contact structures 142 are exposed similar to FIG. 23A or FIG. 23D in the seventh embodiment. Conductive material is then formed to electrically interconnect exposed contact structures 142 and 147 (154), for example similar to FIG. 23G and FIG. 23H in the seventh embodiment. This conductive material formation can partially or completely fill the vias. If the conductive material electrically interconnecting exposed contact structures 142 and 147 (154) partially fills the vias, the remaining portion of the vias can be filled and planarized with a combination of metallization, dielectric deposition, and chemical mechanical polishing as described in previous embodiments. After vias are filled and planarized, under-bump metallization, bumping, dicing, and flip-chip packaging can be done as described in previous embodiments.

A ninth embodiment similar to the fourth embodiment with regard to bonding and electrical interconnection and similar to the seventh embodiment with regard to formation of a thru-die via prior to bonding and exposing by thinning after bonding is also possible. This embodiment starts as described in the seventh embodiment and continues through singulation and bonding of die 114-116 (or wafer) with the exception that the bond surfaces containing contact structures 123 and 122 are prepared, bonded and electrically interconnected as described in the fourth embodiment. After bonding, die 114-116 are thinned to expose vias in die 114-116 as described in the seventh embodiment and filled with metal as described in earlier embodiments. The final structure would look similar to FIG. 19A in the case where the via was filled and contact structures 123 comprised an aperture.

In a variation of the ninth embodiment, the pre-bond via formation is augmented with metal filling as described in the seventh embodiment. For example, vias in die 114-116 are formed prior to bonding as shown in FIGS. 22D, 22E, and 22F for vias 156, 157, and 158. If the die substrate and the portion of die device region are conductive, an electrically insulating sidewall is preferably formed on the conductive portion of etched via sidewall, for example sidewall 173 in via 163 on substrate 140 and device region 148 as shown in FIG. 22L. This sidewall may also be formed on the entire sidewall, the entire non-contact portion of the sidewall as shown in FIG. 22K, or in the bottom of the via. After the via has been electrically isolated from the die substrate and device region as appropriate, the via is filled with a conductive material, for example metal, as shown in FIG. 10B with planarized metal structure 100 or with a combination of conductive and insulating material as shown in FIG. 10C with metal lining or barrier layer 93 and dielectric 94. The via filling, for example with metal or metal and dielectric, can be done with a number of techniques as described in earlier embodiments.

Figure 25A:
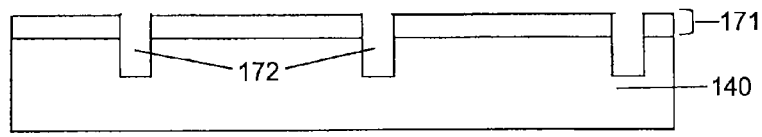
FIGS. 25A-25F illustrate a ninth embodiment with filled vias prior to bonding.
Figure 25B:
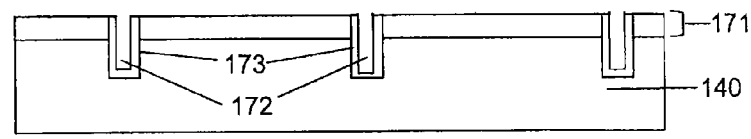
Figure 25C:
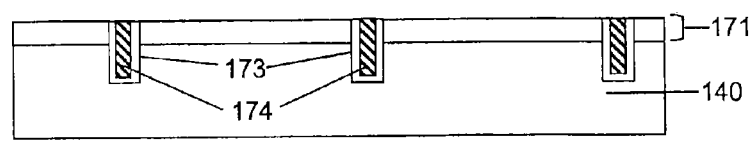
Figure 25D:
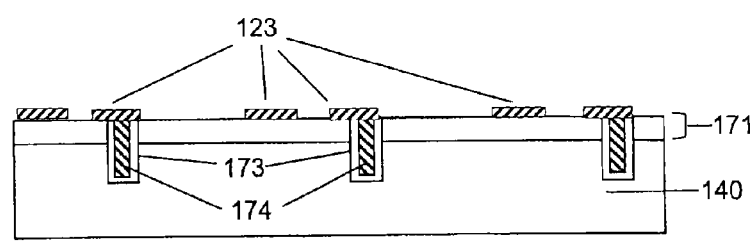
Figure 25E:
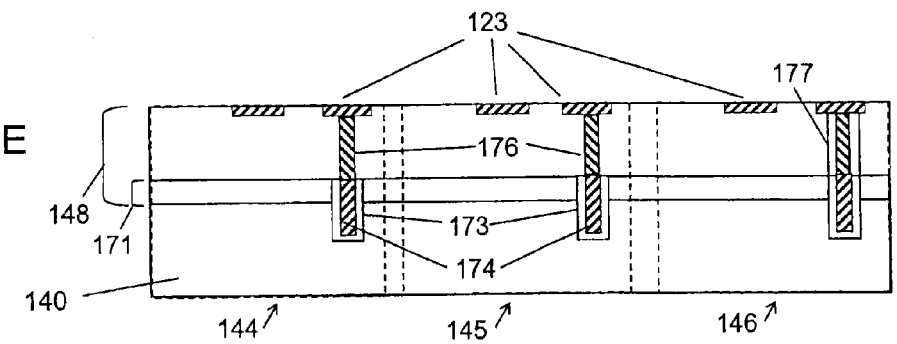

Alternative to etching and filling vias through the die device region and a portion of the die substrate, the vias can be etched, or etched and filled, into only a portion of the die substrate, or a portion of the die device region and a portion of the die substrate, before formation of devices or completion of the die device region. For example, as shown in FIG. 25A, vias 172 are etched into die substrate 140 and through a portion of die device region 171, for example the semiconductive portion of a device region comprised of a layer of semiconductor transistors and a multilevel interconnect structure comprised of conducting material (not shown), for example metal, and insulating material, for example silicon oxide or other suitable materials, or where the device region would reside in the substrate. If portion of die device region 171 and die substrate 140 are comprised of a conducting material, for example semiconductor materials with sufficiently low resistivity, for example silicon used in typical CMOS wafer fabrication, a sidewall is preferably formed as described earlier in this and earlier embodiments and as shown in FIG. 25B for selective sidewall 173 that is also formed on the bottom of via 172 as described in earlier embodiments. Furthermore, if the structure in FIG. 25A is comprised of silicon, a very thin, for example, 5-50 nm, high quality selective silicon dioxide sidewall can be thermally grown, facilitating the lateral dimensions of via 172 to be substantially less than one micron enabling a very high areal density of vias in excess of 100,000,000 per square centimeter to be fabricated. Alternatively, a non-selective sidewall can be formed on the sidewall of via 172 without formation on the bottom of via 172 as described in earlier embodiments. Via 172 can then be lined with a suitable barrier layer, if needed, and filled with conductive material 174 forming, for example, a metal filled via as described above. Via 172 may also be filled with conductive polysilicon. Contact structures 123 may be formed in contact with the filled vias as shown in FIG. 25D. Alternatively, further processing may be conducted on the structure of FIG. 25C prior to formation of contact structures 123 to complete the fabrication of die device region 148, followed by formation of contact structures 123 in the upper portion of die device region 148, as shown in FIG. 25E. For example a multilevel interconnect structure may be formed comprised of conducting material, for example metal, and insulating material, for example similar to or identical with typical CMOS wafer fabrication. Typical metals include copper and aluminum and typical insulating materials include silicon oxide and low-k dielectrics. Contact structures 123 in die 114-116 can be formed as described in the fourth embodiment and shown in FIG. 25E. The device region 148 may include the formation of a conducting material 176 to electrically interconnect contact structures 123 with metal filled via 174. Conducting material 176 is shown in FIG. 25E to be vertical between conductive material 174 and contact structures 123 but may also include or entirely consist of lateral components, for example as provided for by the routing of inter-level metal in the fabrication of typical integrated circuits, for example CMOS wafer fabrication. See FIG. 25F with conducting material 178.

Electrical connections can thus be provided from metal filled vias 174 to contact structure 123 using the interconnect structure of an integrated circuit, for example according to typical CMOS wafer fabrication, effectively minimizing or eliminating the need to modify design rules of the interconnect structure to achieve the electrical connections, resulting in improved scaling and leverage of existing manufacturing capability. Note that although conducting material 176 may include or consist primarily of lateral components, vias 172 do not require lateral components. For example, if vias 172 are in a semiconductor portion of die device region 148, for example die device region 171, and the conducting material 176 consists of interlevel metal typically used in the fabrication of integrated circuits, vias 172 are disposed vertically from conducting material 176 and may be fabricated with design rules essentially independent from the fabrication of conductive material 176 with the exception that conducting material 176 be in electrical contact with metal filled via 174. Furthermore, vias 172 in this example are substantially shorter than described earlier in this embodiment, where, for example, vias 155 extend through the entire portion of die device region 148. The shorter vias 172 further facilitate the lateral dimensions of via 172 to be small, for example, substantially less than one micron, enabling a very high areal density of vias, for example, in excess of 100,000,000 per square centimeter to be fabricated resulting in improved scaling. It is noted that in device 146 an insulating sidewall film 177 and insulating surface film 180 are included when needed to isolate conducting material 176 and other surface contacts.

Figure 23L:
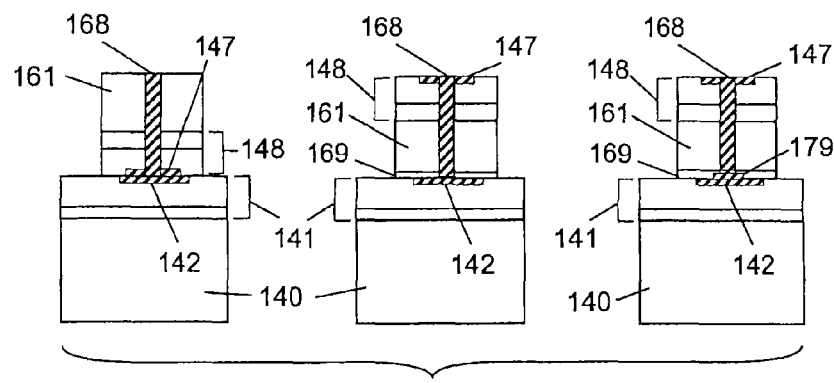
FIG. 23L illustrates bonding a structure with a filled via in top-down and top-up configurations.

In this variation, after bonding, post-bond thinning reveals a via filled with metal instead of a via not filled with metal, for example as shown in the left-hand-side of FIG. 23L. In either variation, the die substrate portion may be entirely removed as described in the sixth embodiment. In addition, in either variation, bonding to a substrate without a device region but with contact structures prepared as described in the fourth embodiment is also possible, for example, as a replacement for a chip to package interposer substrate in a Ball Grid Array IC package.

Figure 23M:
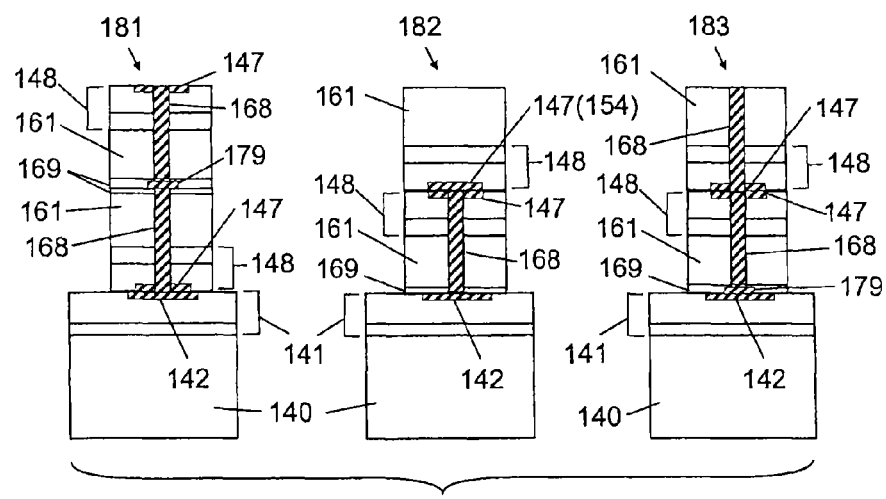
FIGS. 23M and 23N illustrate bonding a second level of die.
Figure 23N:
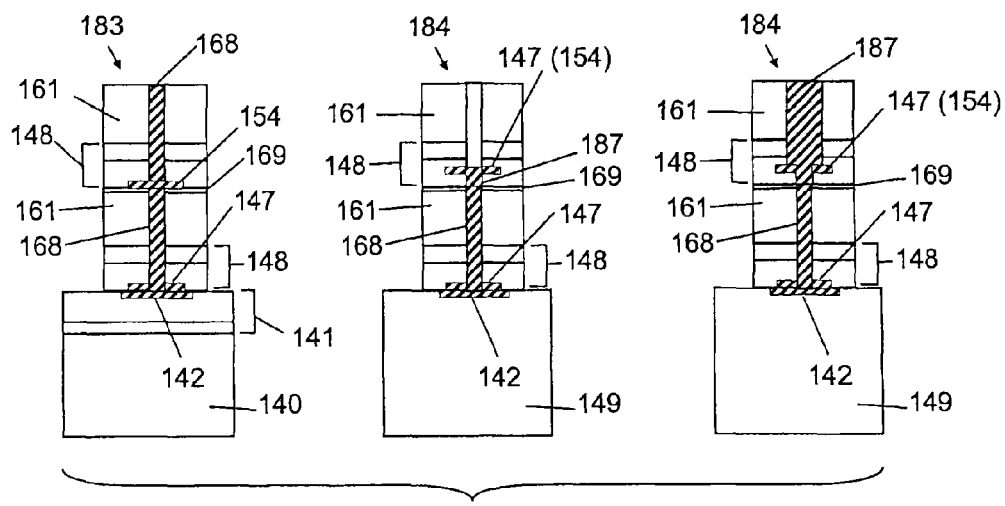

Furthermore, in either variation, the exposed surface may comprise vias filled with metal. This surface may be suitably prepared for bonding with electrical interconnections described in the fourth embodiment using a combination of filler material to planarize the surface as described in the first embodiment and via revealing and contact structure formation as described in the tenth embodiment, if required. Additional die from the same or different wafers with exposed contact structures can then be bonded to the post-bond thinned surface with revealed metal filled vias as described in the fourth embodiment. Alternatively, under bump metallization may be formed in preparation for flip chip packaging can be implemented as described in earlier embodiments. This is illustrated in FIGS. 23M and 23N where a second die is bonded to the first die. Many combinations are possible in connecting the conductive material and/or contacts of one die to another die using the configurations described above and below. FIG. 23M shows three examples, where die 181 having its conductive material 168 connected using contact structure 179 to the conductive material 168 of the lower die, die 182 having contact 147(154) connected to contact 147 and conductive material 168 of the lower die, and die 183 having contact 147 and conductive material 168 connected to contact 147 and conductive material 168 of the lower die.

In FIG. 23N, the left-hand structure has two die bonded in the die-down configuration. The middle structure has a die with contact structure 147(154) bonded to a substrate 149, such as an interposer, having a contact structure 142. Contact structure 147 (154) and conductive material 168 are connected through conductive material 187 formed after bonding. The right-hand structure has conductive material 187 connecting conductive material 168 in substrate 149 and contact structure 154.

Figure 23O:
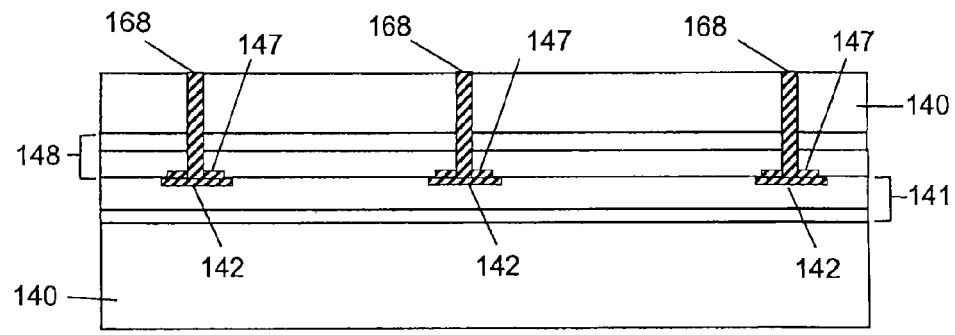
FIG. 23O illustrates wafer-to-wafer bonding.

As mentioned above, the method according to the invention may be applied to wafer to wafer bonding. FIG. 23O illustrates an upper substrate 140 with multiple contact structures 147 and conductive material 168, like the die on the left-hand side of FIG. 23L, is bonded to a lower substrate 140 making respective connections with contact structures 142. Die or another wafer may be bonded to wafer 149, using the methods and configurations described above and below. Any desired number of wafers and dies may be bonded and interconnected together.

Figure 25F:
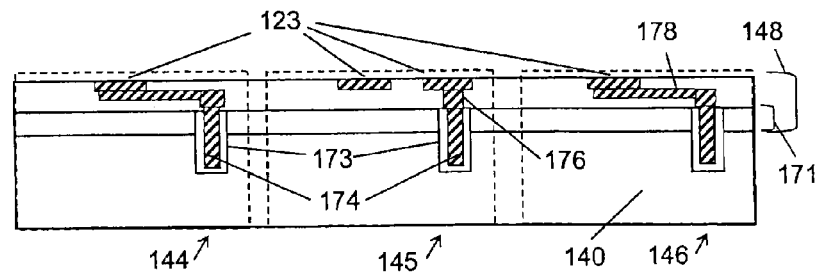
Figure 26A:
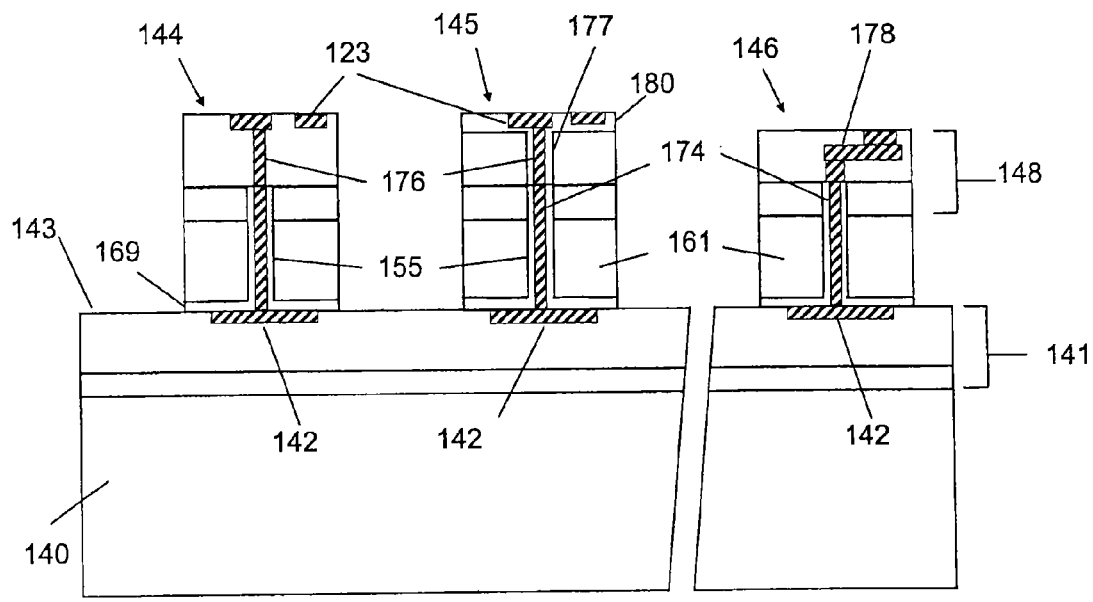
FIGS. 26A and 26B illustrate a tenth embodiment with filled vias and surface contacts.

A tenth embodiment similar to the ninth embodiment with regard to bonding and electrical interconnection and similar to the eighth embodiment with regard to orientation of the die 144-146 bond surface and optional use of a handle wafer is also possible, and is shown in FIG. 26A. This embodiment starts as described in the ninth embodiment where vias are etched, isolated if required, and filled with conductive material, for example as shown in FIG. 25C. As mentioned above, vias may be filled with a variety of conductive materials, including but not limited to polysilicon or a variety of metals, for example tungsten or copper deposited by a variety of methods including but not limited to chemical vapor deposition and electroplating, using insulating and barrier layers as required. The die (or wafer) substrate, for example 140 in FIG. 25F, is then thinned to reveal vias filled with conductive material, for example 174 in FIG. 25F, with optional use of a handle wafer as described in the eighth embodiment. The revealing of the vias can be done with a combination of backgrinding, CMP, and etching. The revealing preferably results in a planar surface but alternatively, may result in nonplanar surface due to selectivity of the CMP or etching of the substrate. For example, silicon may be removed during the CMP process at a lower rate than copper, resulting in a conductive via recessed or dished below the silicon substrate surface as described in the fourth embodiment. Alternatively, the vias may be revealed or the revealed vias may be etched with a selective etch that preferentially etches the substrate versus the conductive via resulting in a conductive via extended above the silicon substrate surface. For example, silicon may be etched preferentially versus a copper or tungsten filled via with a SF6-based reactive ion etch. If revealing of a conductive filled via results in a suitable bondable surface as described in the fourth embodiment, die may be singulated and bonded as described in the eighth embodiment.

Figure 26B:
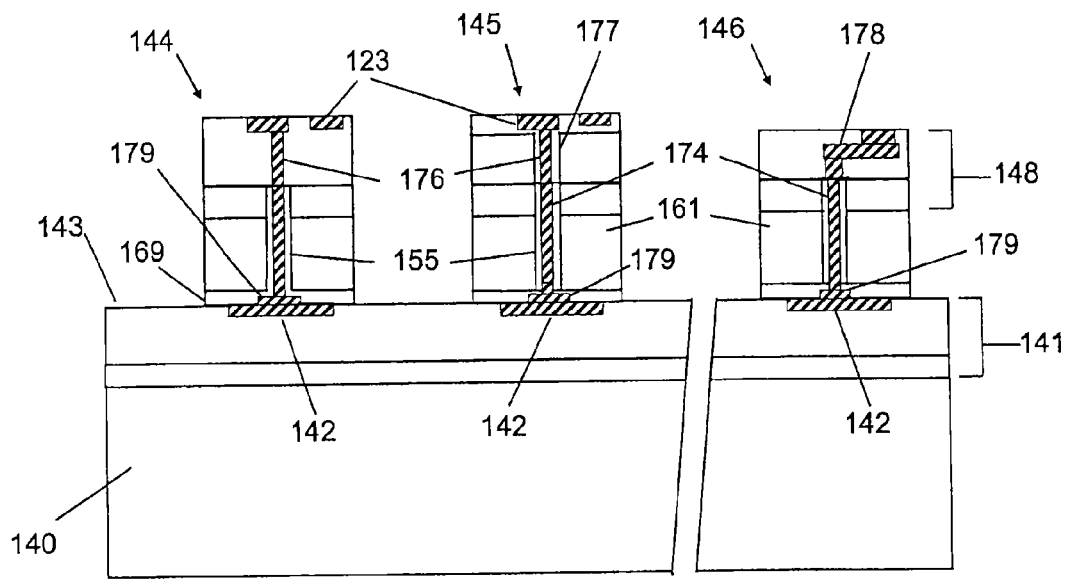

If revealing of a conductive filled via does not result in a suitable bondable surface as described in the fourth embodiment, contact structures may be formed to form a suitable bondable surface as described in the fourth embodiment. For example, if exposed conductive via fill is below the bonding surface, contact structures 179 may be formed on conductive material 174 in a manner similar to that described in the fourth embodiment. This formation may include the deposition of contact structures and a dielectric, for example silicon oxide, followed by polishing, to result in a bonding surface that is suitably planar and electrically insulating, with the exception of the contact structures. This is illustrated in FIG. 26B having contact structures 179 formed in contact with conductive material 174 and having dielectric film 169, such as PECVD silicon oxide.

Alternatively, the process may include the depositing and polishing of contact structures, with or without a dielectric, to result in a bonding surface that is suitably planar with contact structures and comprised of substrate, for example, substrate 140 in FIG. 25F.

Further alternatively, if exposed conductive fill is above the bonding surface, contact structures may also be formed on conductive material 174 in a manner similar to that described in the fourth embodiment. This formation may include the deposition and polishing of contact structures and a dielectric, for example silicon oxide, to result in a bonding surface that is suitably planar and electrically insulating, with the exception of the contact structures 179. Contact structures 179 may be formed of a comparable, smaller, or larger lateral dimension than conductive material 174.

The die are then singulated and bonded as described in the eighth embodiment. Die 144-146 are thus bonded to substrate 140 with pre-bond vias formed and filled as described in the ninth embodiment, and bond surfaces, containing contact structures, if required, are prepared, bonded and electrically interconnected as described in the fourth embodiment. After bonding of die 144-146 to substrate 140, die 144-146 do not need to be electrically interconnected to contact structures 142 and the exposed surfaces of die 114-116 are accessible for under bump metallization in preparation for flip chip packaging as described in previous embodiments.

In embodiment ten, vias can be formed either through the entire device region 148 or a semiconductor portion of device region 148 as described in embodiment nine. As in the ninth embodiment, forming the vias in a semiconductor region of device region 148 avoids a deeper and wider via by forming vias before the device region is completed, which improves device density and reduces the portion of semiconductor consumed as a result of via formation, resulting in improved scaling. Furthermore, the die substrate portion may be entirely removed as described in the sixth embodiment. Furthermore, the exposed surface may comprise contact structures. This surface may be suitably prepared for bonding with electrical interconnections described in the fourth embodiment using, filler material to planarize the surface as described in the first embodiment, if required. Additional die from the same or different wafers with exposed metal filled vias can then be bonded to the post-bond surface with suitable contact structures as described in the fourth embodiment. Alternatively, under bump metallization may be formed in preparation for flip chip packaging can be implemented as described in earlier embodiments. Also, embodiment ten may also be carried out to stack multiple dies, similar to FIG. 23M or in wafer-to-wafer format, similar to FIG. 23N.

The desirable features of the invention convey to vertical stacking and interconnection configurations. For example, die may be bonded IC-side down or IC-side up. In addition, alternative to the die-to-wafer format, a wafer-to-wafer format is also possible with the upper wafer, either IC-side up or down, bonded to the lower wafer IC-side up. Furthermore, these die-to-wafer and wafer-to-wafer formats can also be used with ICs fabricated using substrates that do not require the substrate for IC functionality. For example, ICs fabricated using silicon-on-insulator (SOI) substrates or non-silicon substrates, for example III/V materials, SiC, and sapphire, may not require the existence of the substrate for IC functionality. In these circumstances, the entire portion of the substrate that is not used for transistor fabrication may be removed, to minimize the via etching required to form vertical electrical interconnection.

Although substrates are shown comprised of a device region, a substrate without a device region but with contact structures is also possible, for example, as a replacement for a chip to package interposer substrate in a Ball Grid Array IC package. Also, the die are shown with devices but other dies or elements not having a device or devices but having contact structures may be bonded to a substrate using the methods according to the invention.

Numerous modifications and variations of the present invention are possible in light of the above teachings. It is therefore to be understood that within the scope of the appended claims, the invention may be practiced otherwise than as specifically described herein.

What is claimed:

1. A method of bonding a first element with a second element, the method comprising:
   forming a first contact structure in the first element;
   forming a second contact structure in the second element;
   contacting a first non-metallic region of the first element with a second non-metallic region of the second element, wherein a gap is disposed between the first contact structure and the second contact structure;
   directly bonding the first non-metallic region of the first element to the second non-metallic region of the second element; and
   heating the first element and the second element to form a direct bond between the first contact structure and the second contact structure without melting or reflowing the first contact structure or the second contact structure.

2. The method of claim 1, wherein forming the first contact structure comprises positioning an upper surface of the first contact structure below an upper surface of the first non-metallic region.

3. The method of claim 2, wherein forming the first contact structure comprises positioning the upper surface of the first contact structure below the upper surface of the first non-metallic region by less than 20 nm.

4. The method of claim 3, wherein forming the first contact structure comprises positioning the upper surface of the first contact structure below the upper surface of the first non-metallic region by less than 10 nm.

5. The method of claim 2, wherein forming the second contact structure comprises positioning an upper surface of the second contact structure below an upper surface of the second non-metallic region.

6. The method of claim 5, wherein forming the second contact structure comprises positioning the upper surface of the second contact structure below the upper surface of the second non-metallic region by less than 20 nm.

7. The method of claim 2, wherein forming the second contact structure comprises positioning an upper surface of the second contact structure to extend above an upper surface of the second non-metallic region.

8. The method of claim 1, further comprising forming a via in the first element exposed to at least the first contact structure.

9. The method of claim 8, further comprising forming a conductive material in the via and connected to at least the first contact structure.

10. The method of claim 1, wherein heating the first and second elements comprises heating to a temperature less than 400° C. to increase the pressure between the first and second contact structures.

11. The method of claim 1, wherein forming the first and second contact structures comprises forming from a metal selected from copper, tungsten, nickel, gold or alloys thereof.

12. The method of claim 1, further comprising etching a surface of at least one of the first and second elements adjacent to respective first and second contact structures prior to bonding.

13. The method of claim 1, wherein:
   forming the first contact structure comprises forming from a first metal; and
   forming the second contact structure comprises forming from a second metal different from the first metal.

14. The method of claim 1, wherein each of the first and second non-metallic regions comprises one of an oxide and a nitride material.

15. A method of bonding a first element with a second element, the method comprising:
   forming a first contact structure in the first element;
   forming a second contact structure in the second element;
   contacting a first non-metallic region of the first element with a second non-metallic region of the second element, wherein a gap is disposed between the first contact structure and the second contact structure;
   directly bonding the first non-metallic region of the first element to the second non-metallic region of the second element; and
   expanding the first and second contact structures to cause the first contact structure to contact and directly bond with the second contact structure without melting or reflowing the first contact structure or the second contact structure.

16. The method of claim 15, wherein forming the first contact structure comprises providing an upper surface of the first contact structure below an upper surface of the first non-metallic region.

17. The method of claim 16, wherein forming the first contact structure comprises providing the upper surface of the first contact structure below the upper surface of the first non-metallic region by less than 20 nm.

18. The method of claim 17, wherein forming the first contact structure comprises providing the upper surface of the first contact structure below the upper surface of the first non-metallic region by less than 10 nm.

19. The method of claim 15, wherein expanding the first and second contact structures comprises heating the first and second elements.

20. The method of claim 15, wherein, after expanding the first and second contact structures, a perimeter of the first contact structure is within a perimeter of the second contact structure.

21. The method of claim 15, wherein forming the first and second contact structures comprises forming from a metal selected from copper, tungsten, nickel, gold or alloys thereof.

22. The method of claim 15, wherein expanding the first and second contact structures comprises increasing an internal pressure between the first and second contact structures.

* * * * *